(12) United States Patent
Salerno et al.

(10) Patent No.: US 6,511,187 B1
(45) Date of Patent: Jan. 28, 2003

(54) METHOD OF FABRICATING A MATRIX DISPLAY SYSTEM

(75) Inventors: Jack Salerno, Waban, MA (US); Matthew Zavracky, Plympton, MA (US); Stephen Offsey, Brookline, MA (US); David Chastain, Acton, MA (US); Michel Arney, Needham, MA (US); Benjamin Beck, Boston, MA (US); Gregory Hunter, Westwood, MA (US); Kevin O'Connor, South Easton, MA (US); Alan Richard, Wrentham, MA (US)

(73) Assignee: Kopin Corporation, Taunton, MA (US)

( * ) Notice: Subject to any disclaimer, the term of this patent is extended or adjusted under 35 U.S.C. 154(b) by 44 days.

(21) Appl. No.: 09/067,308

(22) Filed: Apr. 27, 1998

Related U.S. Application Data

(63) Continuation of application No. 08/480,966, filed on Jun. 7, 1995, now Pat. No. 5,743,614, which is a continuation-in-part of application No. 08/332,883, filed on Nov. 1, 1994, now Pat. No. 5,713,652, which is a continuation of application No. 08/106,071, filed on Aug. 13, 1993, now Pat. No. 5,376,979, which is a continuation-in-part of application No. 08/016,138, filed on Feb. 10, 1993, now Pat. No. 5,396,304, and a continuation-in-part of application No. 07/944,207, filed on Sep. 11, 1992, now Pat. No. 5,444,557, which is a continuation-in-part of application No. 07/872,297, filed on Apr. 22, 1992, now Pat. No. 5,317,436, which is a continuation-in-part of application No. 07/839,241, filed on Feb. 20, 1992, now abandoned.

(51) Int. Cl.[7] .............................................. G03B 21/14
(52) U.S. Cl. ........................ 353/121; 353/122; 353/119
(58) Field of Search ................................ 353/120, 122, 353/31, 119, 121

(56) References Cited

U.S. PATENT DOCUMENTS

| 4,271,246 A | 6/1981 | Sato et al. .................. 430/7 |
|---|---|---|
| 4,339,514 A | 7/1982 | Biber ........................... 430/7 |
| 4,342,818 A | 8/1982 | Yokota et al. ................ 430/7 |

(List continued on next page.)

FOREIGN PATENT DOCUMENTS

| EP | 0 474 474 A3 | 3/1992 |
|---|---|---|
| EP | 0 481 734 A2 | 4/1992 |
| EP | 0 486 318 A1 | 5/1992 |
| JP | 62 254122 | 11/1987 |
| JP | 03242622 | 10/1991 |
| WO | 92/11560 | 7/1992 |
| WO | 94/11773 | 5/1994 |

OTHER PUBLICATIONS

Vanfleteren, J., et al., "Design of a Prototype Active Matrix CdSe TFT Addressed El Display" *Eurodisplay*, Amsterdam pp. 216–219, 1990.

Schmidt, Dennis N., "Silicon–on–Insulator Technology Devices" *The Electrochemical Society* 90(6) Pennington, NJ pp. 21–47.

Singh, Vijay P., et al. "Effect of Bulk Space Charge on the Current and Luminescence Characteristics of ZnS:Mn ACT-FEL Display Devices" *IEEE* pp. 130–132, 1991.

(List continued on next page.)

*Primary Examiner*—William Dowling
(74) *Attorney, Agent, or Firm*—Hamilton, Brook, Smith & Reynolds, P.C.

(57) ABSTRACT

A method of fabricating a display system includes bonding a silicon substrate to a second substrate with an insulating layer. The silicon substrate is thinned to form a thin film silicon-on-insulator (SOI) structure. A matrix display circuit is formed with the SOI structure. A light shield pattern is formed over regions of the matrix display circuit. A light source, the matrix display circuit and a magnifying lens are positioned within a display housing such that light from the light source is directed onto the display and an image on the display is magnified by the lens for viewing by a user.

18 Claims, 39 Drawing Sheets

U.S. PATENT DOCUMENTS

| | | | |
|---|---|---|---|
| 4,382,658 A | 5/1983 | Shields et al. | 350/334 |
| 4,400,454 A | 8/1983 | Sato et al. | 430/7 |
| 4,416,514 A | 11/1983 | Plummer | 350/335 |
| 4,420,218 A | 12/1983 | Rubanov et al. | 350/3.85 |
| 4,452,826 A | 6/1984 | Shields et al. | 427/38 |
| 4,609,846 A | 9/1986 | Kusano et al. | 313/384 |
| 4,629,676 A | 12/1986 | Hayakawa et al. | 430/203 |
| 4,701,879 A | 10/1987 | Scarr | 365/49 |
| 4,704,559 A | 11/1987 | Suginoya et al. | 315/169.1 |
| 4,740,693 A | 4/1988 | Nakayama et al. | 250/305 |
| 4,781,437 A | 11/1988 | Shields et al. | 350/332 |
| 4,786,148 A | 11/1988 | Sekimura et al. | 350/339 |
| 4,786,964 A | 11/1988 | Plummer et al. | 358/44 |
| 4,808,501 A | 2/1989 | Chiulli | 430/7 |
| 4,827,118 A | 5/1989 | Shibata et al. | 250/211 |
| 4,839,707 A | 6/1989 | Shields | 357/23.7 |
| 4,870,396 A | 9/1989 | Shields | 340/719 |
| 4,885,628 A | 12/1989 | Nagai et al. | 357/68 |
| 4,917,465 A | 4/1990 | Conner et al. | 350/335 |
| 4,963,001 A * | 10/1990 | Miyajima | 353/119 |
| 4,988,168 A | 1/1991 | Dickerson et al. | 350/339 |
| 5,058,997 A | 10/1991 | Dickerson et al. | 359/59 |
| 5,077,155 A | 12/1991 | Simons | 430/7 |
| 5,082,763 A | 1/1992 | Kojima et al. | 430/353 |
| 5,098,818 A | 3/1992 | Ito et al. | 430/434 |
| 5,100,759 A | 3/1992 | Sato et al. | 430/203 |
| 5,113,285 A | 5/1992 | Franklin et al. | 359/465 |
| 5,116,722 A | 5/1992 | Callant et al. | 430/363 |
| 5,121,030 A | 6/1992 | Schott | 313/474 |
| 5,317,436 A * | 5/1994 | Spitzer et al. | 359/83 |
| 5,581,385 A * | 12/1996 | Spitzer et al. | 349/58 |
| 5,637,187 A * | 6/1997 | Takasu et al. | 438/30 |
| 5,661,371 A * | 8/1997 | Salerno et al. | 315/169.3 |
| 5,662,402 A * | 9/1997 | Kim | 353/119 |
| 5,664,859 A * | 9/1997 | Salerno et al. | 353/119 |
| 5,705,424 A * | 1/1998 | Zavracky et al. | 437/86 |
| 5,713,652 A * | 2/1998 | Zavracky et al. | 353/119 |

OTHER PUBLICATIONS

Vanfleteren J., et al., "Evaluation of a 64×64 CdSe TFT Addressed Actfel Display Demonstrator" *IEEE* pp. 134–136 1991.

Tanaka, S., et al., "Luminance Improvement of Blue– and White–Emitting SrS TFEL Devices by Annealing in Ar–S Atmosphere" *IEEE* pp. 137–142 1991.

Hurd, James, "Color Electroluminescent Display Development" *Flat Information Displays* pp. 1–17 1990.

Kaminishi, K., "High Luminance White El Devices For Color Flat Panels" *Flat Information Displays* pp. 1–14, 1990.

\* cited by examiner

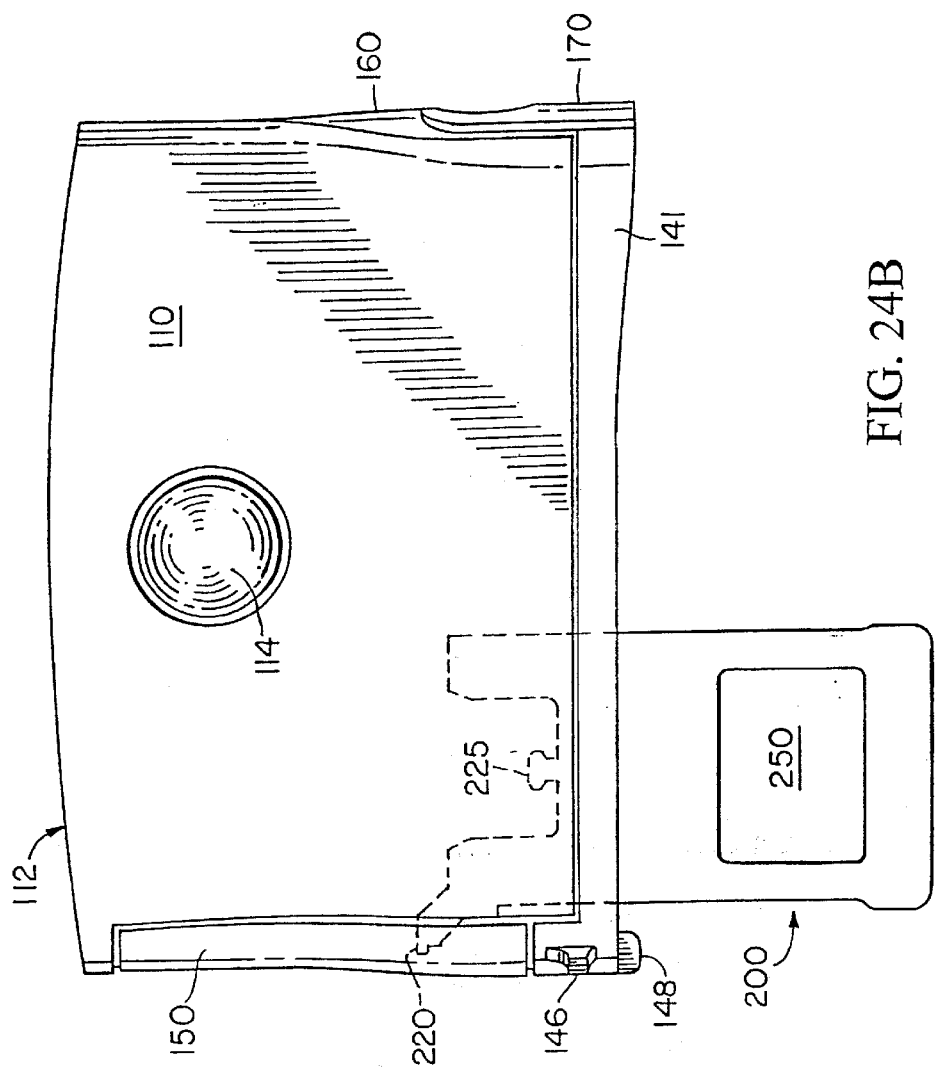
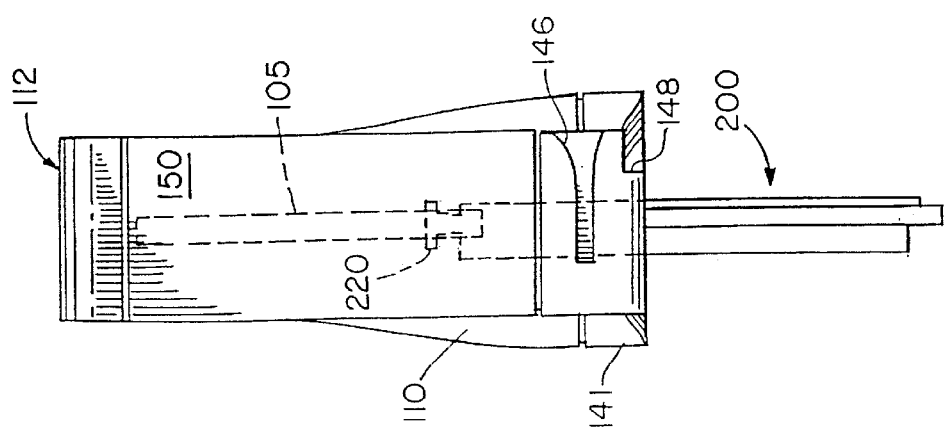
FIG. 24B
FIG. 24A

METHOD OF FABRICATING A MATRIX DISPLAY SYSTEM

This is a Continuation of U.S. patent application, Ser. No. 08/480,966, filed on Jun. 7, 1995, (now U.S. Pat. No. 5,743,614) which is a Continuation-In-Part of both U.S. patent application, Ser. No. 08/332,883, filed on Nov. 1, 1994, (now U.S. Pat. No. 5,713,652) which is a Continuation of U.S. patent application, Ser. No. 08/106,071 filed on Aug. 13, 1993 (now U.S. Pat. No. 5,376,979), which is a Continuation-In-Part of U.S. patent application 08/016,138 filed on Feb. 10, 1993 (now U.S. Pat. No. 5,396,304), and U.S. patent application, Ser. No. 07/944,207 filed on Sep. 11, 1992, (now U.S. Pat. No. 5,444,557) which is a Continuation-In-Part of U.S. patent application, Ser. No. 07/872,297 filed on Apr. 22, 1992 (now U.S. Pat. No. 5,317,436), which is a Continuation-In-Part of U.S. patent application, Ser. No. 07/839,241 filed on Feb. 20, 1992, (abandoned), all of which are incorporated herein by reference in their entirety.

BACKGROUND OF THE INVENTION

Flat-panel displays are being developed which utilize liquid crystals or electroluminescent materials to produce high quality images. These displays are expected to supplant cathode ray tube (CRT) technology and provide a more highly defined television picture. The most promising route to large scale high quality liquid crystal displays (LCDs), for example, is the active-matrix approach in which thin-film transistors (TFTs) are co-located with LCD pixels. The primary advantage of the active matrix approach using TFTs is the elimination of cross-talk between pixels, and the excellent grey scale that can be attained with TFT-compatible LCDs.

Flat panel displays employing LCDs generally include five different layers: a white light source, a first polarizing filter that is mounted on one side of a circuit panel on which the TFTs are arrayed to form pixels, a filter plate containing at least three primary colors arranged into pixels, and finally a second polarizing filter. A volume between the circuit panel and the filter plate is filled with a liquid crystal material. This material will rotate the polarization of light when an electric field is applied across it between the circuit panel and a ground affixed to the filter plate. Thus, when a particular pixel of the display is turned on, the liquid crystal material rotates polarized light being transmitted through the material so that it will pass through the second polarizing filter.

Preferred embodiments of the present invention relates to projection display devices (i.e. monitors and image projectors) including methods of fabricating such devices using thin films of single crystal silicon in which a light valve matrix (or matrices) is formed for controlling images produced by these devices. In accordance with the present invention, projection display devices employing high density single crystal silicon light valve matrices provide high resolution images compatible with 35 mm optics.

In one preferred embodiment, an optically transmissive substrate is positioned to receive light from a back-light source and a light valve matrix is secured to the substrate. In accordance with the present invention, the light valve matrix includes an array of transistors and an array of electrodes which are formed in the thin film of single crystal silicon. The light valve matrix also includes an adjacent light transmitting material, through which light from the back-light source is selectively transmitted. Preferred embodiments are directed to light valves employing a transmissive light transmitting material such as liquid crystal or a ferroelectric material, although other transmissive materials may be used. Each light valve includes a transistor, an electrode and a portion of the adjacent light transmitting material. Each transistor, by application of an electric field or signal, serves to control the optical transmission of light through the adjacent light transmitting material for a single light valve.

A driver circuit is electrically connected to the light valve matrix to selectively actuate the light valves. The drive circuitry may be formed in the same thin-film material in which the transistors and electrodes have been formed. The drive circuitry is capable of being fully interconnected to the matrix using thin-film metallization techniques without the need for wires and wirebonding. An optical system is also provided for projecting light transmitted through the actuated light valves onto a large viewing surface.

The present devices and related methods for fabricating projectors satisfy the requirements of large screen television or monitor displays for producing highly defined color images. To that end, a projection display device can have multiple light valves each adapted to selectively transmit light of a single primary color. Further, a dichroic prism may be provided for combining the single color light transmitted by each light valve producing a multi-color light image which is projected onto a large viewing surface.

Other preferred embodiments of the present invention relate to an active matrix display panel adapted for use in a conventional 35 mm slide projector for providing monochrome or multi-color images. The display panel is fabricated to have equivalent physical dimensions as a standard 35 mm photographic slide having an image which can be projected by a slide projector. In accordance with the present invention, the active matrix display panel, being packaged to be size-equivalent with a standard 35 mm slide, is insertible into a slide projector with modification thereof for generating the projected images. An electronics unit is connected to the display panel and controls image generation by the active matrix. In preferred embodiments, the display panel is capable of generating monochrome or multi-color images.

In one preferred embodiment of the invention, an active matrix display device is adapted for use with a slide projector having a projector body, a light source, an optical system and a chamber in which a 35 mm slide can be placed for projection of its image onto an external viewing surface. The display device includes a housing and an active matrix display panel movably mounted to the housing. As such, the display panel has a storage position and an operating position. The housing is positioned on the slide projector body such that the display panel, being moved into the operating position, can be securely disposed in the projector chamber for selectively transmitting light from the light source to provide images for projection by the slide projector.

The housing preferably contains a shielded electronics assembly which is electrically connected to the display panel for controlling image generation. The electronics assembly receives image data from an image generation device which may be a computer or any video device. Image data provided by the device is processed by the electronics and sent to the active matrix display panel. Responsive to the received data, the individual active matrix light valves are activated such that the illuminating light from the light source is selectively transmitted through the active matrix to form monochrome or multi-color images.

In another preferred embodiment, the active matrix display device includes an active matrix display panel and a remote electronics housing. The display panel is dimensioned to be securely positioned in the chamber of the slide projector and is electrically connected to electronics in the remote housing by a cable.

In yet another preferred embodiment, the active matrix display device includes an active matrix display panel which is not physically connected to the electronics housing. Instead, the active matrix display panel and the electronics in the housing communicate with each other via antenna elements such as RF antennas or infrared transmitter/detector elements.

As with aforementioned embodiments, an active matrix display panel has an array of pixels or light valves which are individually actuated by a drive circuit. The drive circuit components can be positioned adjacent to the array and electrically connected to the light valves. As such, the individual light valves are actuated by the drive circuit so that illuminating light is selectively transmitted through the active matrix to form an image.

In preferred embodiments, the active matrix circuitry is formed in or on a layer of a semiconductor material such as silicon. It is noted that any number of fabrication techniques can be employed to provide preferred thin-films of polysilicon or single crystal silicon. In embodiments in which a thin-film of single crystal silicon is used, extremely high light valve densities can be achieved such that high resolution images are obtained. Other embodiments employ the use of a solid state material or any material whose optical transmission properties can be altered by the application of an electric field to supply the light valves of the present invention.

A preferred embodiment of the fabrication process for a liquid crystal transmission display comprises providing a thin film of an single crystal semiconductor material such as silicon. In one embodiment, the processing steps for forming a thin film of single crystal silicon include forming a layer of polysilicon over a supporting substrate and scanning the layer with a heat source to melt and recrystallize the polysilicon to form a thin film of essentially single crystal silicon. In another embodiment, a single crystal silicon film or layer can be formed by a SIMOX (Separation by IMplantation of OXygen) process. In another embodiment, the wafer of single crystal silicon can be secured on a quartz substrate utilizing Van der Waals bonding and the wafer can be thinned using known techniques to provide the thin film semiconductor. In yet another embodiment, a bonded wafer approach can be used to form the layer of thin film single crystal silicon on a single crystal silicon wafer.

The process also comprises the step of forming an array of transistors or switching circuits, an array of pixel electrodes and drive circuitry in or on a front side of the thin film single crystal silicon such that each pixel electrode is electrically connected to one of the switching circuits to provide an active matrix array of pixel elements. Each pixel element is actuatable by one of the switching circuits, and the drive circuitry is used to control pixel actuation.

In accordance with the present invention, the process includes the step of forming an array of color filter elements over the front side of the thin film of essentially single crystal silicon material. Each color filter element is correlated with one (or more) of the pixel elements. The color filter elements are formed by applying a carrier layer such as an emulsion or a photoresist, including the appropriate dye, on or over the pixel elements, and then processing the carrier layer to provide an array of filter elements. Alternatively, the color filter elements can be formed by direct deposition of a conventional filter material such as single layer or multiple layers of thin film optical coatings. In either case, the layer is then processed and patterned to produce a resulting color filter element adjacent to each of a plurality of pixel elements for one color. This process can be repeated to provide different color filter elements for the remaining pixel elements to produce a multicolor display. A matrix array of opaque (or black) elements can also be formed on or over portions of the thin film of single crystal silicon such that the opaque elements are interspersed with the color filter elements. Each opaque element can be used to define the perimeter of each pixel element and serves to absorb incident light that would otherwise imping upon the switching circuit associated with the pixel element. Preferably, a layer of aluminum or the like is also formed over one or both side of the thin film and patterned such that each aluminun element serves as a light shield to reflect light that may otherwise be directed at the switching circuits or interconnects to the drive circuitry.

The display fabrication process also includes the step of transferring the thin silicon film, upon which the active matrix has been formed, and adjacent color filter array from the supporting substrate onto an optically transmissive substrate. This will expose a planar surface which in one embodiment can correspond to an insulating layer adjacent to the back side of the film or alternatively it will correspond to the back side of the film if the insulating layer is removed. The transfer step includes forming an optically transmissive isolation (barrier) layer, which can comprise polyimide, nitride, oxide or sputtered glass, over the color filter array. The thin film is then attached to the optically transmissive substrate with an adhesive such that the isolation layer serves to isolate the filter elements from each other and the adhesive. A light transmitting liquid crystal material is then formed adjacent to the planar surface associated with the silicon thin film and a counterelectrode is formed adjacent to the liquid crystal material. The counterelectrode is associated with the array of pixel elements such that an electric field generated by each pixel element alters a light transmitting property of the light transmitting material.

Other preferred embodiments of the present invention are directed to emissive color displays employing a color filter for displaying color images and methods of fabricating such displays. In one preferred embodiment, an electroluminescent (EL) color display includes an active matrix circuit panel formed over a supporting substrate. As described above, the circuit panel comprises a thin film (about 0.1–2.0 microns) of single crystal or essentially single crystal semiconductor material. An array of transistors or switching circuits, an array of pixel electrodes and a driver circuit are formed in or on the thin film. An electroluminescent material is positioned adjacent to the circuit panel circuitry and patterned to form an array of EL elements.

For the EL display, each transistor, the associated pixel electrode and the associated EL material element are referred to as a pixel element or light emitter. For each pixel element, the pixel electrode is electrically connected to one of the transistors which is capable of generating an electric field or signal across the adjacent EL material causing the emission of light by the EL material. The driver circuit can be formed in or on the same single crystal material as the active matrix circuitry. The driver circuit is capable of being fully interconnected to the transistors for actuating the pixel elements using thin film metallization techniques without the need for wires and wirebonding.

An optically transmissive electrode is positioned over the EL structure which can comprise a white phosphor. As such, the electric field generated at each pixel element lies between the optically transmissive electrode and the pixel electrode. An array of color filter elements is formed adjacent to a surface of the electrode. Each color filter element is correlated with one pixel element. The color filter elements are formed by processing, in accordance with the techniques described herein, an emulsion, a photoresist or other suitable carrier in which a dye is positioned or other conventional filter materials. The presence of the field causes the EL material to generate light which passes through the color filter element to produce a colored light. As such, each pixel element of the EL display can be an independently controlled color light emitter whose light emitting properties are altered by the electric field or signal.

The present invention comprises methods for fabricating EL displays capable of producing high definition color images. A preferred embodiment of the EL display fabrication process comprises providing a thin film of an essentially single crystal semiconductor material such as silicon. The processing steps for forming a thin film of essentially single crystal silicon include forming a layer of polysilicon over a supporting substrate and scanning the layer with a heat source to melt and recrystallize the polysilicon to form a thin film of essentially single crystal silicon. Alternatively, the single crystal silicon film or layer can be formed by a SIMOX process, Van der Waals bonding of a wafer to quartz or a bonded wafer approach as described in greater detail below.

The process also comprises forming an array of transistors, an array of pixel electrodes and drive circuitry in or on the thin film of single crystal silicon such that each pixel electrode is electrically connected to one of the transistors to provide an active matrix array of pixel elements or light emitters. Each pixel element is actuatable by one of the transistors, and the drive circuitry is used to control pixel actuation. The process also includes forming a layer of EL material (such as a white phosphor) adjacent to the circuit panel circuitry and patterning the material to form an array of EL elements. An optically transmissive electrode is then formed adjacent to the EL structure. An array of color filter elements are then formed over the electrode. Each color filter element is correlated with one (or more) of the pixel elements.

The color filter elements are formed by applying a carrier layer such as an emulsion or a photoresist to the thin film. The carrier layer is then processed and patterned to produce a resulting color filter element adjacent to each of a plurality of pixel elements. This process can be repeated to provide different color filter elements for the remaining pixel elements to produce an emissive active matrix color display. A pattern of opaque (or black) elements can also be formed such that the opaque elements are interspersed with the color filter elements. The EL display structure is completed by forming an optically transmissive layer over the color filter array.

The EL display fabrication process can also include the step of transferring the structure from the supporting substrate onto an optically transmissive substrate such as glass, plastic or a head-mounted visor. The transfer steps can include attaching the display structure to a temporary substrate, removing the supporting substrate, attaching the optically transmissive substrate and removing the temporary substrate.

A critical advantage provided by the above referenced methods of color filter fabrication for display panels is that they provide for precise alignment of the pixel elements with the filter elements. Whereas conventional color filter systems involve alignment of filter elements on the opposite side of the liquid crystal material, for example with the pixel elements in the active matrix when the laminated structure of the display is finally assembled, the present system provides for alignment by fabricating the filter elements directly on the circuit panel. This provides particular advantages when utilizing transfer methods as the processing involved in the transfer can result in some shrinkage of portions or all of the display thereby making precise alignment with conventional filter arrays more difficult.

BRIEF DESCRIPTION OF THE DRAWINGS

The above, and other features of the invention including various novel details of construction and combination of parts, will now be more particularly described with reference to the accompanying drawings and that pointed out in the claims. It will be understood that the particular panel display and the methods used in fabricating those panels which embody the invention are shown by way of illustration only and not as a limitation of the invention. The principal features of this invention can be employed in various embodiments without departing from the scope of the invention.

FIGS. 24A–24B illustrate a preferred embodiment of the light valve housing with the light valve assembly extended.

DETAILED DESCRIPTION OF PREFERRED EMBODIMENTS

Figure 1:
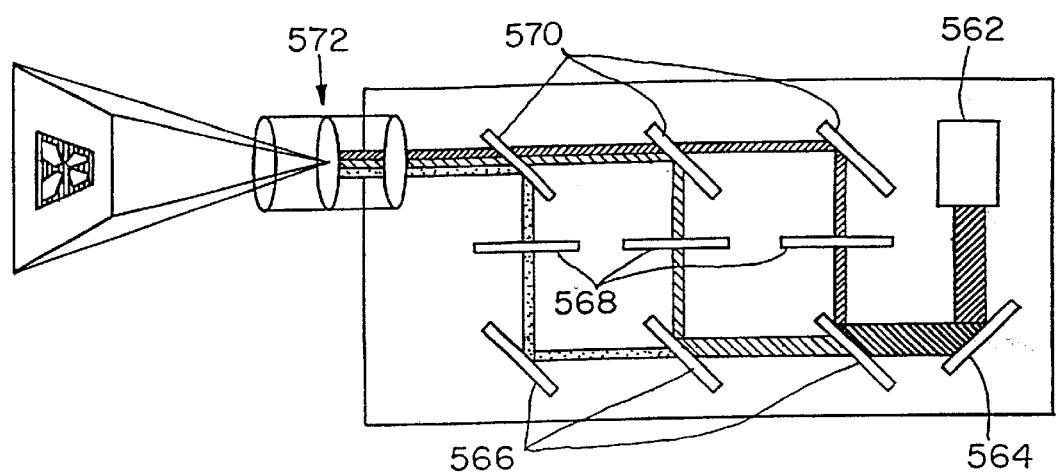
FIG. 1 is an illustration of an image projector of the present invention.

An image projector 560 employing the principles of the present invention is shown in FIG. 1. The projector employs a zoom or variable focus lens 572 for projecting images to a viewing surface (not shown). By replacing the zoom lens 572 with a simple lens, the projection system within the projector can be employed in a monitor system. White light from a lamp 562 is reflected off a mirror 564 and directed to three dichroic mirrors. The separated colors of light are directed by the mirrors to illuminate the back side of three liquid crystal light valve matrices 568. Each matrix, controlled by a driver circuit (not shown), selectively transmits light to form an image in the respective primary color at the front side of the matrix. The three primary color images are directed via dichroic mirrors 570 to lens 572. The lens combines the images into a single multi-color light beam.

The projector 560 employs a plurality of single crystal silicon light valve matrices and an optical geometry for producing high resolution color (or monochrome) images. The resulting images are directed through the zoom or variable focal length projection lens 572 to form an image beam capable of being front or back projected onto a viewing surface or screen. The projector provides high resolution images while being compatible with 35 mm optics.

Figure 2:
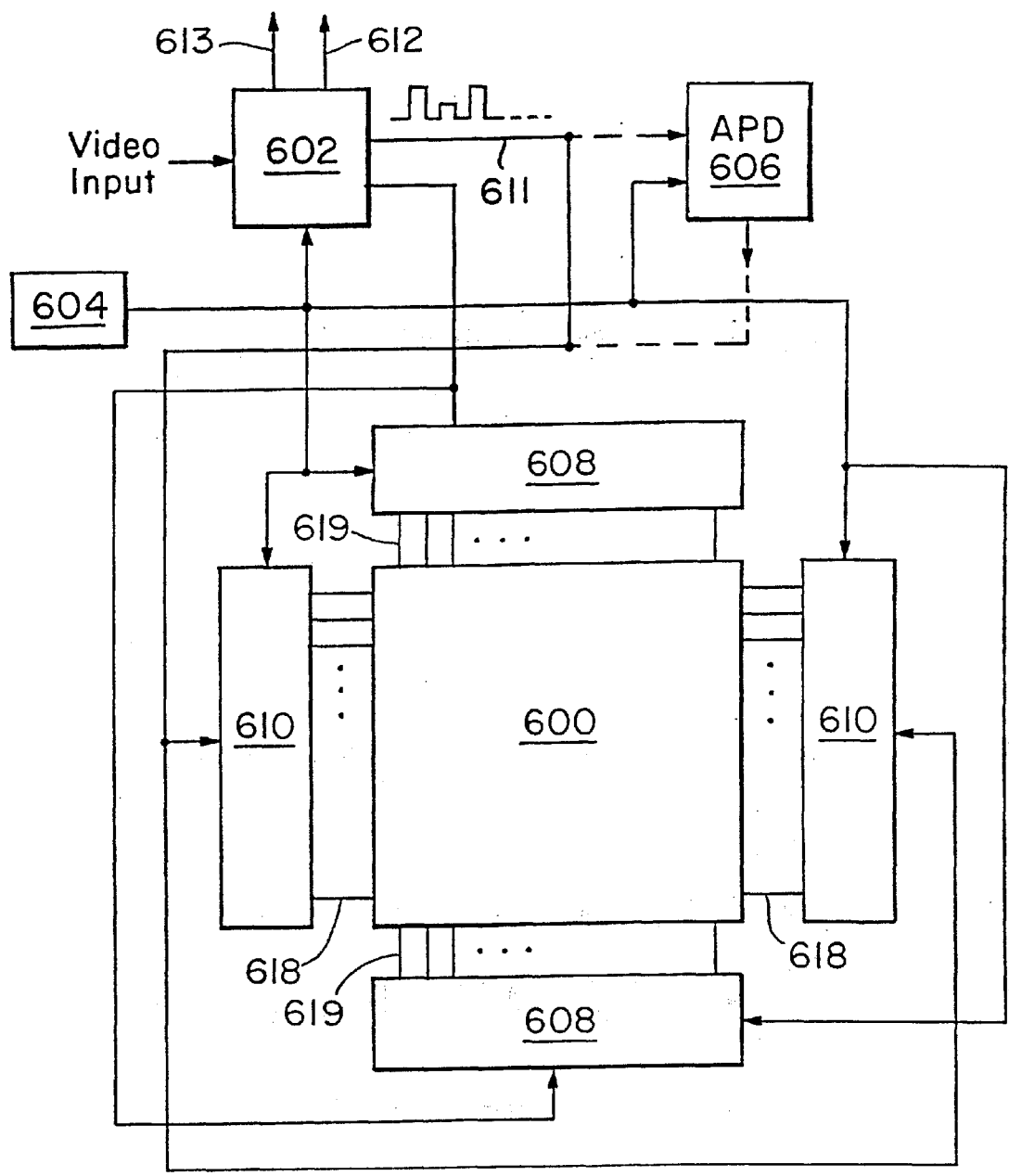
FIG. 2 is a circuit diagram illustrating the driver system for a projection device of the present invention

Preferred embodiments of the projection display devices include a driver circuit for driving one or more light valve matrices. Referring to FIG. 2, an active matrix 600 comprises a plurality of light valves which are individually actuated by collocated driver circuitry. The collocated driver circuitry is controlled by supporting driver circuitry which includes a video conditioning circuit 602, a system clock 604, an optional amplitude to pulse duration (APD) converter 606, column drivers 608, and a row drivers 610.

The video conditioning circuit 602 receives a video input signal which may be an RGB signal, an NTSC signal, an S-video signal or other video format signal, or any digital or analog video signal. The conditioning circuit processes the incoming signal producing separate video output signals (on lines, 611, 612 and 613) for each primary color and a synchronization signal (on line 615) for the column and row drivers 608 and 610. The video output signal on line 611 is a serial data stream wherein the amplitude of each signal of the data stream determines the intensity of light transmitted through each light valve.

If the APD convertor is not employed, the serial data stream on line 615 is received by the row drivers 610. The row drivers 610 send each of the signal data streams to the light valves through buses 618. The column drivers receive the sync signal on line 615 and, responsive to the sync signal, an activation signal is sent through buses 619 to turn on individual transistors allowing the associated signal of the data stream to charge the capacitor in each pixel. The capacitor sustains a charge, which is proportioned to the amplitude of the associated signal, on the light valve until the next scan of the array.

Alternately, the ADP converter may be employed such that each signal of the video output data stream is converted to a pulse having a pulse width which is proportional to the signal's amplitude. In any case, the driver circuit operates in the same manner as previously described.

Projection display devices of the present invention can employ light valve matrices having pixel densities which satisfy any of a wide range of the following existing computer display format requirements:

| Application | Display Format (Column x Row) |
| --- | --- |
| 1) Common Personal Computer | 1024x768 |
|  | 1280x1024 |
| 2) Workstation (Advanced Personal Computer) | 1280x1024 |
|  | 1580x1280 |
|  | 2048x2048 |
| 3) Other Workstations (Non-Standard) | 1152x900 |
|  | 1280x1024 |
|  | 1600x1280 |

Thus, a display monitor employing one or more single crystal silicon light valve matrices having any of the above-described pixel densities can be provided in accordance with the present invention.

One feature of the present invention is that projection devices employing single crystal light valve matrices provide high resolution images. High resolution images are possible because high density light valve arrays may be formed in single crystal silicon films. Referring to Table 1, the light valve diagonal is shown for various array sizes and pixel densities, where the diagonal dimensions followed by an asterisk indicate an array that is compatible with 35 mm optics.

TABLE 1

DIAGONAL ARRAY DIMENSION - INCHES/(MM)

| ARRAY SIZE | Fabricated dots/inch (DPI) on light valve matrix | | | |
|---|---|---|---|---|
| | 800 | 1000 | 1200 | 2000 |
| 1024x768 | 1.600* | 1.280* | 1.137* | 0.640* |
| | (40.64) | (32.51) | (28.88) | (16.26) |
| 1280x1024 | 2.049 | 1.639* | 1.366* | 0.820* |
| | (52.04) | (41.63) | (34.70) | (20.82) |
| 1580x1280 | 2.542 | 2.033 | 1.695 | 1.017* |
| | (64.56) | (51.65) | (43.05) | (25.82) |
| 2048x2048 | 3.620 | 2.896 | 2.414 | 1.448* |
| | (91.96) | (73.57) | (61.32) | (36.78) |

The use of 35 mm optics is a key feature in minimizing the size, weight and cost of the described optics requiring the light valve image designed dimension to be no greater than 42 mm (1.654 inches). Therefore, it is desirable to use a light valve imaging technology that provides the highest density of information content. It is likely that the light valve technology discussed herein is compatible with as-fabricated densities of 2000 dots-per-inch. This allows projection of high resolution images using compact, low cost and widely available optical components. The small size of the light valve allows the use of small format condenser lens assembly dichroic mirrors and prisms and projection lens. Subsequently, the package size of the described projector and monitor can be maintained at small dimensions and component weight is similarly minimized. Appropriate 35 mm format optical components are widely available and can be obtained at low cost relative to large and/or custom optical components. For projector and monitor requirements that cannot be met with a 35 mm compatible light valve, larger conventional or custom optical components may be employed. Due to the minimum size of a particular light valve format afforded by the described light valve technology, similar cost, size and weight advantages are translated to the procurement of custom optical components.

As has been described, the light valve technology described herein can be used to implement projection arrays of 1024x768 through 2048x2048 pixels using 35 mm format optical components. This permits the execution of high resolution color and monochrome image projectors and monitors at relatively compact dimensions and low weight.

Another feature of the present invention is that a projection display device employing single crystal silicon light valve matrices provides images with high brightness. To accomplish this, each single crystal silicon light valve matrix employed in a projection display device has a high optical aperture which is defined as the percentage of transparent area to total matrix area. Table 2 provides the optical aperture for various light valve arrays. It is noted that in general the minimum acceptable optical aperture for an array is 40%. As indicated by Table 2, as pixel density increases, which increases image resolution, optical aperture decreases. However, reducing the switching device size and/or the interconnect size for a given pixel density will increase the optical aperture.

TABLE 2

OPTICAL APERTURE COMPUTATIONS

| Transistor length (um) | 3 | 3 | 3 | 3 |
|---|---|---|---|---|
| Transistor width (um) | 6 | 6 | 6 | 6 |
| Line width (um) | 2 | 4 | 6 | 8 |
| lines per inch | 1000 | 1000 | 1000 | 1000 |
| pixel size (um) | 25.4 | 25.4 | 25.4 | 25.4 |
| grid shadow (sq. um) | 97.6 | 187.2 | 268.8 | 342.4 |
| trans. shadow (sq. um) | 18 | 18 | 18 | 18 |
| pixel area (sq. um) | 645 | 645 | 645 | 645 |
| Packing Factor (%) | 85 | 85 | 85 | 85 |
| OPTICAL APERTURE (%) | 69.8 | 58.0 | 47.2 | 37.5 |
| Transistor length (um) | 3 | 3 | 3 | 3 |
| Transistor width (um) | 6 | 6 | 6 | 6 |
| Line width (um) | 2 | 4 | 6 | 8 |
| lines per inch | 800 | 800 | 800 | 800 |
| pixel size (um) | 31.8 | 31.8 | 31.8 | 31.8 |
| grid shadow (sq. um) | 123 | 238 | 345 | 444 |
| trans. shadow (sq. um) | 18 | 18 | 18 | 18 |
| pixel area (sq. um) | 1008 | 1008 | 1008 | 1008 |
| Packing Factor (%) | 85 | 85 | 85 | 85 |
| OPTICAL APERTURE (%) | 73.1 | 73.1 | 73.1 | 73.1 |
| Transistor length (um) | 2 | 3 | 3 | 3 |
| Transistor width (um) | 6 | 6 | 6 | 6 |
| Line width (um) | 2 | 4 | 6 | 8 |
| lines per inch | 1200 | 1200 | 1200 | 1200 |
| pixel size (um) | 21.2 | 21.2 | 21.2 | 21.2 |
| grid shadow (sq. um) | 80.7 | 153.2 | 218.0 | 247.7 |
| trans. shadow (sq. um) | 18 | 18 | 18 | 18 |
| pixel area (sq. um) | 448 | 448 | 448 | 448 |
| Packing Factor (%) | 85 | 85 | 85 | 85 |
| OPTICAL APERTURE (%) | 66.3 | 52.5 | 40.2 | 29.5 |
| Transistor length (um) | 2 | 3 | 3 | 3 |
| Transistor width (um) | 6 | 6 | 6 | 6 |
| Line width (um) | 2 | 4 | 6 | 8 |
| lines per inch | 2000 | 2000 | 2000 | 2000 |
| pixel size (um) | 12.7 | 12.7 | 12.7 | 12.7 |
| grid shadow (sq. um) | 46.8 | 85.6 | 116.4 | 139.2 |
| trans. shadow (sq. um) | 18 | 18 | 18 | 18 |
| pixel area (sq. um) | 161.3 | 161.3 | 161.3 | 161.3 |
| Packing Factor (um) | 85 | 85 | 85 | 85 |
| OPTICAL APERTURE (%) | 50.9 | 30.4 | 14.2 | 2.2 |

It is noted that light valve matrices having a diagonal of 1–2 inches do not require spacers in the liquid crystal volume. Because spacers are non-transmissive elements, eliminating them from the volume results in an improved optical aperture and thus increased brightness for the matrix and also prevents optical aberration caused by spacers at small pixel geometries.

Due to the higher intensities of light used in projection systems that are necessary to provide the desired brightness, the sensitivity of the single crystal pixel transistors to the light source can impair performance. The light source can be a halogen lamp that produces between 100 and 1000 watts and preferably operates in the range of 150–300 watts. Other lights such as discrete lasers (RGB), cathodoluminescent light sources, and arc-lamps producing similar levels of power per unit area can also be used.

It is therefore desirable to reduce the sensitivity of the active matrix to the light source. This is accomplished by shielding one or both sides of each transistor in the array with a light shield that will substantially attenuate the light directed or scattered toward each transistor. A metal or other optically opaque material can be used as a shield. When the shield is a metal it can also serve as an interconnect or a gate to the transistor being shielded. At normal incidence, a metal shield can completely attenuate light from the source at wavelengths at or above the silicon bandgap with thicknesses in the range of 2000–10,000 angstroms. Shielding can also be employed around the edge of the active matrix to attenuate or block light directed towards the peripheral circuitry.

The light valve image projector and monitor configurations can be used for the applications beyond image presentation. These include image generation and projection for electronic printing and photographic image recording. In the former, the light valve and image projection optics can be used to form an image on an electrophotographic media (as in the imaging drum of xerographic or laser printer processors). The key advantage is that the entire two-dimensional image can be exposed at once. For photographic applications, the image can be projected onto photographic film or paper.

Color can be implemented in the projector or monitor through the use of color filters, instead of dichroic mirrors. In one implementation, white light from a single or multiple lamps could be passed through each of red, green and blue filter to its incidence onto the appropriate color-assigned light valve. Alternatively, color filters can be fabricated directly on the light valve assembly. This can be done with a single color filter (e.g., red, green or blue) on a light valve or the specific alignment of color filters on the discrete elements constituting the light valve. The latter allows a color image to be obtained using a single light valve but forces a factor of 3 or 4 reduction in color pixel density as the elements are assigned a red, green, or blue filter or a red, green blue and white filter respectively. Alternatively, subtractive color filters (yellow, cyan and magenta) can be similarly used.

A key criterion in a preferred projector or monitor embodiment is the management of heat generated by the lamp light source. A significant portion of this heat is in the form of infrared (IR) radiation emanating from the lamp. Methods of controlling this IR radiation are its absorption by an IR filter or its reflection by an IR "heat mirror" that allows high transmission of visible light to the subsequent optics. Another method is the use of a dichroic mirror that separates the IR radiation from the visible light path and directs the IR to directly exit the projector or monitor housing.

A light valve panel formed by the described technology is compatible with 35 mm format optics. Therefore, this imaging device can be fabricated such that the assembled device has equivalent physical dimensions as a standard 35 mm photographic transparency whose image is projected via a conventional and generally available 35 mm "slide projector". Thus, an embodiment of the light valve projector is to use a single light valve matrix panel with integral drive electronics, as described herein, that is packaged to be size-equivalent with a standard mounted 35 mm transparency and to insert this modular electronic imaging device into a 35 mm "slide projector" without modification in order to generate the projected image. The light valve imaging device is connected by a cable to control electronics as are described herein. In this embodiment, a single light valve panel could generate a monochrome image or a color image through the use of applied color filters as described elsewhere herein. The light valve panel used for this embodiment can have the same fabricated element/pixel density as described for the other embodiments.

Figure 3:
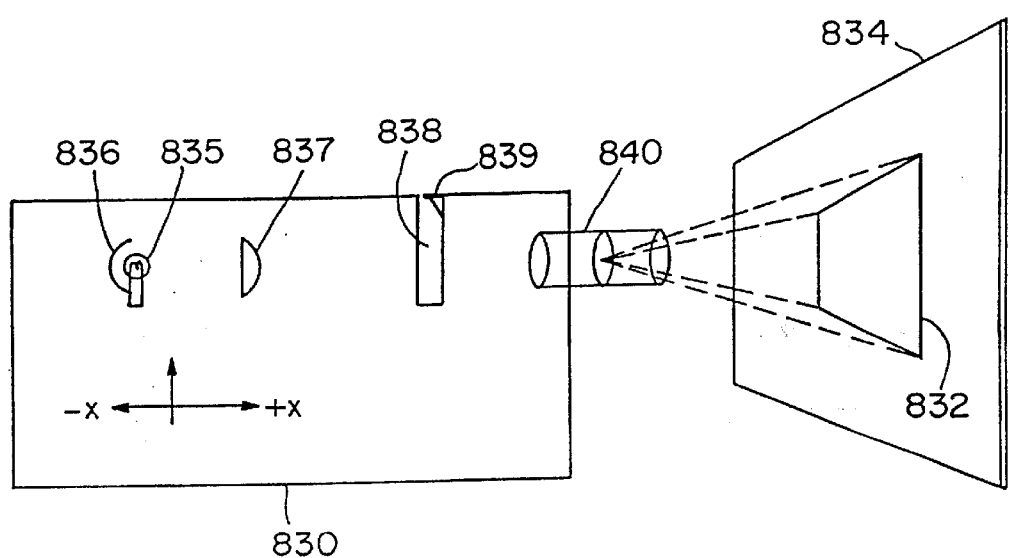
FIG. 3 is an illustration of a conventional slide projector.

Accordingly, other preferred embodiments of the present invention are directed to an active matrix (AM) display device adapted for use in a conventional 35 mm slide projector for providing monochrome or multi-color images. A conventional slide projector is illustrated in FIG. 3. The projector 830 produces from slide transparencies monochrome or multi-color images 832 that are projected to an enlarged surface 834 which may be a projection screen or any relatively flat surface.

Within the slide projector 830, light from a halogen lamp 835 is directed by a reflector 836 and an optional condenser lens 837 to slide chamber 838. The spherical reflector 836 collects light emitted in the −X direction and images the light of the lamp back onto itself. The condenser lens 837 is preferably designed for maximum collection efficiency for collecting light emitted in the +X direction. The white light from the lamp 836 is directed to a slide transparency (not shown) positioned in the slide chamber 838. The illuminating light is manipulated as it passes through the slide, producing an image which is directed to an optical system 840. The image is projected by the optical system 840 to the surface 834.

In accordance with the present invention, an active matrix display panel is adapted to be securely positioned in the slide chamber for selectively transmitting light from the lamp to provide monochrome or multi-color images to the optical system for projection onto a viewing surface. The basic components of the AM display panel include a first polarizing filter, a glass substrate, a transparent and conductive ITO coating, an epoxy adhesive, an active matrix circuit panel, a second transparent and conductive ITO coating, a glass superstrate and a second polarizing filter. These components are arranged in a layered structure and secured in a display panel housing dimensioned to fit securely in a 35 mm slide projector chamber. It is noted that the side walls of the housing, the ITO coatings and the superstrate provide electrical shielding for the active matrix circuitry. A liquid crystal material is placed in a volume between the circuit panel and the glass superstrate. Details for fabricating suitable active matrix display panels are provided in the incorporated applications.

An important feature of the active matrix display panel of the present invention is that it is compatible with existing slide projectors. The slide chamber 838 of an existing projector 830 is dimensional to accept a standard 2×2 inch slide having a thickness of up to ⅜ths of an inch. Because a standard 35 mm slide usually has a significantly smaller thickness, a spring-loaded slide holder 839 is provided to secure the slide in the chamber. In accordance with the present invention, an active matrix display panel assembly has a 2×2 inch face with a thickness of less than about ⅜ inch such that it can be securely positioned in a slide chamber without modification thereto.

The active matrix circuit panel 848 has an array of pixels or light valves 850 which are individually actuated by a drive circuit. The drive circuit includes circuit components that are positioned adjacent the array and electrically connected to the light valves for modulating the individual light valves so that the illuminating light may be selectively transmitted through the liquid crystal material to form a monochrome or multi-color image.

As noted above, the active matrix circuitry can be adapted to provide color images through the use of color filters. In one embodiment, white light from the projector light source can be passed through each of a stacked arrangement of red, green and blue filters to the appropriate color assigned light value. Alternatively, a color filter can be fabricated directly onto each light valve and the light valves are arranged by filter color to provide uniform color images. For example, pixels can be arranged in a triad arrangement where three color filters are employed or the pixels can be arranged in a quad arrangement where four filters are employed.

In preferred embodiments, the active matrix circuit panel circuitry is formed in or on a layer of a semiconductor material such as silicon. It is noted that any number of fabrication techniques can be employed to provide preferred thin-films of polysilicon or single crystal silicon. In embodiments in which the active matrix is formed in a thin-film of single crystal silicon, any of the previously mentioned pixel densities can be provided such that high resolution images are produced. Other preferred embodiments employ the use of a solid state material or any material whose optical transmission properties can be altered by the application of an electric field can be used to supply the light valves for the AM display panel of the present invention.

Figure 4A:
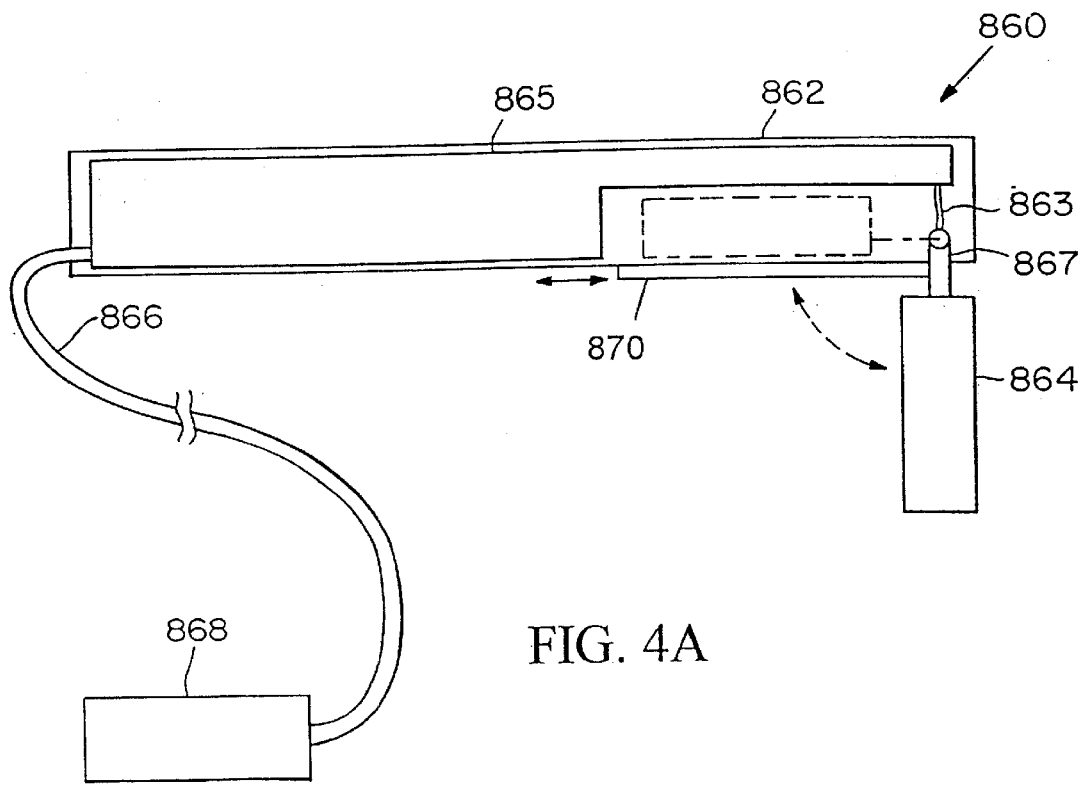
FIGS. 4A–4B illustrate a preferred embodiment of an active matrix display device employed in a conventional slide projector.
Figure 4B:
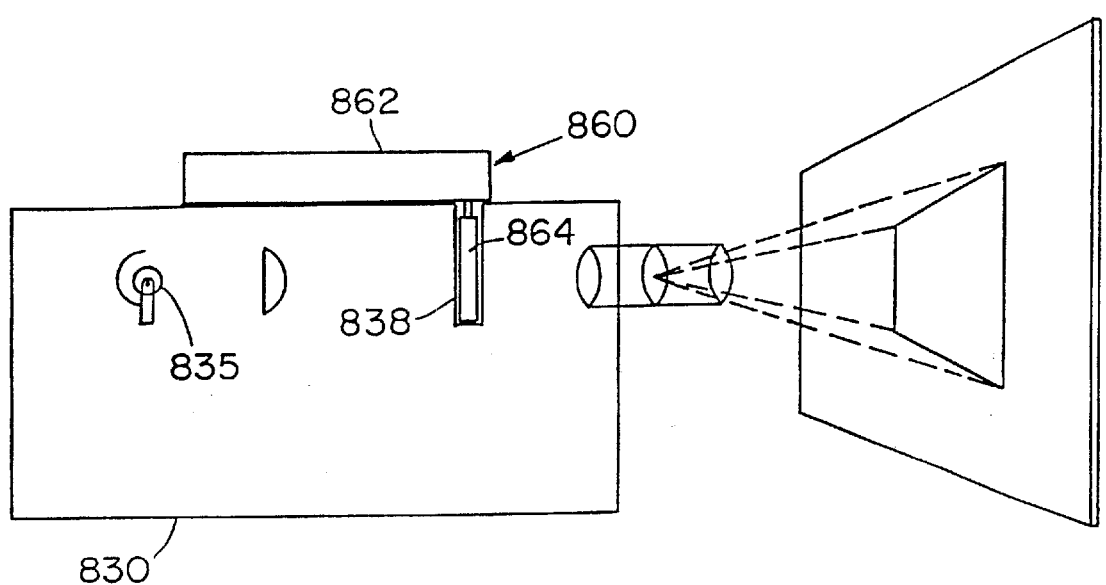

A preferred embodiment of an active matrix display device for use with a slide projector is illustrated in FIGS. 4A–4B. Referring to FIG. 4B, the display device 860 includes a housing 862 and an active matrix display panel 864. The housing 862 is positioned on the slide projector 830 so that the display panel 864 is securely disposed in the slide chamber 838. Referring to FIG. 4A, the display panel 864 is rotatably mounted to the housing 862 by an arm 867. As such, the display panel 864 has a storage position (dashed lines) and an operating position. When the display panel 864 is rotated into the operating position, the sliding shielded cover 870 is moved into a closed position (as shown) for sealing the housing.

The housing preferably contains a shielded electronics assembly 865 which is electrically connected to the display panel 864 by a cable 863. The electronics assembly 865 has an input cable (or connector) 866 for connecting to an image generation device 868 which may be a computer or any video device. Image data provided by the device 868 is processed by the electronics 865 and sent to the drive circuitry of the AM display panel 864. Responsive to the received data, the drive circuitry modulates the individual active matrix light valves such that the illuminating light from the light source 835 is selectively transmitted through the display panel to form monochrome or multi-color images.

Figure 5:
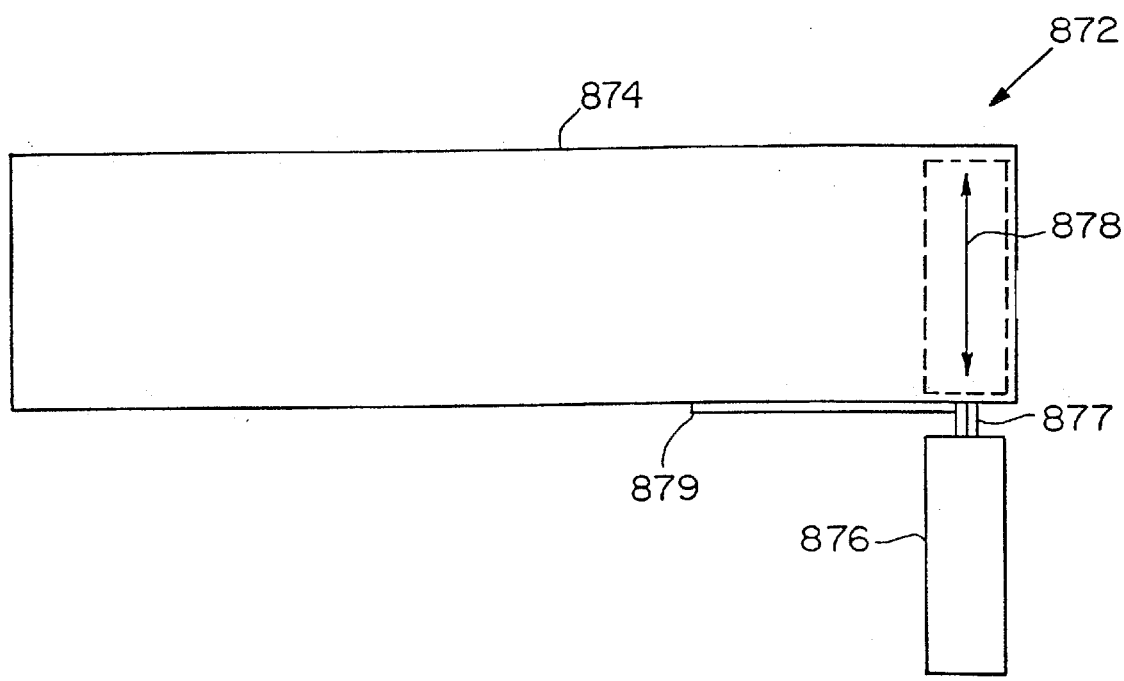
FIG. 5 is an illustration of another preferred embodiment of an active matrix display device employed in a conventional slide projector.

Another preferred embodiment of an active matrix display device is illustrated in FIG. 5. The display device 872 includes an electronics housing 874 and an active matrix display panel 876 translatably mounted to the housing by a spring-loaded arm 877. As such, the display panel 876 has a storage position (dashed lines) in the housing 874 and an operating position located along a vertical axis 878.

The display panel 876 is moved into the operating position such that it can be positioned in the chamber of a slide projector (not shown). With the display panel 876 in the operating position, the shielded cover 879 is moved along an axis orthogonal to the vertical axis 878 into a closed position (as shown) for sealing the housing. Alternatively, a cover can be attached to arm 877 such that when the display panel 876 is moved to the operating position, the opening in the housing 874, through which the display panel 876 is moved, is sealed by the cover. In another embodiment, the display panel 876 is mounted on a track on the internal walls of housing 874 and is moved into the operating position by sliding along the track.

Figure 6A:
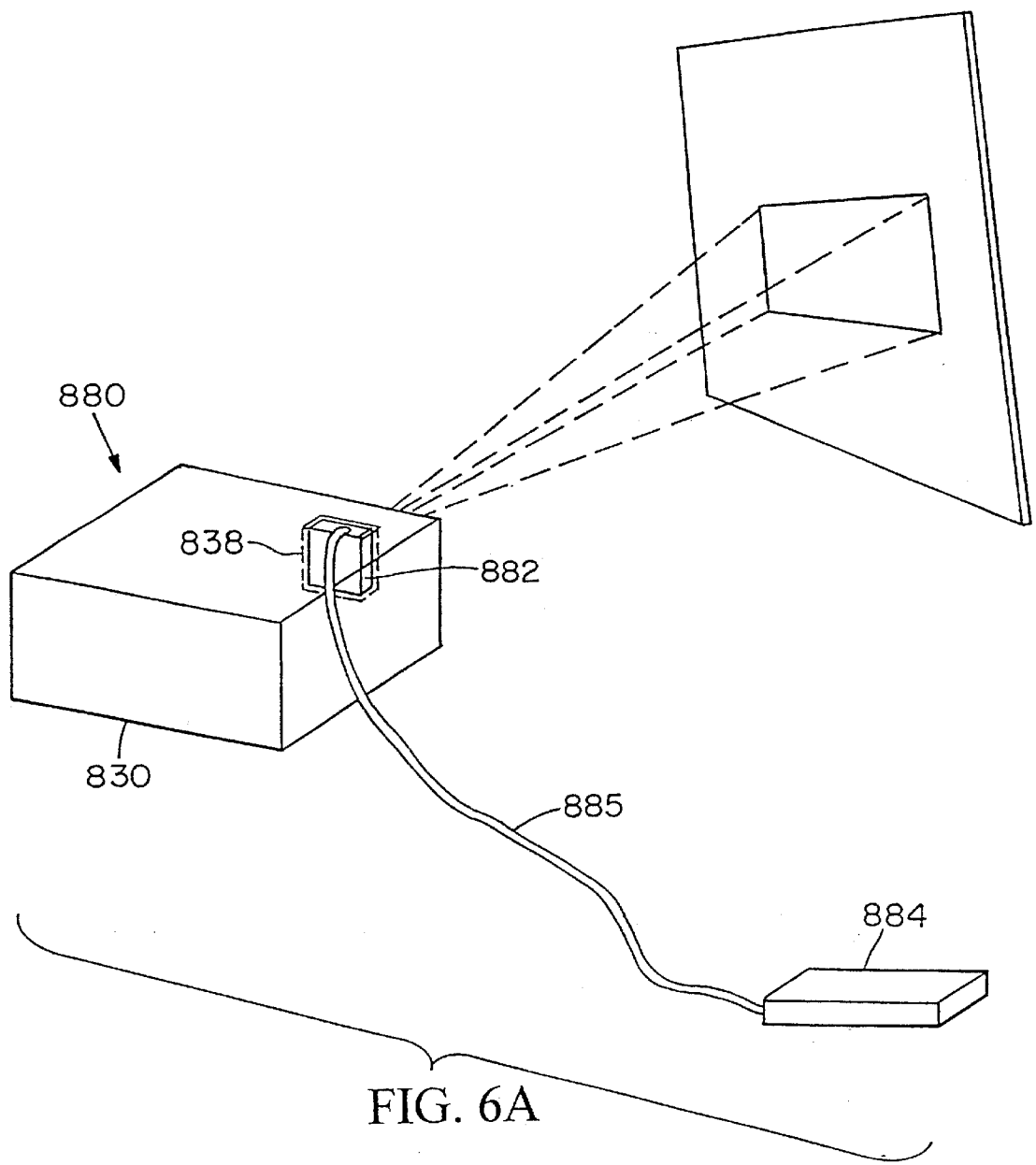
FIG. 6A is a perspective view of another embodiment of an active matrix display device of the present invention.

In another preferred embodiment shown in FIG. 6A, an active matrix display device 880 includes an AM display panel 882 and a remote electronics housing 884. The display panel 882 is dimensioned to be securely positioned in the chamber 838 of the slide projector 830. The display panel 882 is electrically connected to electronics in the remote housing 884 by a cable 885.

Figure 6B:
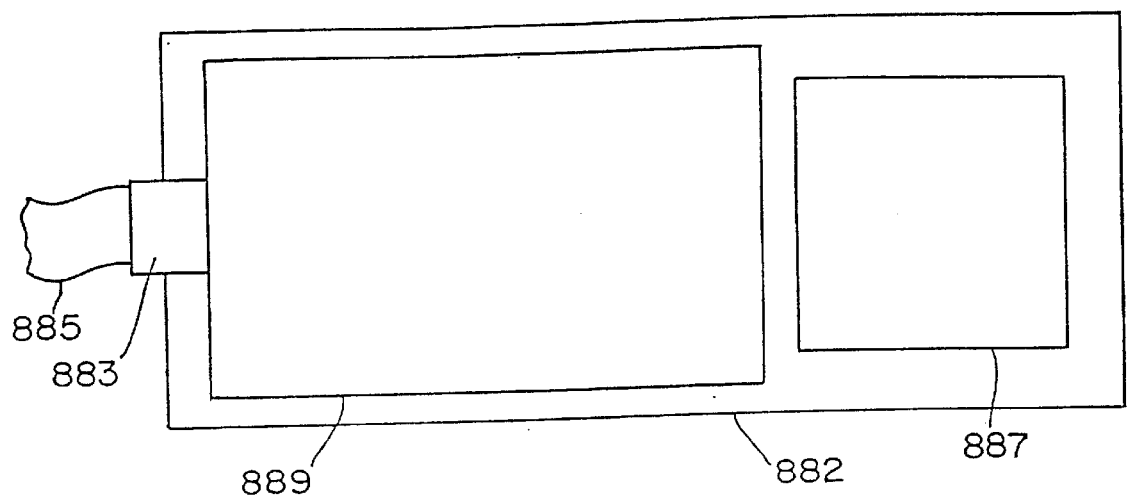
FIG. 6B is a plan view of an active matrix and collocated driver/signal processing circuitry for the active matrix display panel of FIG. 6A.

Referring to FIG. 6B, the housing (not shown) is connected to an image generation device (not shown) which may be a computer or any video device. Image data provided by the device is received by the electronics in the housing at connector 883 and sent to the drive/signal processing circuitry 889 (described below) on the AM display panel 882. Responsive to the received data, the circuitry 889 modulates the individual light valves of the active matrix 887 for providing monochrome or multi-colored images.

Figure 7:
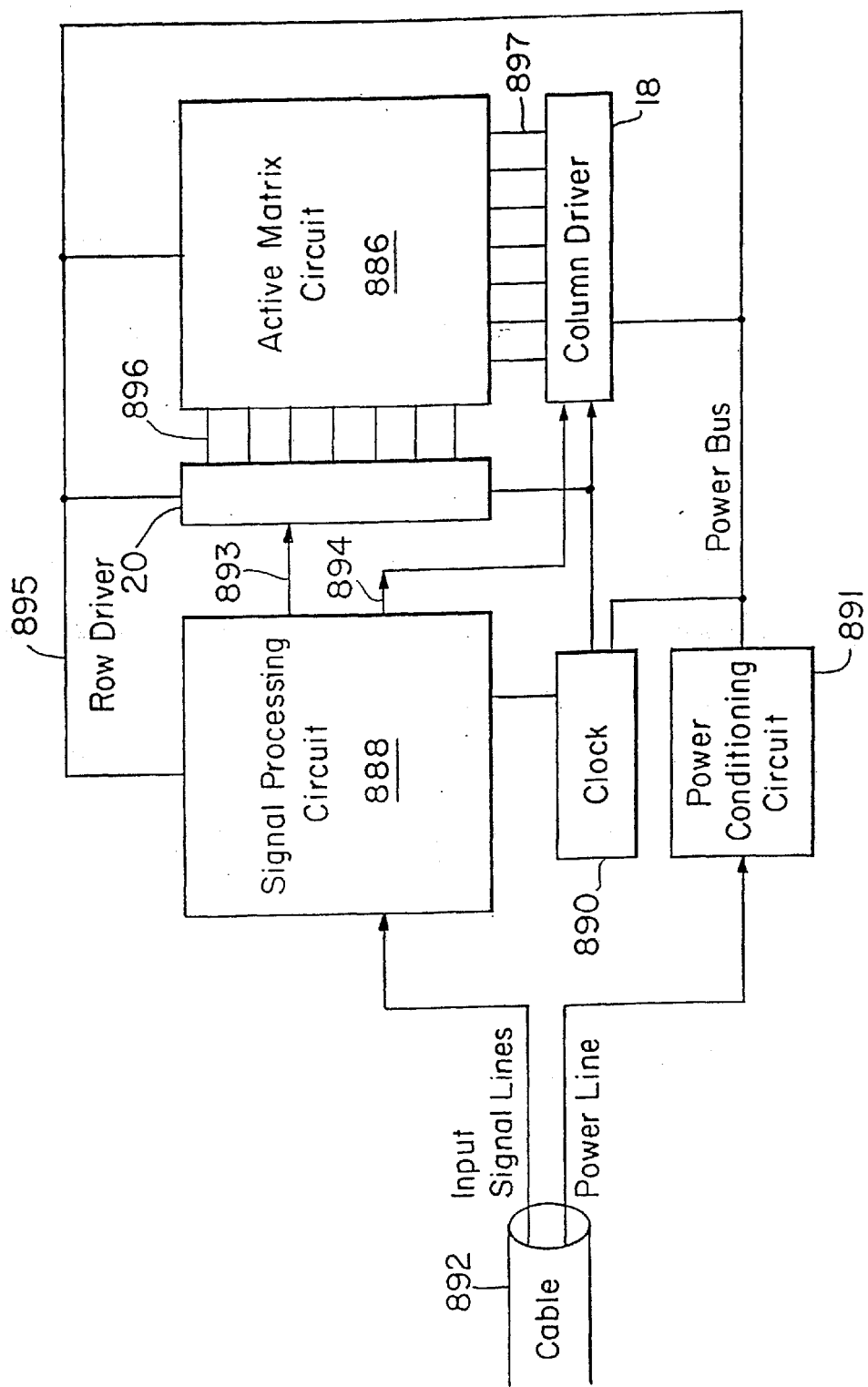
FIG. 7 is a circuit diagram illustrating a preferred driver system for an active matrix display device.

Preferred embodiments of the active matrix display device (FIGS. 4A, 5 and 6A) include a driver circuit 889 for selectively actuating the active matrix light valves as shown in FIG. 7. Referring to FIG. 7, the active matrix comprises a plurality of light valves which are individually actuated by collocated driver circuitry 886. The collocated driver circuitry is controlled by supporting driver circuitry which includes a signal processing circuit 888, a system clock 890, a power conditioning circuit 891, column drivers 18, and row drivers 20.

The signal processing circuit 888 receives via the cable 892 an input signal which may be an RGB signal, an NTSC signal, an S-Video signal or other video format signal, or any digital or analog signal. The signal processing circuit processes the incoming signal and (for a multi-color active matrix) produces separate video output signals for each primary color and synchronization signals for the column and row drivers. These signals are provided to the column driver (via bus 893) and row driver (via bus 894). The video output signal on line 895 is a serial data stream wherein the amplitude of each signal of the data stream determines the intensity of light transmitted through each light valve. Alternatively, the video output signal may be a digitally formatted data stream indicative of the light intensity. Preferably, the video output signal is VGA compatible, providing a data rate of up to 32 Mbps.

The serial data stream on line 895 is received by the row drivers 18. The row drivers send each of the signal data streams to the light valves through buses 896. The column drivers 20, responsive to the sync signal, send a signal through buses 897 to turn on individual transistors allowing the associated signal of the data stream to charge the capacitor in each pixel. The capacitor sustains a charge, which is proportioned to the amplitude of the associated signal on the light valve until the next scan of the array.

Figure 8:
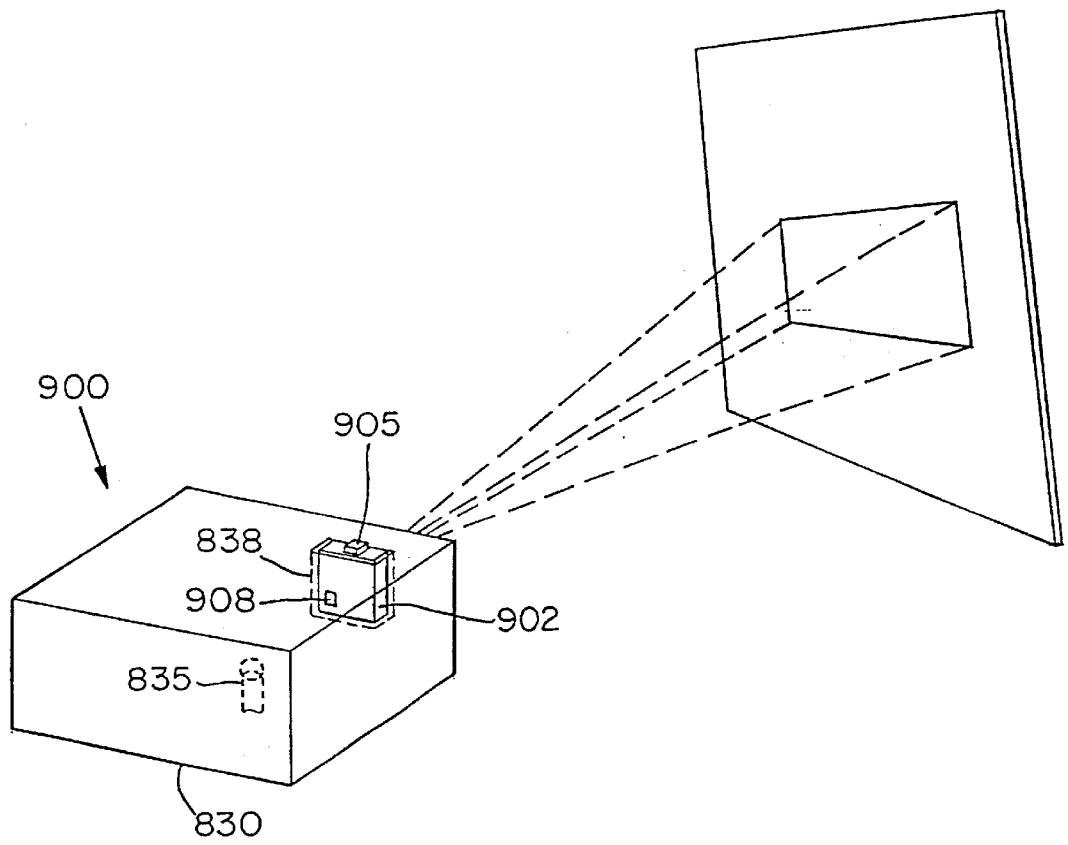
FIG. 8 is a perspective view of another embodiment of an active matrix display device of the present invention.

In another preferred embodiment shown in FIG. 8, an active matrix display device 900 includes an AM display panel 902 and a remote electronics housing 904. The display panel 902 is dimensioned to be positioned in the chamber 838 of a 35 mm slide projector 830. In contrast to previously described embodiments, the display panel 902 is not physically connected to the electronics housing 904. Instead, the slide and the electronics in the housing 904 communicate with each other via antennas elements 905 and 906 respectively. In preferred embodiments, the antennas can be a pair of RF antennas or an infrared transmitter element such as an infrared LED paired with an infrared receiver element which can be a photodiode elements. The antenna 905 can be integrated into a handle (not shown) to provide for manual insertion and removal from chamber 838.

Figure 9A:
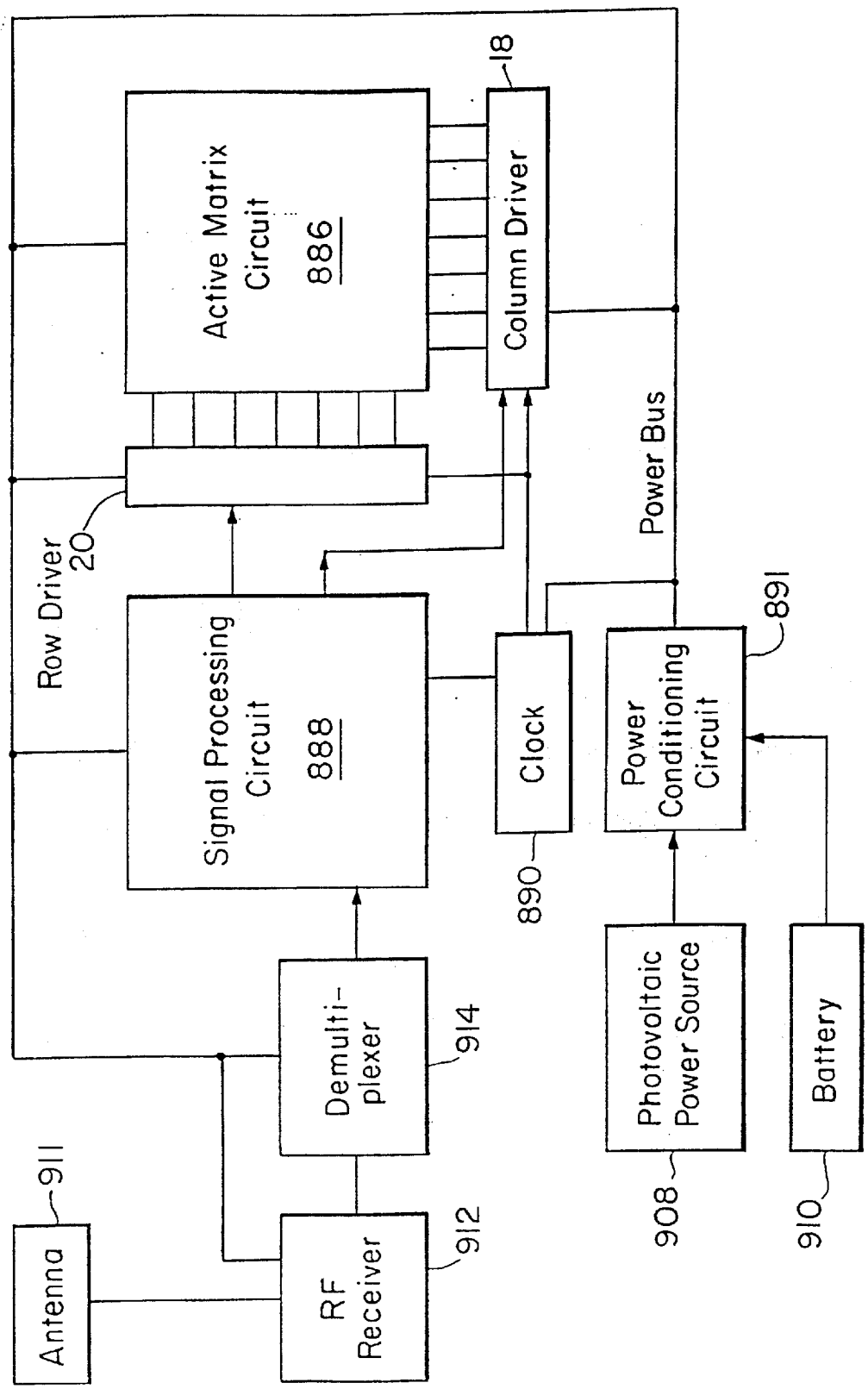
FIGS. 9A–9B are circuit diagrams illustrating two preferred driver systems for the active matrix display device of FIG. 8.
Figure 9B:
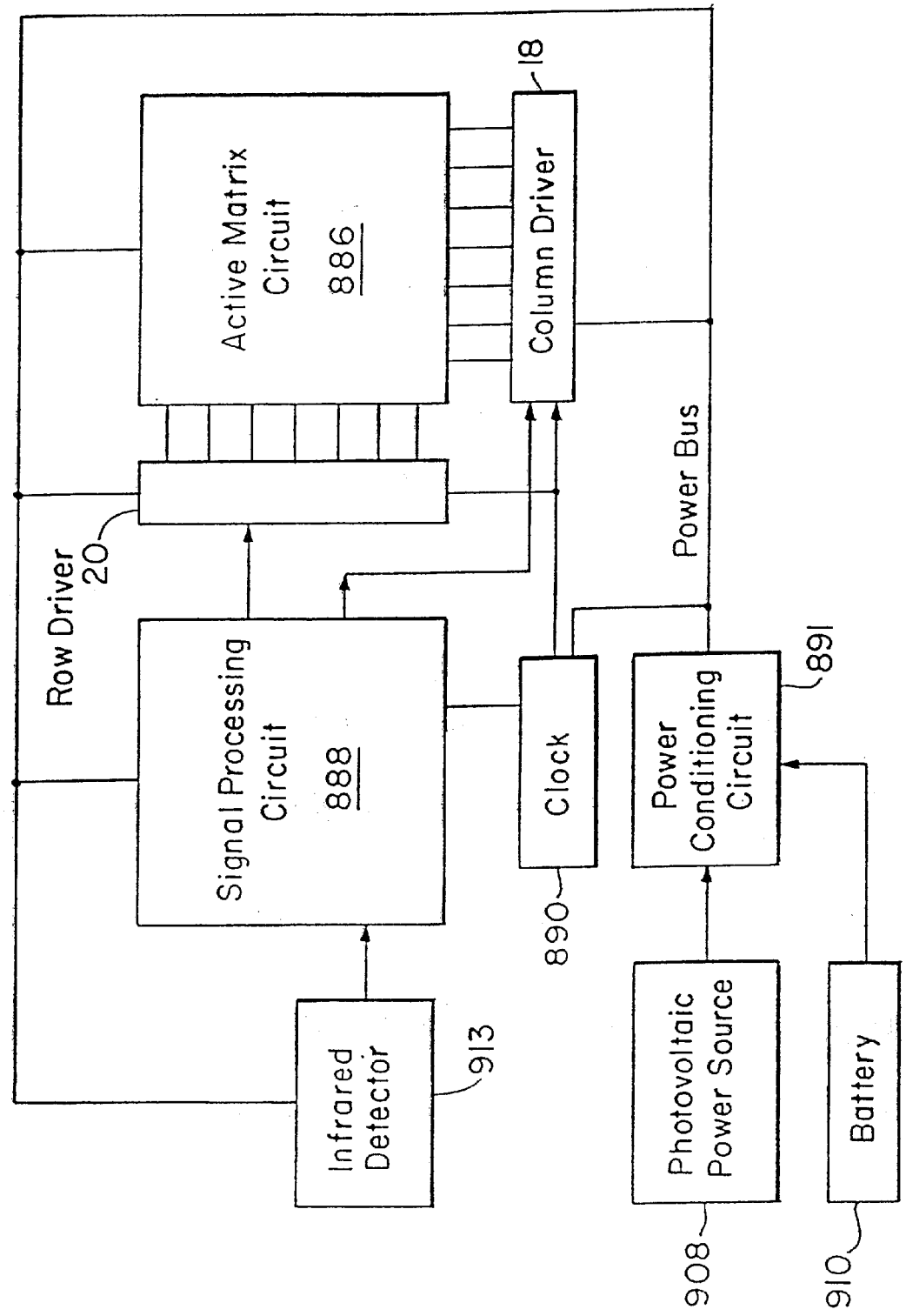

Driver circuitry for the active matrix display device of FIG. 8 is illustrated in FIGS. 9A–9B. Referring to FIG. 9A, the driver circuitry includes the signal processing circuit 888, the system clock 890, the power conditioning circuit 891, column drivers 18, row drivers 20, a photovoltaic power source 908, a battery 910, an RF receiver 912 and an demultiplexer 914. The RF receiver 912 receives a stream of RF signals from the antenna 911. A demultiplexer 914 formats the RF signal stream such that it is can be processed by the previously-described signal processing circuit 888. The battery 910 and the photovoltaic power source 908, either individually or together, provide power to support the operations of the active matrix display circuitry. The photovoltaic power source 908 can use slide projector light source energy to provide power to the active matrix display panel and is therefore mounted onto the display panel outer surface facing the light source (shown in FIG. 8).

Referring to FIG. 9B, the driver circuitry includes the signal processing circuit 888, the system clock 890, the power conditioning circuit 891, column drivers 18, row drivers 20, a photovoltaic power source 908, a battery 910 and an infrared detector photodiode 913. The photodiode 913 receives infrared signals from the electronics (not shown) which are processed by the signal processing circuit 888.

Figure 10:
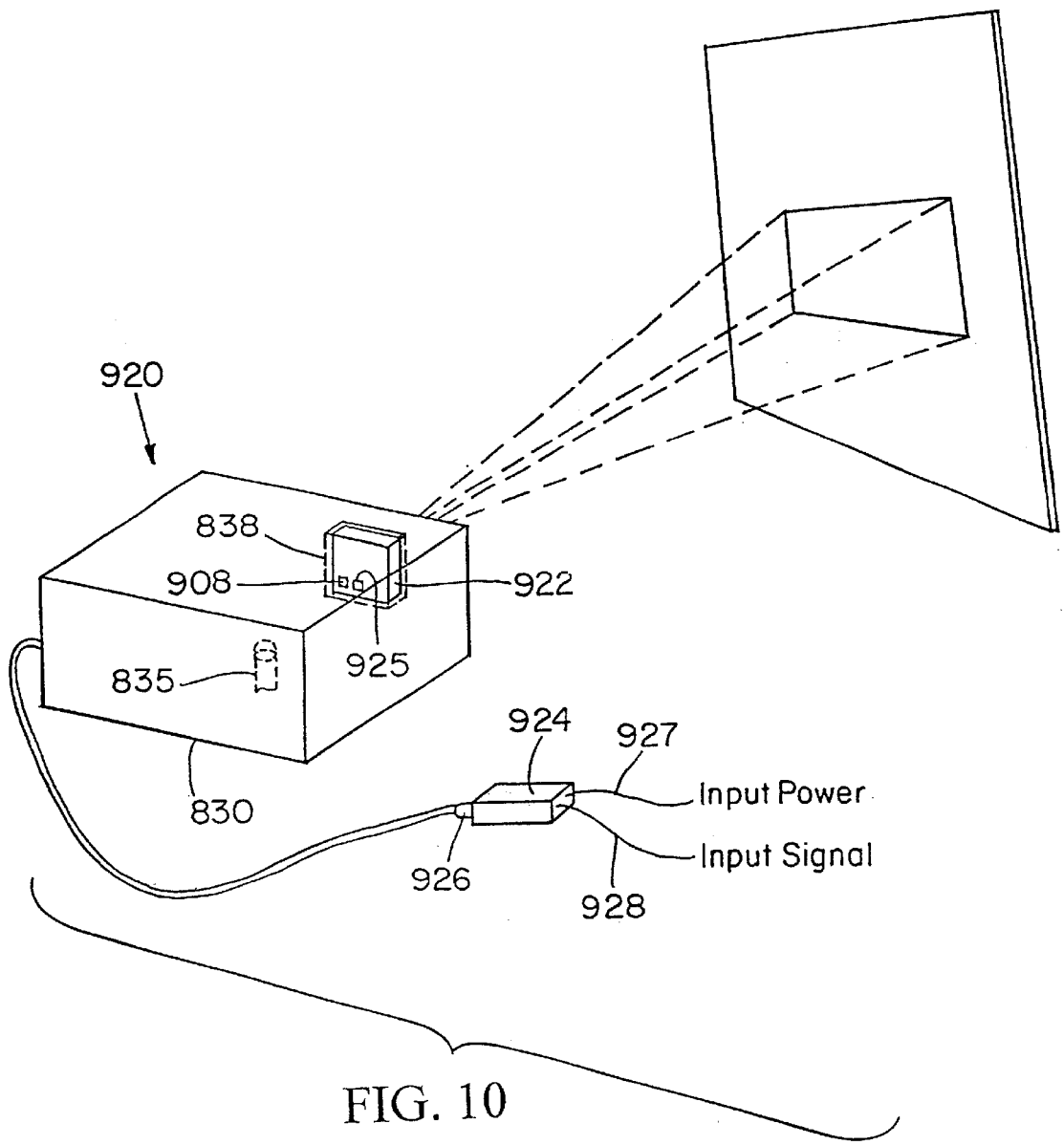
FIG. 10 is a perspective view of another embodiment of an active matrix display device.

In another preferred embodiment shown in FIG. 10, an active matrix display device 920 includes an AM display panel 922 and an adapter unit 924. The display panel 922 is dimensioned to be securely positioned in the chamber 838 for receiving light generated by the light source 835. A photovoltaic power source 908 is located on the display panel 922 facing the light source 835 to provide power to the active matrix. The slide projector includes a plug 926 which is typically plugged into an electrical outlet (not shown) to receive electrical energy to power the projector light source 835. However, in this embodiment, the plug 926 is plugged into the adapter unit 924 to receive electrical energy.

The adapter unit receives electrical energy via the input power line 927 and image information via the input signal line 928. The adapter unit houses supporting electronics which couples encoded signals representing the received image information into incoming electrical energy received on line 927. The electrical energy with encoded image signals is directed to the plug 926 for providing power to the projector. The light source 835 converts some of the received electrical energy into light which is directed to the active matrix display panel. As such, the encoded image signals are transmitted to the display panel by the light source. A detector 925 is positioned on the display panel for receiving the encoded signals.

Figure 11A:
FIGS. 11A–11C is a preferred process flow sequence illustrating the SIMOX process for fabricating a single crystal silicon layer.
Figure 11B:
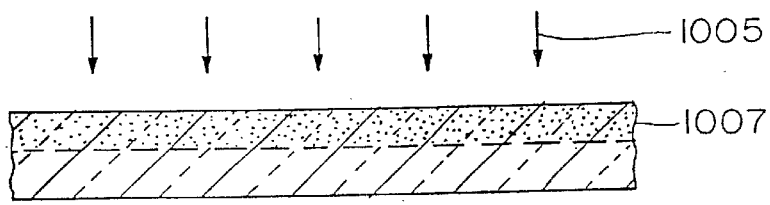
Figure 11C:
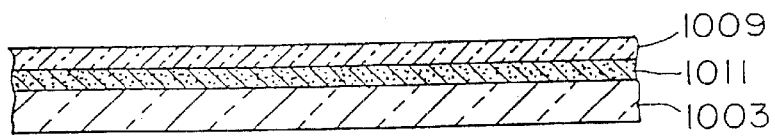

The present invention includes other fabrication techniques which can be employed to provide thin layers of single crystal silicon. In one embodiment, the SIMOX fabrication process shown in FIGS. 11A–11C can be used. A single crystal silicon substrate 1003 shown in FIG. 11A receives an implant of $5*10^{17}/cm^2$ to $2*10^{18}/cm^2$ of oxygen atoms 1007 (FIG. 11B). The implant process can be performed at temperatures exceeding 650° C. Next, the wafer is subjected to a high temperature annealing process 1005 (at about 1300° C.) for about six hours. Referring to FIG. 1C, the resulting structure has a buried oxide layer 1011 (thickness of about 4000 angstroms) below a single crystal layer 1009 (thickness of about 2000 angstroms). It is noted that a multiple implant and anneal procedure can be employed to further improve the crystallinity of the silicon layer.

Figure 12:
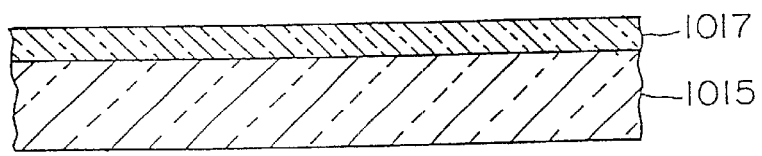
FIG. 12 illustrates the Van der Waals bonding approach for providing a single crystal silicon layer.

In another embodiment, a thin film or layer of single crystal silicon can be secured on a quartz substrate by Van der Waals bonding. Referring to FIG. 12, a silicon thin film 1017 is located on a quartz substrate 1015. The film 1017 is secured to the substrate 1015 by an electrostatic force known as a Van der Waals force, which is an attractive force between two different atoms or nonpolar molecules. The Van der Waals force arises because a fluctuating dipole moment in one molecule-type (either silicon or quartz) induces a dipole moment in the other molecule-type, and the two dipole moments interact.

Figure 13A:
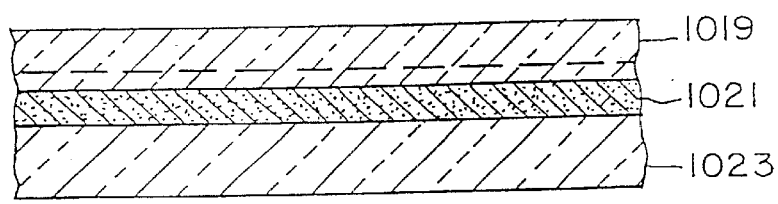
FIGS. 13A–13B is a preferred process flow sequence illustrating the bonded wafer process for forming a single crystal silicon layer.
Figure 13B:
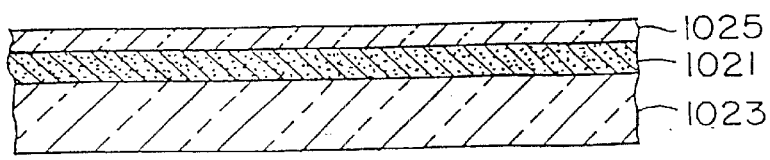

In another embodiment, a bonded wafer approach can be employed to provide a layer of single crystal silicon. Referring to FIG. 13A, an oxide layer 1021 is formed on a single crystal silicon wafer 1023 by known techniques. A second single crystal silicon wafer 1019 is positioned on the oxide layer 1021. The wafer 1019 is then processed to obtain a thin layer of single crystal silicon (dashed lines). Any known processing techniques, such as lapping or etching, can be used to obtain the thin layer of single crystal silicon 1025 (FIG. 13B). Active matrix circuitry can be formed in the single crystal silicon layer 1025.

Figure 14A:
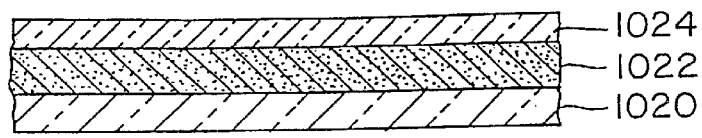
FIGS. 14A–14G is a preferred process flow sequence illustrating the fabrication of a transmissive active matrix color display.

FIGS. 14A–14G illustrate a preferred fabrication process for forming an active matrix color display. Referring to FIG. 14A, an SOI structure includes a substrate 1020 and an oxide 1022 (such as, for example, $SiO_2$) that is grown or deposited on the substrate 1020. A thin single crystal layer 1024 of silicon is formed over the oxide 1020. The oxide (or insulator) is thus buried beneath the Si surface layer. For the case of ISE SOI structures, described previously, the top layer is a substantially single-crystal recrystallized silicon, from which CMOS circuits can be fabricated. The use of a buried insulator provides devices having higher speeds than can be obtained in conventional bulk (Czochralski) material. However, it is noted that any number of techniques can be employed to provide a thin-film of single crystal Si.

Figure 14B:
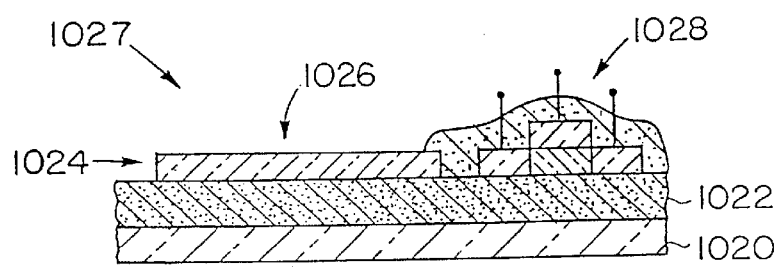

As shown in FIG. 14B, the film 1024 is patterned to define a pixel electrode region 1026 and a transistor region 1028 for each pixel element 1027. In one embodiment, the pixel electrode is formed of single crystal silicon. In another embodiment, the silicon is removed and indium tin oxide (ITO) is applied and patterned to form the pixel electrode. A transistor 1028 is then formed in accordance with any number of fabrication techniques, including those previously described herein. A thin layer of $SiN_2$ (not shown) is then formed over each pixel element.

Figure 14C:
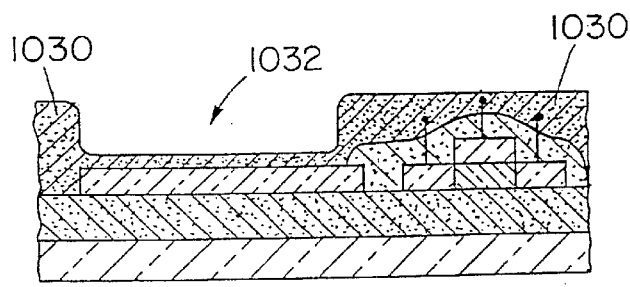

Next, a thin layer 1030 of optically transmissive material, such as $SiO_2$, is also formed over each pixel element 1027 and patterned to provide a well 1032 adjacent to each pixel electrode 1026 (FIG. 14C).

Figure 14D:
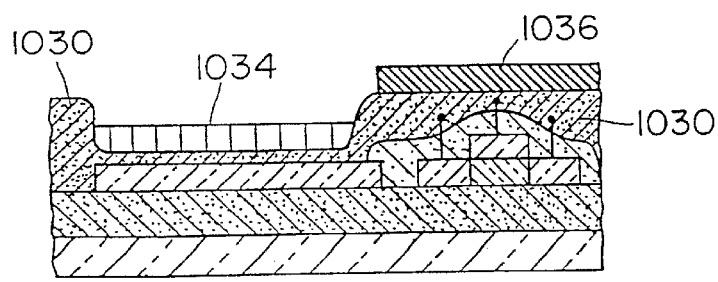

Referring to FIG. 14D, a color filter element 1034 is formed in the well 1032 adjacent to the thin film of essentially single crystal semiconductor material. Each color filter element 1034 is correlated with a pixel element 1027. The color filter elements can be formed by processing an emulsion or a photoresist carrier, as explained below, or by processing conventional filter materials. The individual color filter elements can be processed to provide an arrangement of three or four different color pixel elements in any of the previously described geometries. A matrix of opaque (or black) elements 1036 can also be formed adjacent to the thin film. Each opaque element 1036 is correlated with a pixel element 1027 serves to absorb light. A light shield for reflecting incident light and preventing the incident light from impinging upon the transistor 1028 associated with the pixel element can also be used. Such light shields are described in U.S. Ser. No. 07/823,858 filed on Jan. 22, 1992, which is incorporated herein by reference.

Figure 14E:
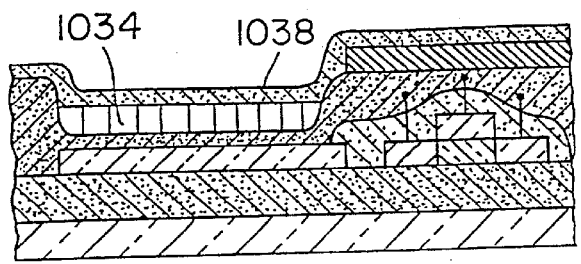
Figure 14F:
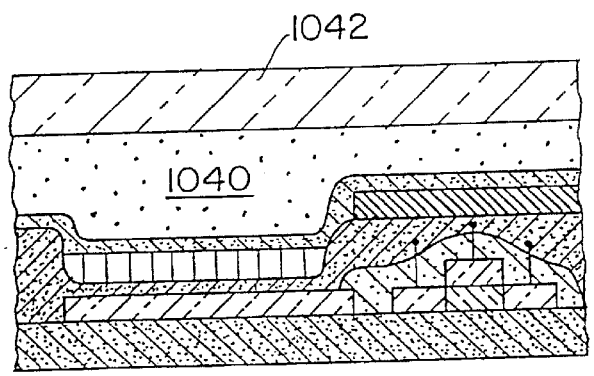

A thin optically transmissive layer 1038, which can be $SiO_2$, polyimide or sputtered glass, is formed over each pixel element (FIG. 14E). Referring to FIG. 14F, the active matrix structure is then transferred to an optically transmissive substrate 1042. To that end, an epoxy 1040 is used to attach an optically transmissive substrate 1042 to the active matrix and the color filter array. However, the optically transmissive layer 1038 isolates the color filter array from the epoxy 1040. The substrate 1020 (and optionally the oxide layer 1022) is removed and the epoxy 1040 is cured by heating the structure at about 160° C. for 24 hours.

Figure 14G:
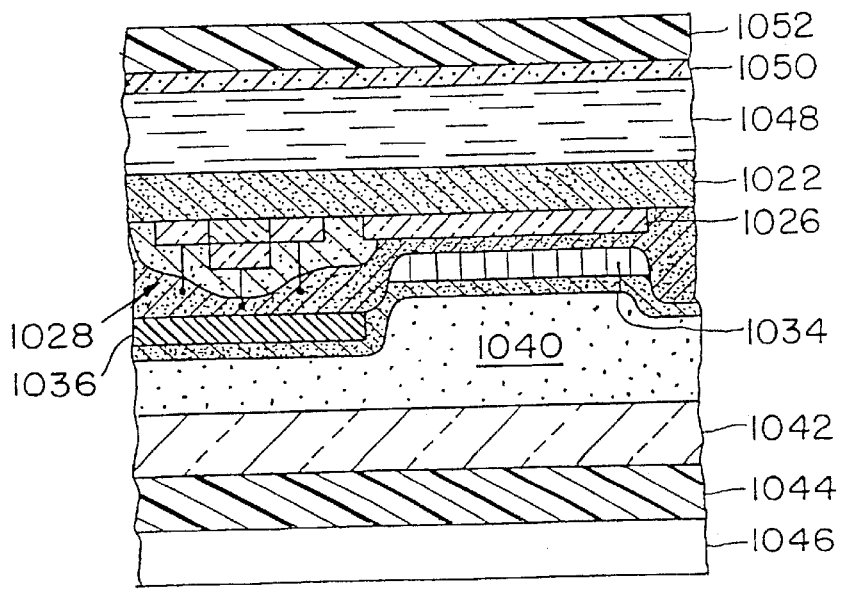

Referring to FIG. 14G, a cross-sectional view of the resulting display device is shown. Each pixel electrode 1028 and counterelectrode 1050 are laterally spaced from each other. Each pixel element 1027 will have a transistor 1028, a pixel electrode 1026 and an adjacent color filter element 1036 associated therewith. Polarizing elements 1052, 1044 are positioned on opposite sides of the structure which also includes the bonding element or adhesive 1040 and the optically transmissive substrate 1042, such as glass or plastic. The structure is completed by positioning a back light source 1046 adjacent to the polarizing element 1044.

Figure 15A:
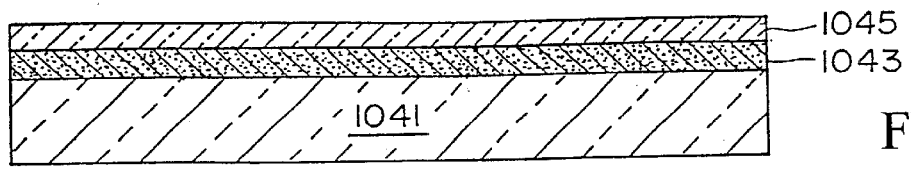
FIGS. 15A–15K is another preferred process flow sequence illustrating the fabrication of a transmissive active matrix color display.

FIGS. 15A–15K illustrate another preferred fabrication process for forming an active matrix color display. Referring to FIG. 15A, an SOI structure includes a silicon substrate 1041 and an insulating oxide layer 1043 (such as, for example, one micron of $SiO_2$) that is grown or deposited on the substrate 1041. A thin (i.e. 300 nm) single crystal layer 1045 of silicon is formed over the oxide 1043. The oxide is thus buried beneath the silicon surface layer, such that higher speed devices can be fabricated as explained previously. However, it is noted that any number of techniques can be employed to provide a thin film of single crystal silicon.

Figure 15B:
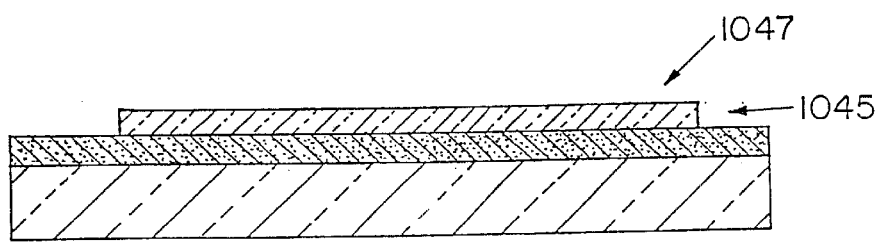
Figure 15C:
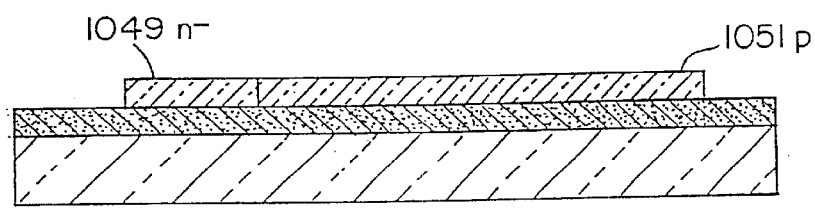

As shown in FIG. 15B, the film 1045 is patterned into islands to define each pixel element 1047. As explained below, the pixel elements are then processed to form a transistor and an electrode for each pixel. To that end, the pixel elements are masked (not shown) and subjected to deep and shallow implants to form an n-well region 1049 (FIG. 15C). Another masked is formed over the pixel elements, and the elements are subjected to deep and shallow implants to form an p-well region 1051.

Figure 15D:
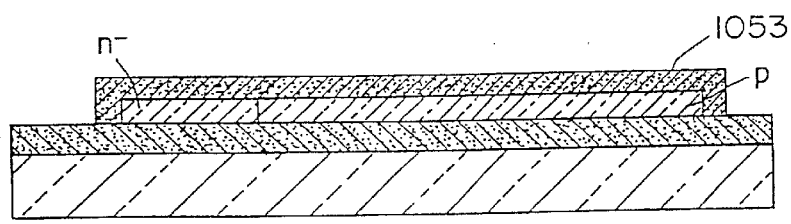
Figure 15E:
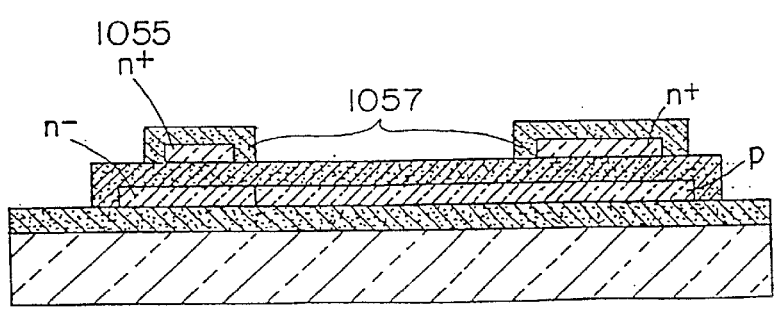

Referring to FIG. 15D, an $SiO_2$ layer 1053 having a thickness on the order of 70 nm is formed over each silicon island 1047. A layer of polysilicon having a thickness of about 500 nm is formed on the oxide layer 1053, doped to provide an n+ region and patterned to form a transistor gate 1055 (FIG. 15E). Another oxide layer 1057 having a thickness of about 70 nm is formed over the polysilicon.

Figure 15F:
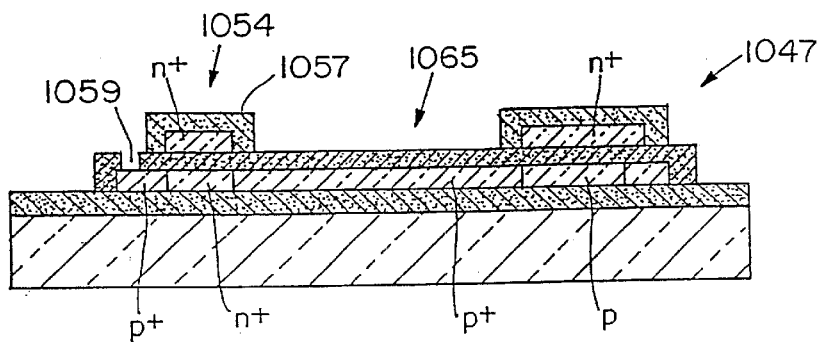

The pixel elements 1047 are masked (not shown) and doped with $2*10^{15}$ of phosphorus to provide an n+ source/drain implantation (FIG. 15F). After the mask is removed, the pixel elements are again masked and doped with $4*10^{15}$ of boron to provide a p+ source/drain implantation. As such, a transistor 1054 and a pixel electrode 1065 have been formed for each pixel element 1047.

Figure 15G:
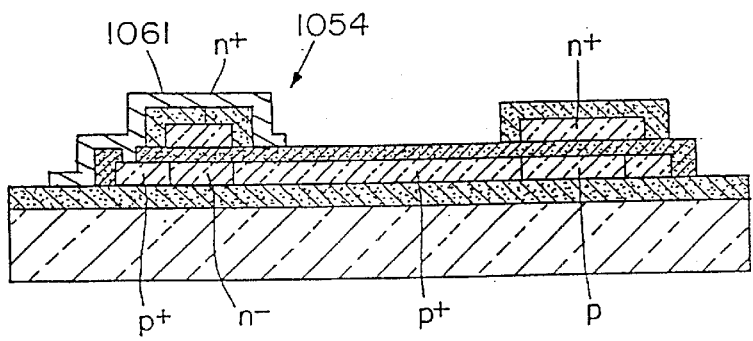

A portion 1059 of the oxide layer is then removed to form a contact for the transistor 1054. Referring to FIG. 15G, a metallization deposition is then performed to form a layer 1061 over the transistor 1054. The layer can comprise aluminum and has a thickness of about one micron. The layer 1061 serves as a pixel light shield as well as a contact for the transistor 1054.

Figure 15H:
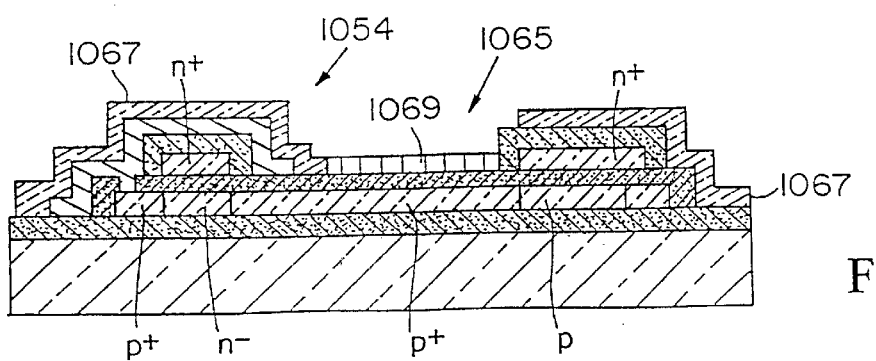

Referring to FIG. 15H, the entire pixel can be coated with a thin (about 150 nm) layer of silicon nitride (not shown). Next, a layer of amorphous silicon having a thickness of about 500 nm is deposited over each pixel element. The layer is then patterned to provide a matrix of black elements 1067, each black element associated with a transistor. A color filter element 1069 is formed over the pixel electrode 1065. The color filter elements can be formed by processing an emulsion or a photoresist carrier, as explained below, or by processing conventional filter materials. The individual color filter elements can be processed to provide an arrangement of three or four different color pixel elements in any of the previously described geometries.

Figure 15I:
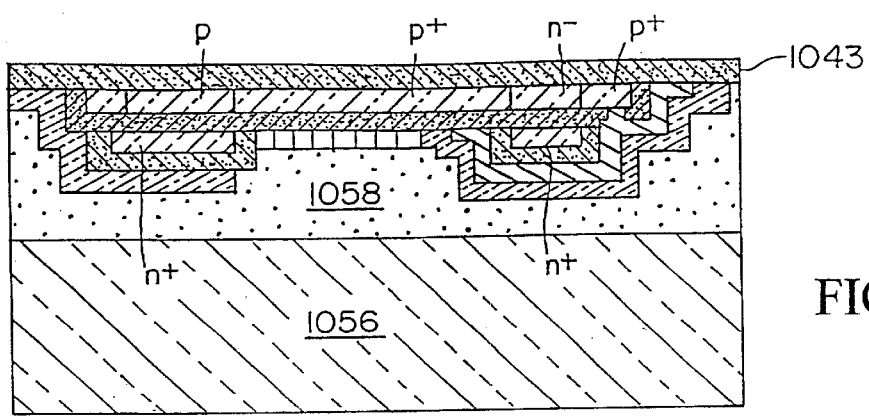

Referring to FIG. 15I, the active matrix structure is then transferred to an optically transmissive substrate 1056 such as glass or plastic. To accomplish this, an epoxy adhesive 1058 is used to attach an optically transmissive substrate 1056 to the active matrix structure. A thin optically transmissive layer (not shown), which can be $SiO_2$, polyimide or sputtered glass, can be formed over each pixel element (not shown) to isolate the color filter array from the epoxy 1058.

The substrate 1041 (and optionally the oxide layer 1043) is removed and the epoxy 1058 is cured by heating the structure at about 160° C. for 24 hours.

Figure 15J:
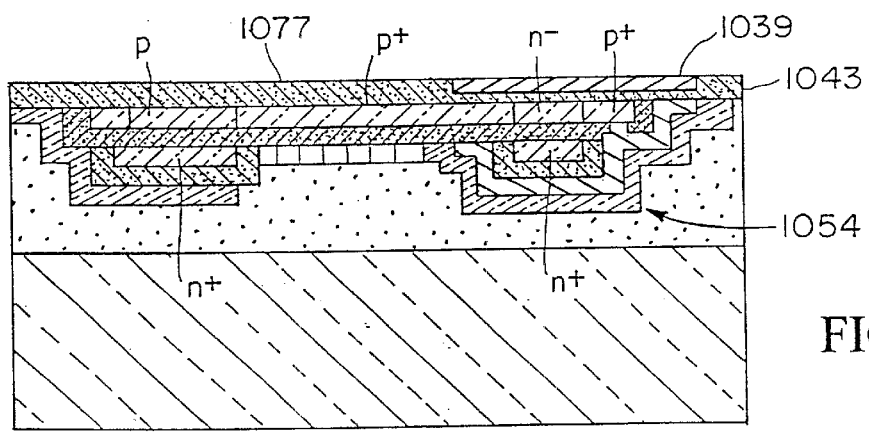

A second light shield 1039 is formed in or on the oxide layer 1043 as shown in FIG. 15J. In one embodiment, a metallization layer is formed on the oxide layer 1043 and patterned to form a light shield adjacent each transistor 1054. In another embodiment, the oxide layer 1043 is thinned adjacent to each transistor 1054. A light shield 1039 is formed in the thinned regions such that a substantially planar surface 1077 is provided adjacent to the liquid crystal material 1079 (FIG. 15K).

Figure 15K:
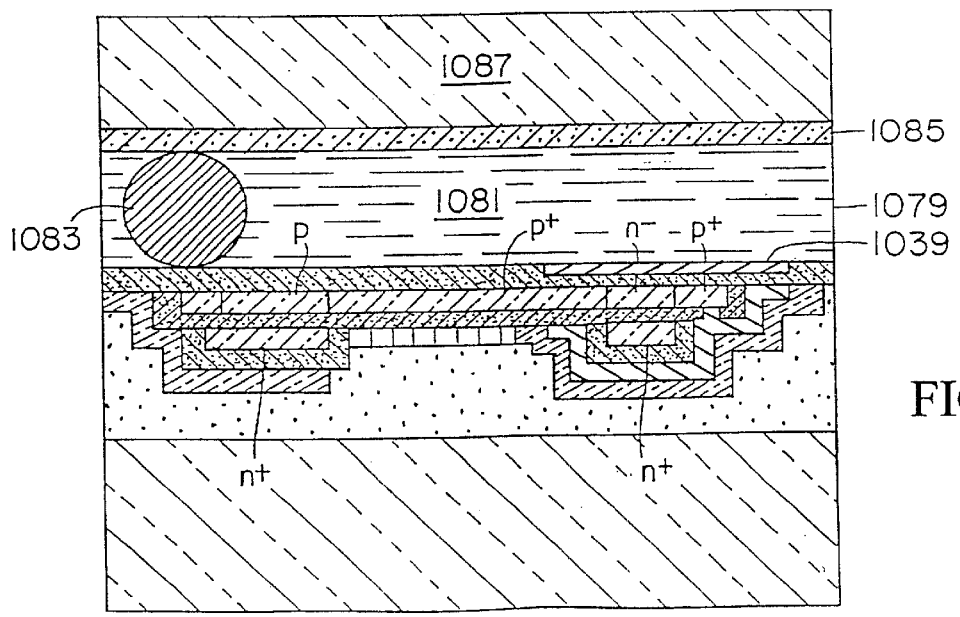

Referring to FIG. 15K, a liquid crystal material 1079 is disposed in a cavity 1081 along with spacers 1083. An ITO layer 1085, which serves as the counterelectrode, is formed adjacent to the cavity 1081. An optically transmissive layer 1087, such as glass or plastic, is positioned over the ITO layer.

Figure 16:
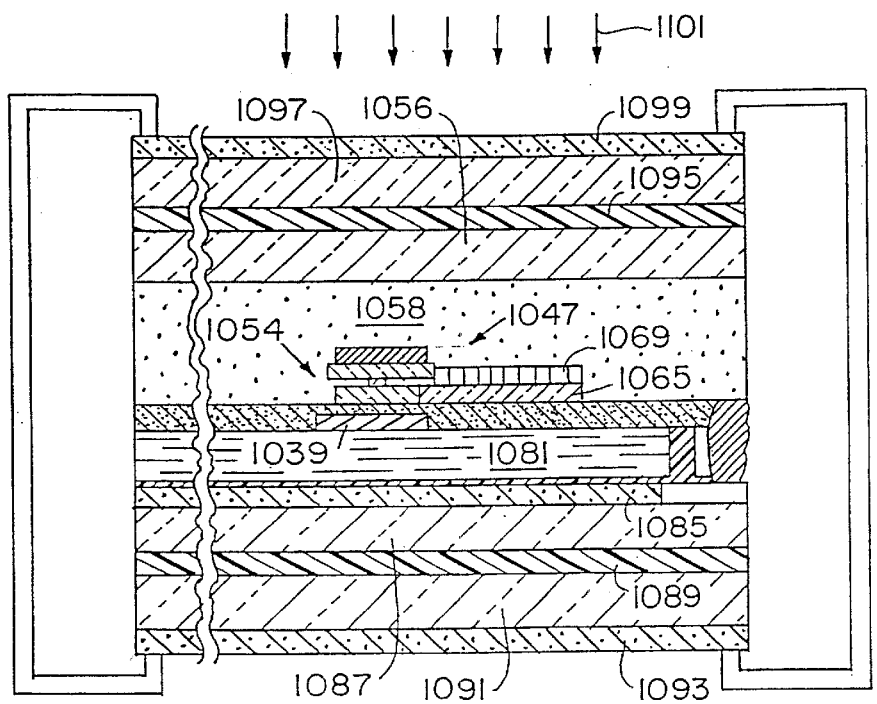
FIG. 16 is a cross-sectional view of the active matrix color display structure fabricated in accordance with FIGS. 15A–15K.

A partial cross-sectional view of the resulting active matrix color display device is shown in FIG. 16. Each pixel electrode 1065 is laterally spaced from the counterelectrode 1085. Each pixel element 1047 will have a transistor 1054, a pixel electrode 1065 and an adjacent color filter element 1069 associated therewith. Polarizing elements 1089, 1095 are positioned on opposite sides of the structure. The display also includes the bonding element or adhesive 1058, an optically transmissive substrate 1056, optically transmissive layers (1087, 1091, 1097) and ITO layers (1093, 1099). The structure is completed by positioning a light source for providing light 1101 adjacent to the ITO layer 1099.

In accordance with the present invention, an array of the color filter elements is formed adjacent to the array of pixel elements prior to transfer and subsequently transferred with the thin film and further processed to form an active matrix transmission display. In one preferred embodiment, a filter fabrication process using negative photoresist materials is employed to form an array of color filter elements.

FIGS. 17A–17H are sectional views illustrating the steps of forming an array of color filter elements in accordance with the this fabrication process.

Figure 17A:
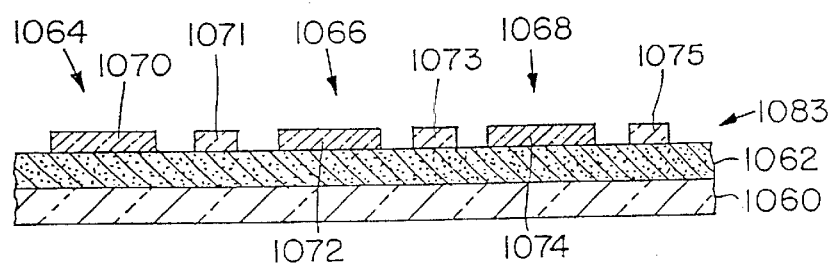
FIGS. 17A–17H is a process flow sequence using negative photoresist materials for fabrication of an array of color filter elements.

Referring to FIG. 17A, an SOI structure includes a substrate 1060 and an oxide 1062 (such as, for example, $SiO_2$) that is grown or deposited on the substrate 1060. A thin single crystal layer 1054 of silicon is formed over the oxide 1062. The film 1063 is patterned into an array of pixel elements 1064, 1066, 1068. Each pixel element includes a pixel electrode region 1070, 1072, 1074 and a transistor region 1071, 1073, 1075 respectively for each pixel element.

Figure 17B:
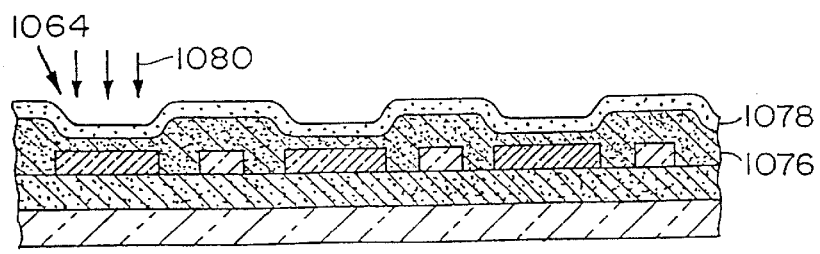
Figure 17C:
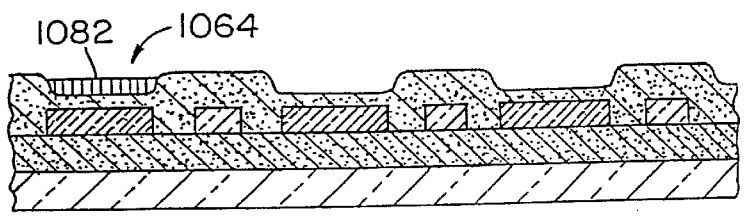

To form a first color filter on each of a first pixel element 1064, a pigment is dispersed in a negative resist material and applied as a film 1078 across an isolation layer 1076 (such as, for example, $SiO_2$) as shown in FIG. 17B. Such colored negative photoresist materials are commercially available. A portion of the film 1078 is exposed to a light 1080. The remainder of the film is masked (not shown) such that it is not exposed to the light 1080. The exposed portion of the film is developed in the presence of the light to form a first color filter element. The undeveloped portion of the film is removed, leaving a pattern of first color filter elements 1082 adjacent to each pixel 1064 (FIG. 17C).

Figure 17D:
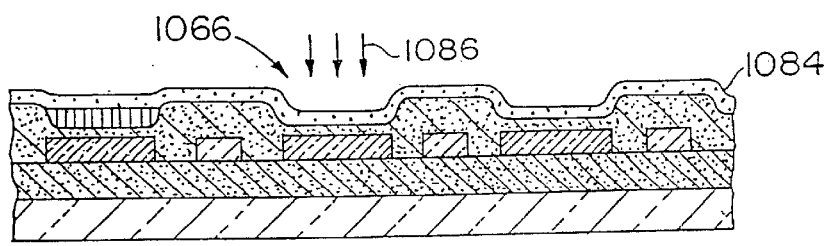
Figure 17E:
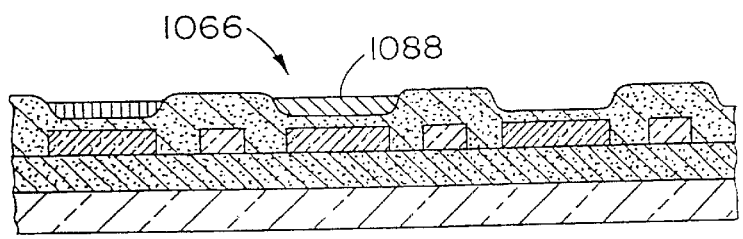

A second color filter element is formed in a similar manner as the first color filter elements 1082. Referring to FIG. 17D, a pigment is dispersed in a negative resist material and applied as a film 1084 across the isolation layer 1076 and the elements 1082. A portion of the film 1084 is exposed to a light 1086, while the remainder of the film is masked (not shown). The exposed portion of the film is developed in the presence of the light to form a second color filter element. The undeveloped portion of the film 1084 is removed, leaving a pattern of second color filter elements 1088 adjacent to each pixel 1066 (FIG. 17E).

Figure 17F:
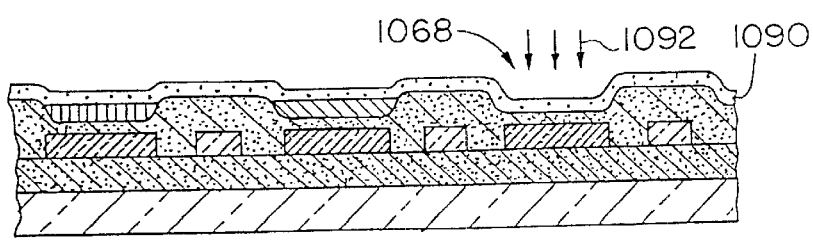
Figure 17G:
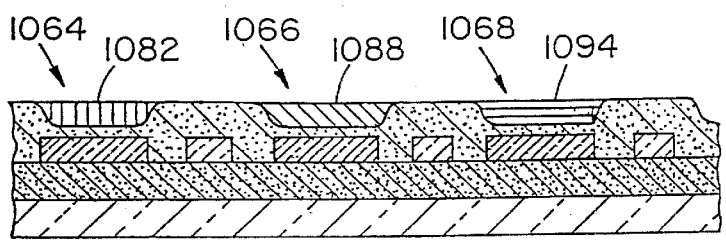
Figure 17H:
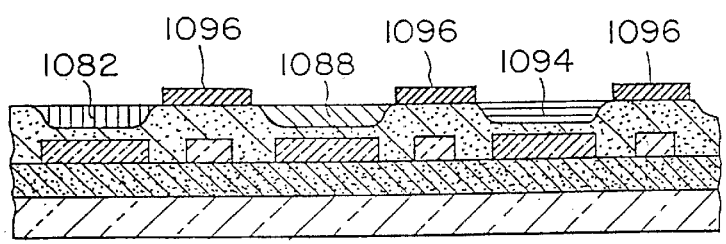

A third color filter element is formed in a similar manner as the first and second color filter elements 1082, 1088. Referring to FIG. 17F, a pigment is dispersed in a negative resist material and applied as a film 1090 across the isolation layer 1076 and the elements 1082, 1088. A portion of the film 1090 is exposed to a light 1092, while the remainder of the film is masked (not shown). The exposed portion of the film 1090 is developed in the presence of the light, and the undeveloped portion of the film 1084 is removed, leaving a pattern of third color filter elements 1094 adjacent to each pixel 1068 (FIG. 17G).

Optionally, a matrix array of opaque (or black) elements 1096 can be formed over or adjacent the transistor region of each pixel element 1064, 1066, 1068 as well as over the interprise spaces. Each opaque element 1096 serves to absorb light and provide a uniform background.

Figure 18A:
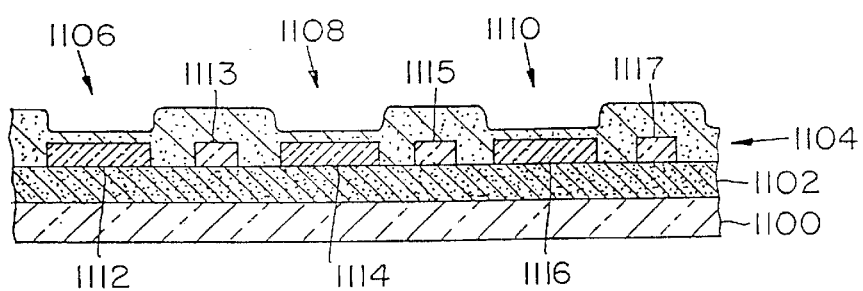
FIGS. 18A–18J is a preferred process flow sequence illustrating in cross-sectional views a photographic development process for fabricating an array of color filter elements.

In other preferred embodiments, a color filter array is formed adjacent to the active matrix circuitry by applying a color photographic development process for each color. FIGS. 18A–18J illustrate in cross-sectional views a photographic development process which uses color-coupler containing developers. Referring to FIG. 18A, an SOI structure includes a substrate 1100 and an oxide 1102 (such as, for example, $SiO_2$) that is grown or deposited on the substrate. A thin single crystal layer 1104 of silicon is formed over the oxide 1102. The film 1104 is patterned into an array of pixel elements 1106, 1108, 1110. Each pixel element includes a pixel electrode region 1112, 1114, 1116 and a transistor region 1113, 1115, 1117 respectively for each pixel element.

Figure 18B:
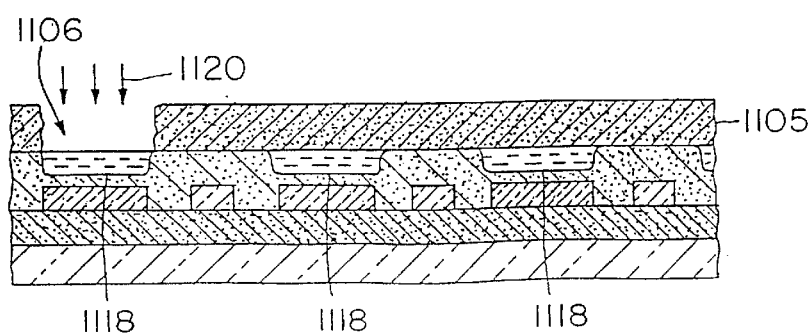
Figure 18C:
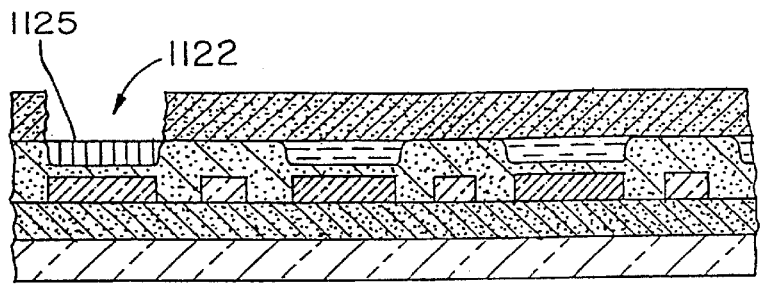
Figure 18D:
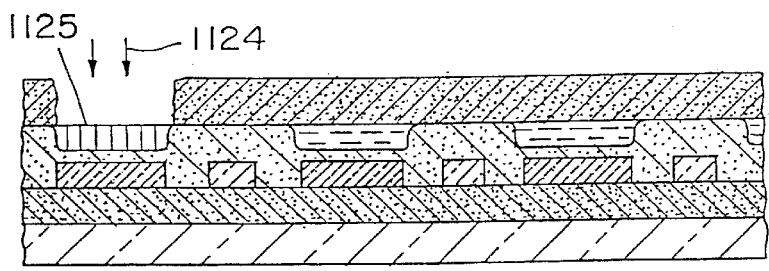

Referring to FIG. 18B, a black and white silver halide emulsion layer 1118 is formed adjacent to each pixel electrode of the active matrix. The formation of color filter elements utilizing a silver halide emulsion can be reviewed in greater detail in U.S. Pat. No. 4,400,454. An isolation layer 1105, such as $SiO_2$, is formed over the active matrix and patterned to expose the portion of the emulsion layer adjacent each first pixel 1106. This portion of the emulsion layer is exposed to light 1120 to provide silver particles. A first developer 1122 containing a color coupler is added to each exposed region 1125 of the emulsion layer (FIG. 18C). As such, a dye of a first color is then formed in each region 1125. Next, the silver is removed by bleaching or rehalogenating 1124 for each region 1125 as shown in FIG. 18D.

Figure 18E:
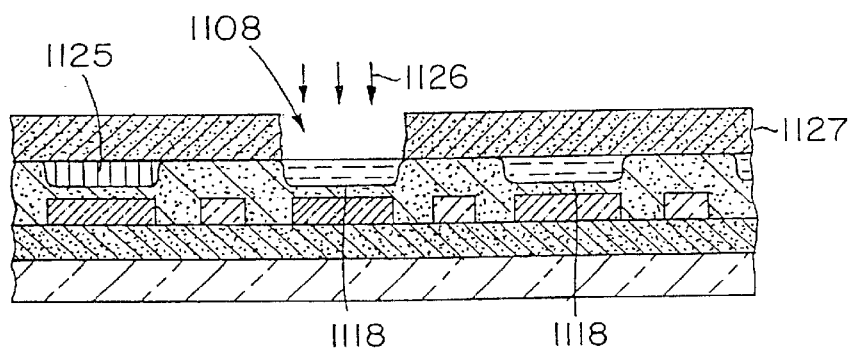
Figure 18F:
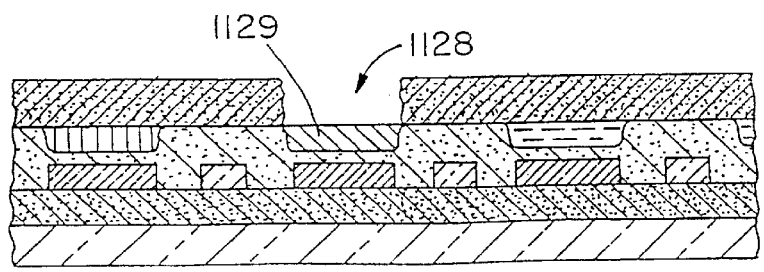
Figure 18G:
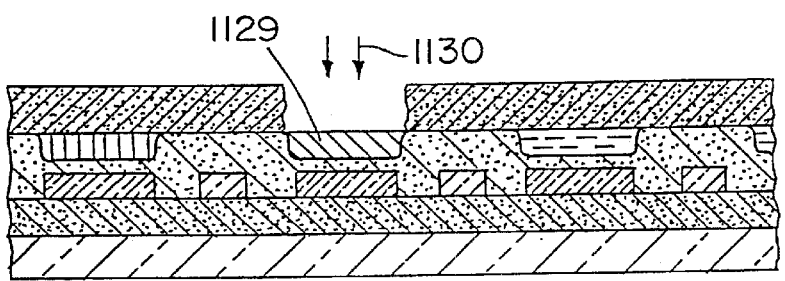

Referring to FIG. 18E, portions of the unexposed silver halide emulsion layer 1118 adjacent to each pixel 1108 are then exposed to light 1126 through a patterned isolation layer 1127 formed over the active matrix. A second developer 1128 containing a color coupler is added to each exposed region 1129 of the emulsion layer to form a dye of a second color in each region 1129 (FIG. 18F). Next, the silver is removed by bleaching or rehalogenating 1130 for each region 1129 as shown in FIG. 18G.

Figure 18H:
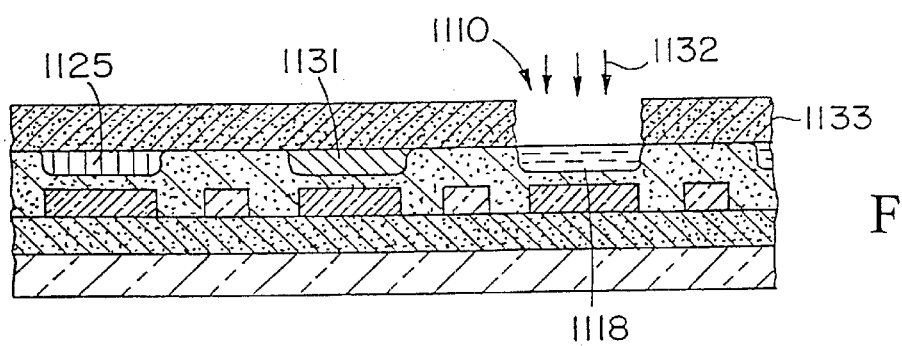
Figure 18I:
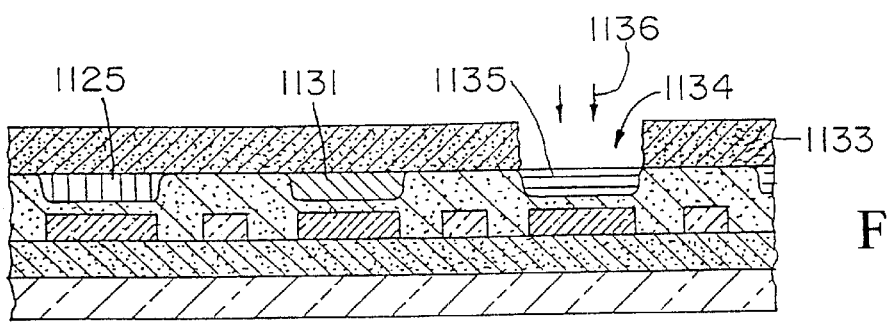
Figure 18J:
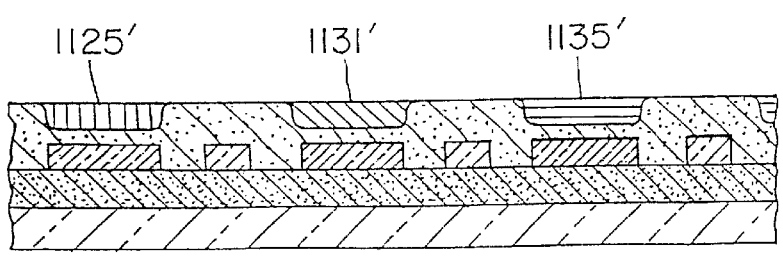

The remaining portions of the unexposed silver halide emulsion layer 1118 adjacent to pixels 1110 are then exposed to light 1132 through a patterned isolation layer 1133 (FIG. 18H). A third developer 1134 containing a color coupler is added to each exposed region 1135 of the emulsion layer to form a dye of a third color in each region 1135 (FIG. 18I). Next, the silver is removed by bleaching or rehalogenating 1130 for each region 1135. The layer 1133 is removed and any silver halide remaining in the emulsion layer is removed by fixing. As shown in FIG. 18J, an array of color filter elements 1125', 1131', 1135' are thus formed adjacent to each pixel.

Alternatively, a color filter array can be formed by applying a color photographic development process which uses developers containing dye developers. To accomplish this, the above-described process is performed using developers containing dye developers instead of developers containing color couplers. After processing such as that described in FIGS. 14–16, the thin film with the formed color filter elements can than be transferred, if necessary, for further processing prior to final display fabrication.

Figure 19A:
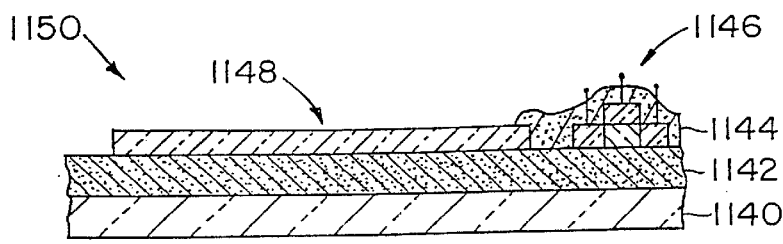
FIGS. 19A–19D is another preferred process flow sequence illustrating the fabrication of a transmissive active matrix color display.

FIGS. 19A–19D illustrate another preferred fabrication process for forming an active matrix color display. Referring to FIG. 19A, an SOI structure includes a substrate 1140 and an oxide 1142 (such as, for example, $SiO_2$) that is grown or deposited on the substrate 1140. A thin single crystal layer 1144 of silicon is formed over the oxide 1140 using any of the aforementioned fabrication techniques. For the case of ISE SOI structures, which were described previously, the top layer is a essentially single-crystal recrystallized silicon, from which CMOS circuits can be fabricated. The silicon thin film 1144 is patterned to define an array of pixel elements 1150. Each pixel element includes a pixel electrode region 1148 and a transistor 1146, formed in accordance with any number of fabrication techniques, including those previously described herein.

Figure 19B:
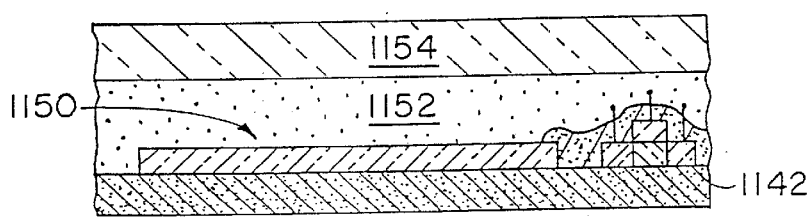

Referring to FIG. 19B, the active matrix structure is then transferred to an optically transmissive substrate 1154. To that end, an epoxy 1152 is used to attach an optically transmissive substrate 1154 to the active matrix. The substrate 1140 (and optionally the oxide layer 1142) is removed, and the epoxy 1152 is cured by heating the structure at about 160° C. for 24 hours.

Figure 19C:
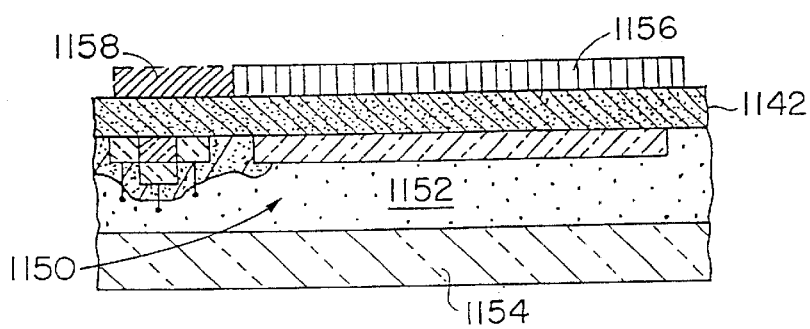

An array of color filter elements 1156 is formed on the oxide layer 1142 adjacent to planar surface of the thin film 1144 (FIG. 19C). Each color filter element 1156 is correlated with a pixel element 1150. The color filter elements 1156 are formed by processing, in accordance with the aforementioned processing techniques, an emulsion or photoresist carrier. The individual color filter elements can be processed to provide a display having a triad pixel arrangement of three primary (or non-primary) color filter elements. Alternatively, the color filter elements can be arranged into groups of four pixel elements. As noted previously, a primary color is defined herein to correspond to one of a group of colors which can be used to provide a spectrum of colors. An opaque (or black) element 1158 can also be formed adjacent to the thin film. Each opaque element 1158 is correlated with a pixel element 1150 and serves to prevent incident light from impinging upon the transistor 1146 associated with the pixel element.

Figure 19D:
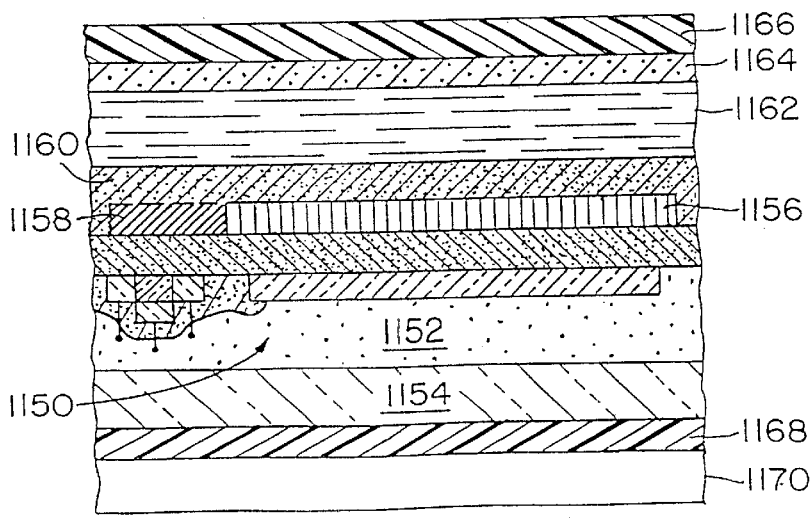

A cross-sectional view of another active matrix display is shown in FIG. 19D. A liquid crystal material 1162 is positioned in close proximity to the pixel elements 1150. An insulating layer 1160, which can be $SiO_2$, polyamide or sputtered glass, is formed over each pixel element for passivating the pixel elements from the liquid crystal material 1162. A counterelectrode 1164 is laterally spaced from the pixel electrodes 1148. Each pixel element 1150 has a transistor 1146, a pixel electrode 1148 and an adjacent color filter element 1156 associated therewith. Polarizing elements 1164, 1168 are positioned on opposite sides of the structure. The structure is completed by positioning a back light source 1170 adjacent to the polarizing element 1168.

Figure 20:
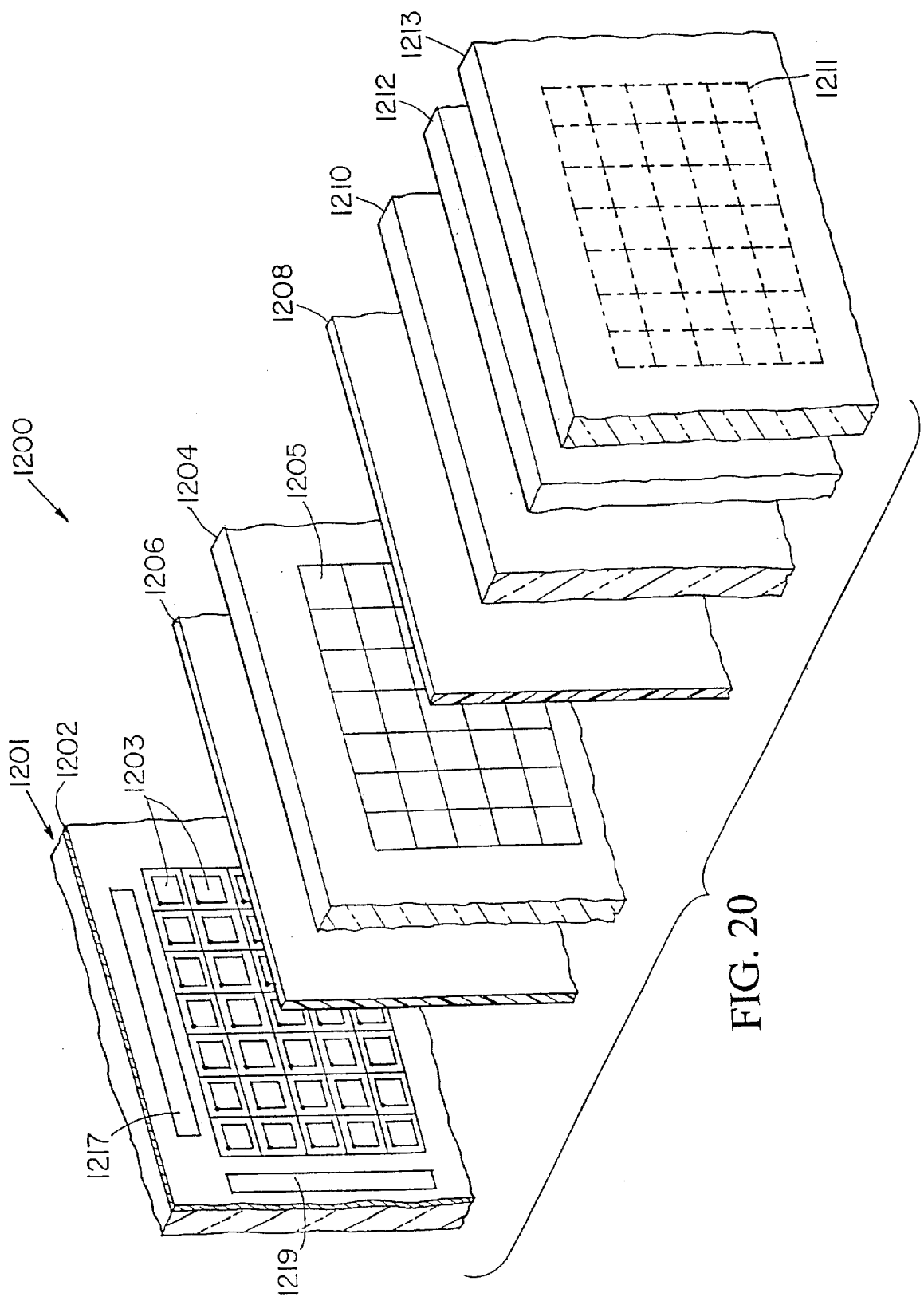
FIG. 20 is an explode perspective view of an electroluminescent color display in accordance with the present invention.

Other preferred embodiments employ an emissive material (an electroluminescent film, light emitting diodes, porous silicon or any other light emitting material) in combination with a color filter array to form an emissive active matrix color display. To that end, an electroluminescent (EL) color display is shown in FIG. 20. The EL display 1200 is a layered structure which includes an active matrix circuit panel 1201, a bottom insulator 1206, an EL structure 1204, a top insulator 1208, an optically transmissive electrode 1210, a color filter array 1212 and an optically transparent superstrate 1213.

The EL structure is positioned between the two insulating layers 1206, 1208 for preventing destructive electrical breakdown by capacitively limiting direct current flow through the EL structure and for enhancing reliability. The insulators have a high electrical breakdown so that they can remain useful at high fields which are required to create hot electrons in the EL phosphor layers. The capacitive structure is completed by a pair of electrodes. One of these electrodes is pixel electrodes formed on the active matrix 1201 and the other electrode is the optically transmissive electrode 1210.

The EL structure 1204 is formed of a single phosphor layer which produces a white (or other multi-line spectrum) light in the presence of an applied field. The layer is patterned to provide an array of individual phosphor elements 1205. Each EL element 1205 is associated with a pixel element 1203. The color filter array 1212 is located in close proximity to the EL structure 1204 such that each color filter element 1211 is associated with an EL element 1205 and a pixel element 1203. The individual elements 1211 of color filter array can be arranged in a triad arrangement of three primary (or non-primary) color filter elements such as red, green and blue or yellow, cyan and magenta. Alternatively, the color filter elements can be arranged into groups of four different color filter elements such as red, green, blue and white or yellow, cyan, magenta and black/white.

The pixel elements 1203 of the active matrix 1201 are individually actuated by a CMOS/DMOS drive circuit, described previously herein or in a related application previously incorporated by reference, having first 1217 and second 1219 circuit components that are positioned adjacent the pixel array such that each pixel element can produce an electric field in an associated element 1205 of the EL structure 1204 between the pixel electrode and the transparent electrode 1210. The electric field causes the EL element 1205 to emit white light or other multi-line spectrum light. The light passes through the associated color filter element 1211 to produce a colored light which is illuminated from the display through the optically transmissive electrode 1210.

The active matrix pixel array employs transistors (TFTs) colocated with each pixel in the display to control the function of the pixel. As applied to EL displays, the active matrix approach offers significant advantages including reduced power dissipation in the circuit panel and increased frequency in which the AC resonant driver can operate. The formation of a useful EL active matrix requires TFTs that can operate at high voltages and high speeds. Single crystal silicon is preferred for achieving high resolution in a small (6 in×6 in or less) active matrix EL display.

In an EL display, one or more pixels are energized by alternating current (AC) which is provided to each pixel by row and column interconnects connected to the drive circuitry. The efficient conduction of AC by the interconnects is limited by parasitic capacitance. The use of an active matrix, however, provides a large reduction of the interconnect capacitance and can enable the use of high frequency AC to obtain more efficient electroluminescence in the pixel phosphor and increased brightness. In accordance with the present invention, the TFTs that provide this advantage are formed in a single crystal wafer, such as bulk Si wafers, or thin films or layers of single crystal or essentially single crystal silicon in accordance with the previously described fabrication techniques. These high quality TFTs are employed in an EL panel display, providing high speed and low leakage as well as supporting the high voltage levels needed for electroluminescence.

In preferred embodiments, single crystal silicon formed on an insulator (SOI) is processed to permit the formation of high voltage circuitry necessary to drive the EL display. More specifically, thin film single crystal silicon formed by the ISE process, or any of the other fabrication processes described herein, allows for fabrication of high voltage DMOS circuitry for the TFTs as well as low voltage CMOS circuitry for the drivers and other logic elements.

Figure 21A:
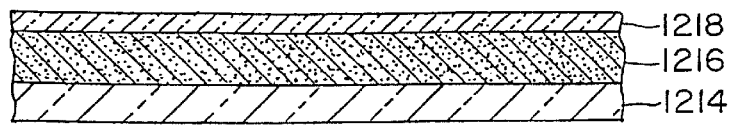
FIGS. 21A–21E is a preferred process flow sequence illustrating the fabrication of an electroluminescent active matrix color display.

A preferred fabrication sequence for the formation of an EL color display is shown in FIGS. 21A–21E. Referring to FIG. 21A, an SOI structure includes a substrate 1214 and an oxide 1216 (such as, for example, $SiO_2$) that is grown or deposited on the substrate 1214. A thin single crystal layer 1218 of silicon is formed over the oxide 1214. For the case of ISE SOI structures, the top layer is a substantially single-crystal recrystallized silicon, from which CMOS and DMOS circuits can be fabricated. The use of a buried insulator provides devices having better isolation than can be obtained in conventional bulk (Czochralski) material. However, it is noted that any number of techniques can be employed to provide a thin-film of single crystal silicon for an EL color display.

Figure 21B:
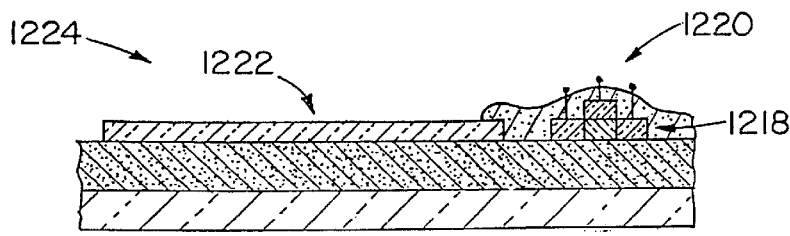
Figure 21C:
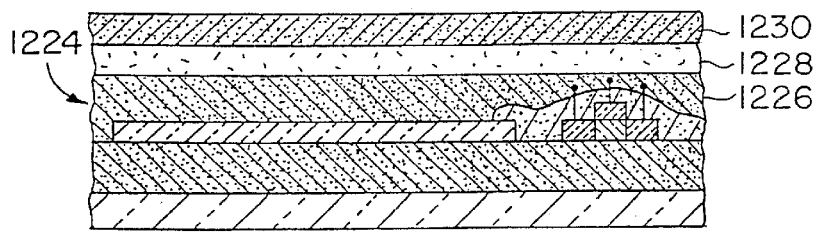

As shown in FIG. 21B, the film 1218 is patterned to define a pixel electrode region and a transistor region for each pixel element 1224. In one embodiment, the pixel electrode 1222 is formed of single crystal silicon. In another embodiment, the silicon is removed and ITO is applied and patterned to form the pixel electrode 1222. A transistor 1218 is then formed in accordance with any number of fabrication techniques, including those previously described herein. Next, the EL structure is formed (FIG. 21C). To that end, a thin layer 1226 of insulating material is deposited and patterned over each pixel element 1224. A white phosphor layer 1228 is deposited and patterned over the bottom insulator 1226, and a top insulator 1230 is deposited and patterned over the phosphor material.

Figure 21D:
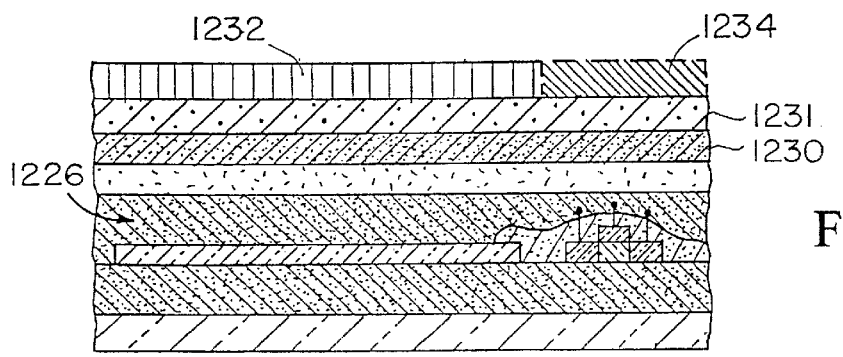
Figure 21E:
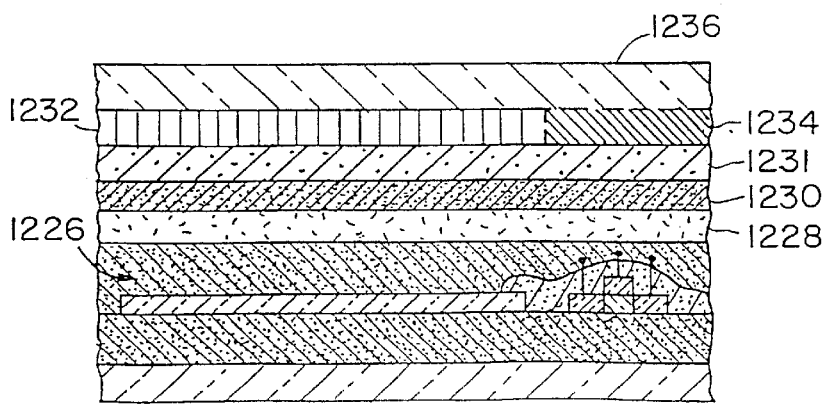

Referring to FIG. 21D, a top electrode 1231 is formed on the EL structure. Next, a color filter element 1232 is formed. Each color filter element 1232 is correlated with a phosphor element 1228 and a pixel element 1224 such that each pixel is capable of producing light of a primary color. As explained previously, the color filter elements are formed by processing an emulsion or a photoresist carrier. The individual color filter elements 1232 can be processed to provide a triad arrangement of primary color pixels such as blue, green and red or yellow, cyan and magenta. In another embodiment, the color filter elements can be processed to provide a triad (or quad) arrangement of non-primary color pixels. In yet another embodiment, the color filter elements can be arranged into groups of four pixel elements. An opaque element 1234 can also be formed adjacent to the EL material. Each opaque element 1234 is correlated with a pixel element 1224 and absorbs light for preventing incident light from impinging upon the transistor 1220 associated with the pixel element. A optically transmissive superstrate 1236 such as glass or plastic is formed over the EL structure to complete the EL color display (FIG. 21E).

Figure 22A:
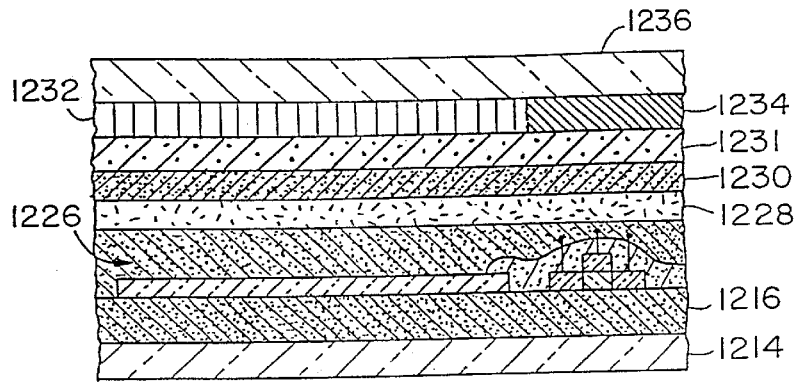
FIGS. 22A–22C is a preferred process flow sequence illustrating the transfer of an electroluminescent active matrix color display to an optically transmissive substrate.
Figure 22B:
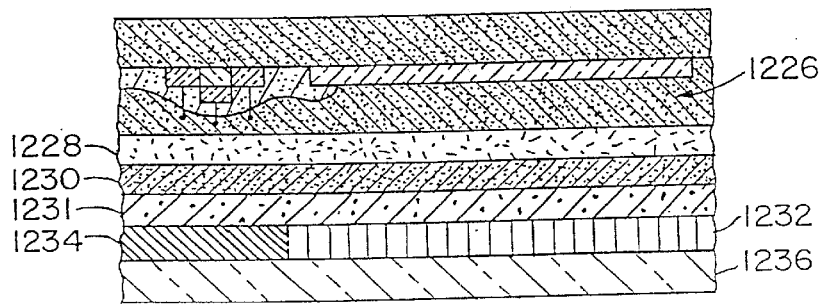
Figure 22C:
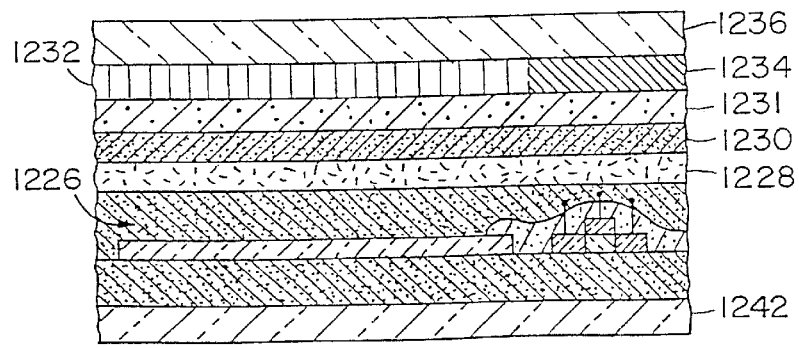

In another embodiment, the EL color display can be transferred to an optically transmissive substrate as illustrated in FIGS. 22A–22C. An EL display fabricated in accordance with any of the previously described methods is shown in FIG. 22A. The structure is inverted and the initial substrate 1214 is removed (FIG. 22B). The structure is then transferred to an optically transmissive substrate 1242, such as glass or a curved surface of a visor, and the superstrate 1236 is optionally removed.

Another feature of the active matrix displays of the present invention is that an array of pixel electrode elements can be patterned in the single crystal silicon material. In one preferred embodiment, the individual pixel electrode elements are solid shaped elements formed of single crystal silicon or indium tin oxide (ITO). In another embodiment, the pixel electrodes can be selectively thinned to optimize transistor performance. Regions of the electrode can be thinned to about one-tenth the thickness of the 0.1 to 2.0 micron single crystal silicon layer.

In yet another embodiment, the silicon material is patterned to form an array of pixel electrodes and each electrode is further patterned into a grid, serpentine, or other suitable geometry to reduce transmission loss through the pixel electrode. This provides an aperture through each pixel electrode that improves transmission of light by reducing interference effects and also reducing reflection, absorption and scattering caused by the pixel material. One advantage of the grid-shaped pixels is the increased light transmission through the active matrix which results in brighter displayed images. Another advantage is that the grid-shaped pixels minimize thickness variations in the single crystal silicon layer. These thickness variations cause light absorption or interference which reduces the light transmission through the active matrix. By minimizing thickness variations, brighter displayed images can be provided. An alternative embodiment includes further thinning of the pixel electrode material so the switching circuits are within a thicker film than the pixel electrode.

FIGS. 23A–23D illustrate external feature of a slide projector mountable light valve display housing 100 according to a preferred embodiment of the invention. The housing 100 is adapted to be mounted to a commercially available slide projector. Commercially available slide projectors are available from Vivatar, Kodak, Agfa, and other manufacturers. A particular preferred embodiment of the invention will be described in relation to a Kodak carousel slide projector. It being understood that other slide projectors can be used with minor structural changes to the housing 100.

Figure 23A:
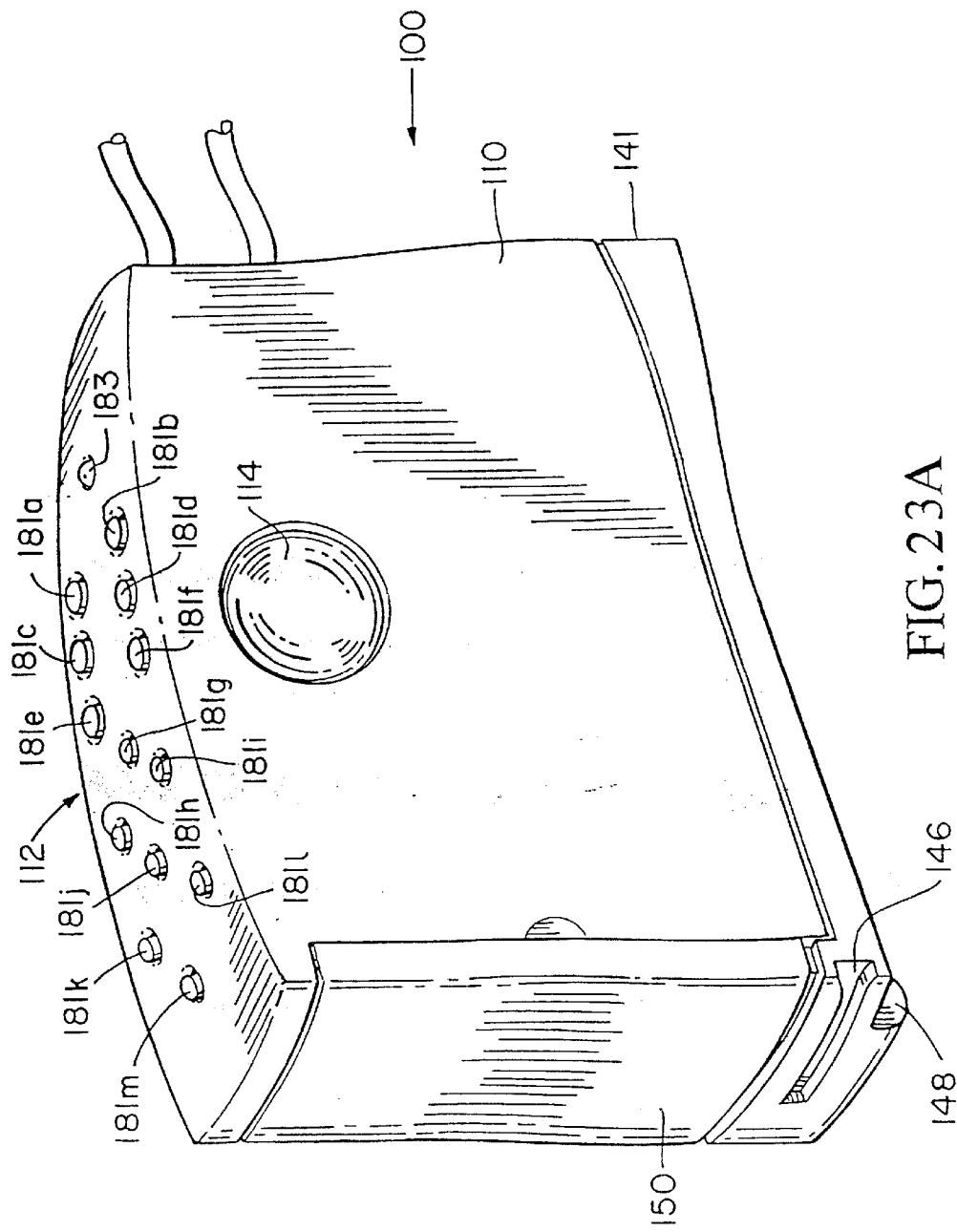
FIGS. 23A–23D illustrate a preferred embodiment of the light valve housing with the light valve assembly retracted.

FIG. 23A is a right-side perspective view of a preferred embodiment of a slide projector mountable light valve display housing 100. Illustrated is the housing body 110, a top control panel 112, a base 141, and a manual release access door 150. An infrared receiving element 114 is visible on the housing body 110. The control panel 112 contains a plurality of raised buttons 181 and a power indicator 183, such as an LED. The housing base 141 contains a frame tab channel 146 and a mounting lip 148. The housing 100 is ergonomically designed for an average human hand.

Figure 23C:
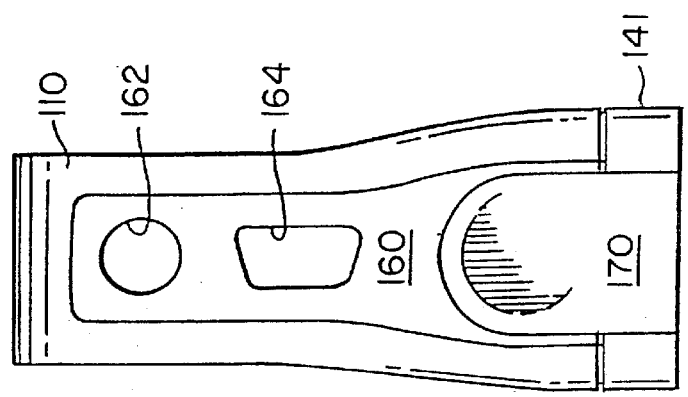
Figure 23B:
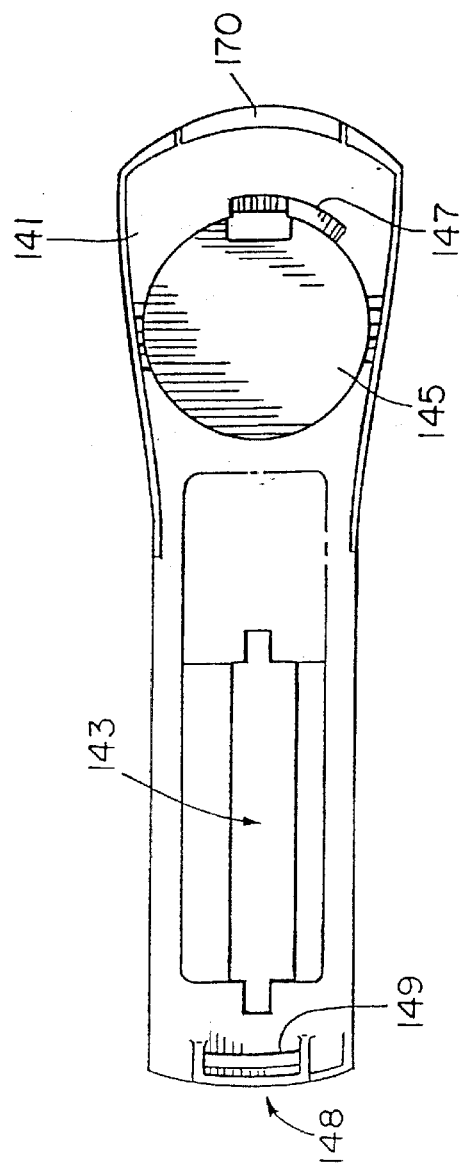

FIG. 23B illustrates a bottom plan view of the housing 100. A spindle mount 145 registers to the center hub of a slide projector. After the spindle mount 145 is mounted on the center hub, the housing 100 is rotated into position on the slide projector. A spindle tab cutout 147 and clip 146 are adjacent to the spindle mount 145 and registers to a spindle tab on the projector spindle. Once the housing 100 has been rotated into position, the mounting lip 148 registers to the slide projector housing. The mounting lip 148 also contains a mounting slot 149, which registers to a remote control unit (discussed below). Also shown is an opening to a slide channel 143 through which a light valve assembly extends and retracts. The clip secures the housing to the center hub, once the housing 100 has been rotated into position. A remote control release 170 registers to the remote control unit. The clip 146 acts as a spring acting against the remote control release 170.

FIG. 23C is a rear view of the housing 100. Registered to the housing body 110 is an external interface plate 160 and the remote control release 170. The external interface plate 160 contains a power connector cutout 162 and a video signal connector cutout 164.

Figure 23D:
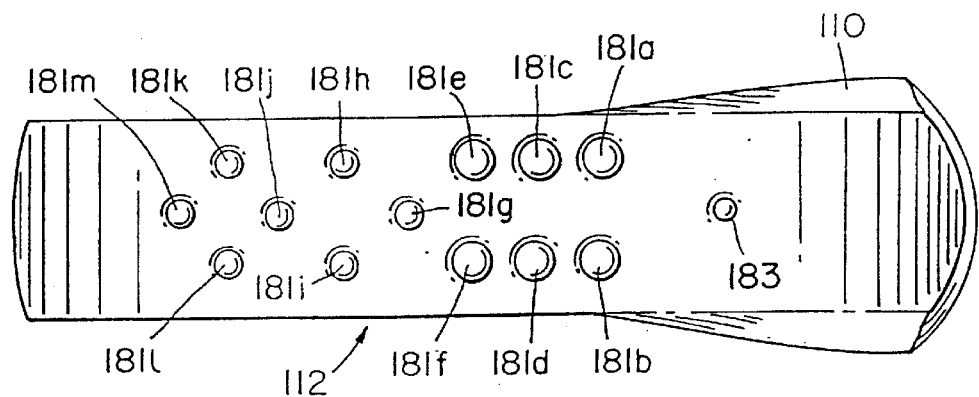

FIG. 23D is a top plan view of the housing 100. Shown are the elevated control buttons 181 and the power indicator 183. The control buttons allow the user to control brightness 181a, 181b, contrast 181c, 181d, and tuning 181e, 181f (i.e., pixel centering). A graphics/text button 181g allows the user to switch between graphics and text displays on an MS-DOS computer. Frame buttons 181j, . . . , 181m allow the user to shift the display up, left, right and down, respectively, by whole pixel increments. A save button 181h saves the current setting for the current video mode. A reset button 181i returns the settings to factory default settings. Details of the control button function are discussed in the U.S. patent application Ser. No. 08/106,416, entitled "Control System For Display Panels" by Matthew Zavracky et al. and filed on Aug. 13, 1993, incorporated herein by reference. Each control panel button 181 is formed from a rubberized button insert (not shown), which is registered to a control panel contact pad insert (not shown).

FIG. 24A is a front plan view of the housing 100 with a light valve assembly 200 in the extended position. Located behind the access door 150 is a handle slot 105 (shown in phantom). A slide handle 220 (shown in phantom) extends through the handle slot 105 and moves relative to the handle slot 105 as the light valve assembly 200 is moved within the housing 100.

FIG. 24B is a right-side plan view of the housing 100 with the light valve assembly 200 in the extended position.

Figure 25:
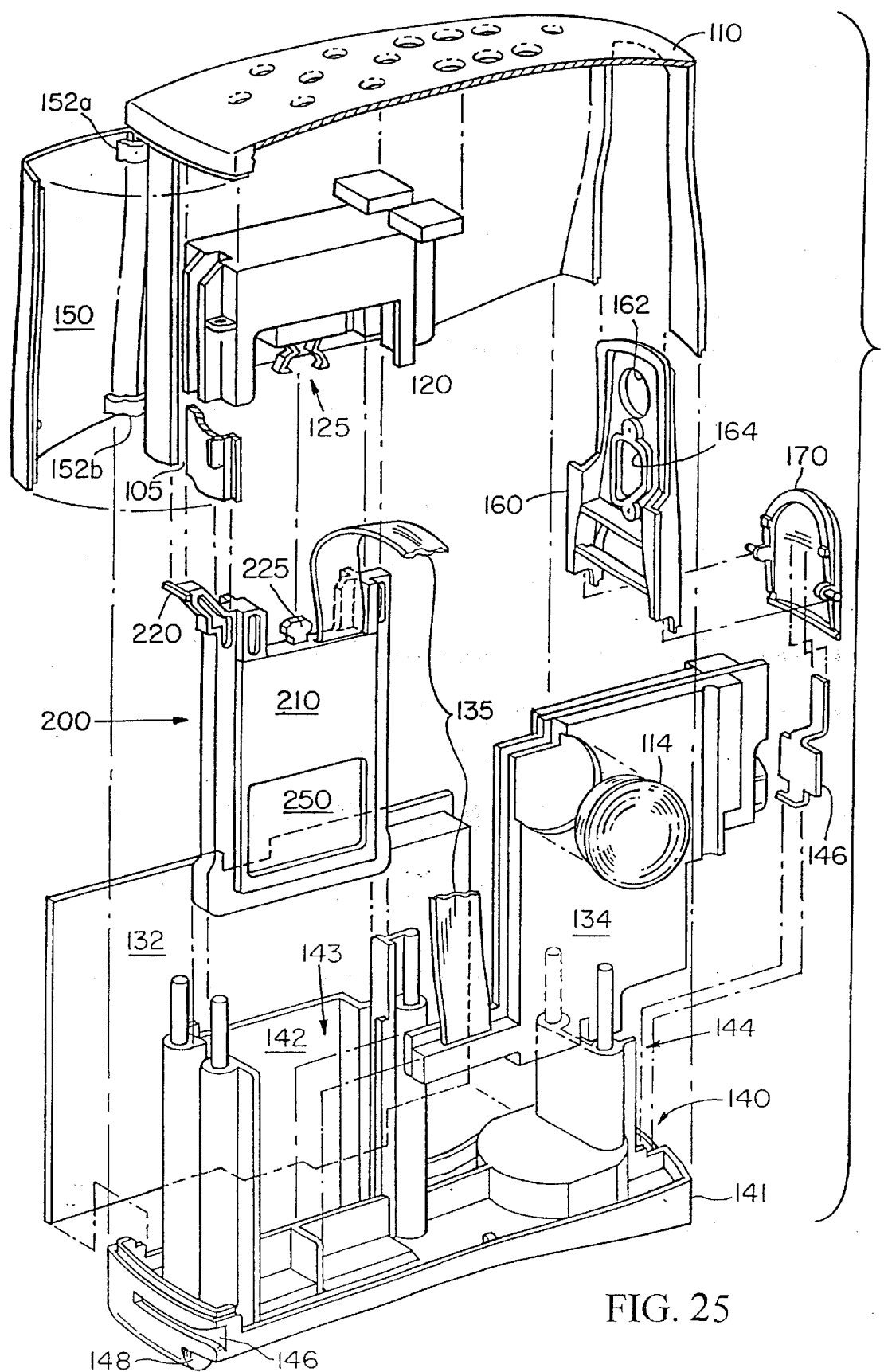
FIG. 25 is an exploded view of a preferred embodiment of a display unit.

FIG. 25 is an exploded view of a preferred display unit. A housing base 140 contains much of the structural elements of the housing 100. In particular, a front superstructure 142 includes a slide channel 143 for the light valve assembly 200 and provides structural support for the front of the housing 100. In addition, a rear superstructure 144 is mounted to the topside of the spindle mount 145 to provide structural support for the rear of the housing 100.

The light valve assembly 200 moves freely through the slide channel 143. A latch holder 120 registers to the slide channel 143. The latch holder 120 includes a latch mechanism 125. The latch mechanism 125 meets with a latch tab 225 of a light valve assembly frame 210. When the light valve assembly 200 is fully retracted into the housing 100, the latch mechanism 125 secures the latch tab 225 so the light valve assembly 200 is fixed to the housing in the retracted position. The latch mechanism 125 is of a type that releases the latch tab 225 when an upward pressure is placed on the light valve assembly 200. After being released, the light valve assembly 200 descends through the slide channel 143. Preferably, the light valve assembly 200 is gravity fed.

During operation, it is possible that the light valve assembly 200 may jam while extended into the projection chamber 16. For that reason, the slide handle 220 can be accessed through the manual release access door 150, which is mounted to the housing body 110 by hinges 152a, 152b. By using the slide handle 220, a user can manually raise or lower the light valve assembly 200.

A light valve display panel 250 is coupled to video control circuitry 132, 134. As illustrated in FIG. 25, the video control circuitry is provided by a digital circuit board 132 and analog circuit board 134. In particular, the analog circuit board 134 is a daughter board connected to the digital circuit board 132. These circuit boards 132, 134 are adapted to fit within the housing 100. The analog circuit board 134 receives power from an external power source and analog video signals from an external video source through power cutout 162 and video connector cutout 164, respectively. Preferably, the video source is a computer that generates video images, but the video source can generate a composite video signal or an S-video signal. There can be multiple video connections for various video input signals. The analog circuit board 134 also receives user control signals from the control panel 12 and the remote control unit 300. The digital circuit board 132 performs digital processing of the video signal. The drive signals for the light valves are provided by the analog circuit board 134 over a ribbon cable 135.

Figure 26A:
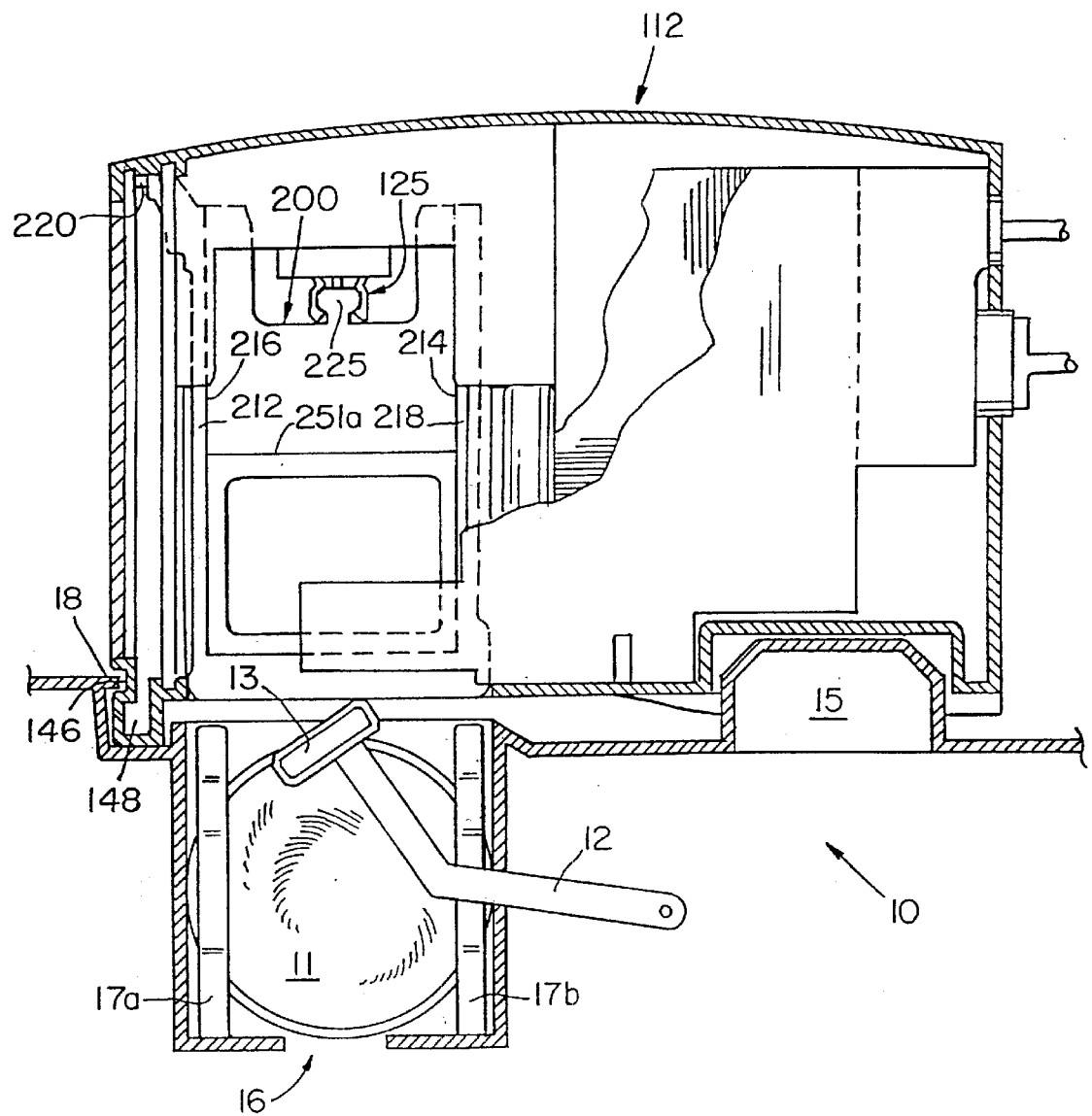
FIGS. 26A–26B are sectional views of a preferred light valve display unit mounted on a standard slide projector.

FIG. 26A illustrates the housing 100 properly aligned in the locked position with the light valve display panel assembly 200 aligned directly above a projection chamber 416 of a projector 410. Once positioned and locked, the light valve slide assembly 200 is ready to be lowered into the projection chamber 416. By advancing the slide projector, an ejector arm 412 is raised such that a slide bumper 415 contacts the light valve 200. The upward motion of the ejector arm 412 urges the light valve assembly 200 vertically upward causing the latch mechanism 125 to disengage latch tab 225. After being released from the latch mechanism 125, the light valve assembly 200 is supported by the slide bumper 413. The ejector arm 12 then continues to cycle downward to lower the light valve assembly 200 into the projection chamber 416. The light valve assembly 200 is secured by spring clips 417 in the projection chamber 416. Because of friction between the light valve assembly 200 and the slide channel 143, the light valve assembly may drop into the projection chamber 416 after the ejector arm 412 has finished the ejection cycle. On the next ejection cycle, the light valve assembly 200 will be forced upward by the ejector arm 412 to be secured by the latch mechanism 125.

Figure 26B:
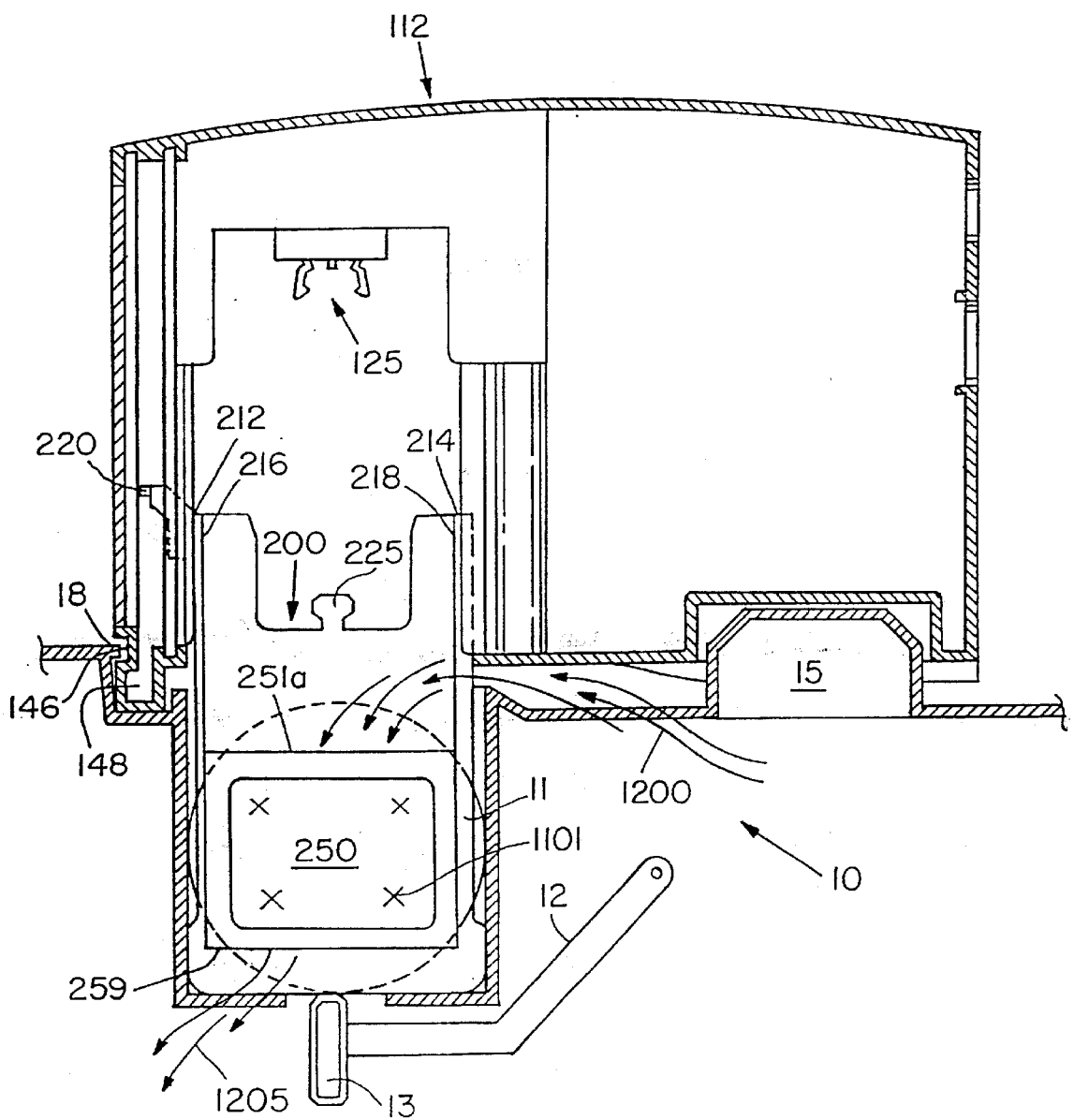

FIG. 26B illustrates the light valve assembly 200 positioned and retained in the projection chamber 416 of a slide projector 10, such that light 1101 from a light source (not shown) passes through the light valve 250 and is projected onto a viewing surface by a projection lens 411. While the light valve slide assembly 200 is positioned in the projection chamber 416, the light valve and associated circuitry are exposed to heat from the projector light source. Adequate ventilation must be provided to reduce the exposure of the light valve to excessive heat.

Ventilation is preferably provided through the underside of the housing 100. Cool air 1200 is drawn into the projection chamber 416 by a circulating fan (not shown) of the slide projector. The cool air 1200 is drawn through a ventilation channel 259 of the light valve slide assembly 200. Warm exhaust air 1205 exits the ventilation channel 259 and is expelled by the projector circulating fan. The physical characteristics of the ventilation channel 259 will be discussed in more detail below.

Figure 27A:
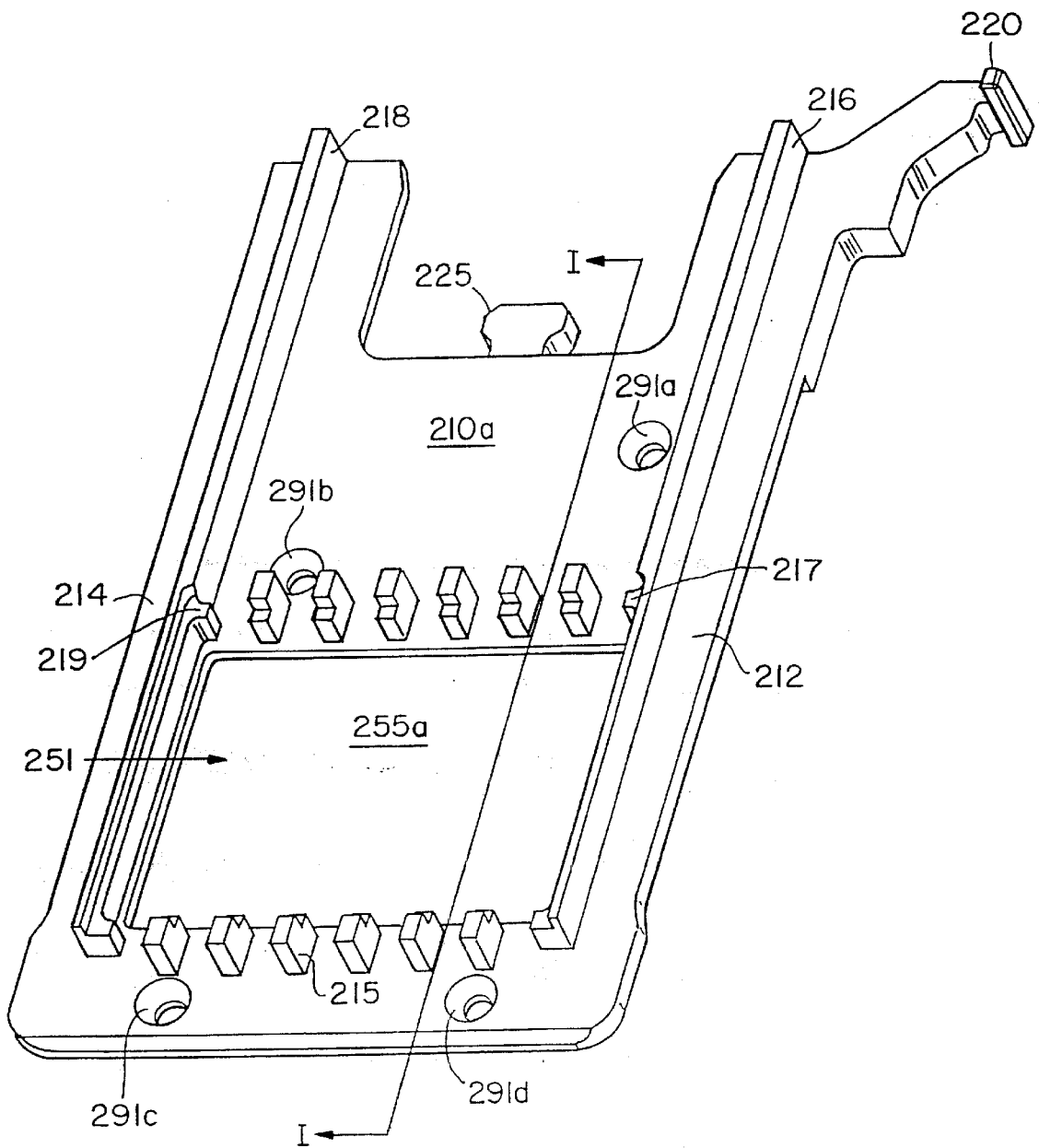
FIGS. 27A–27C are perspective views of the light valve frame 210 of FIG. 25.
Figure 27B:
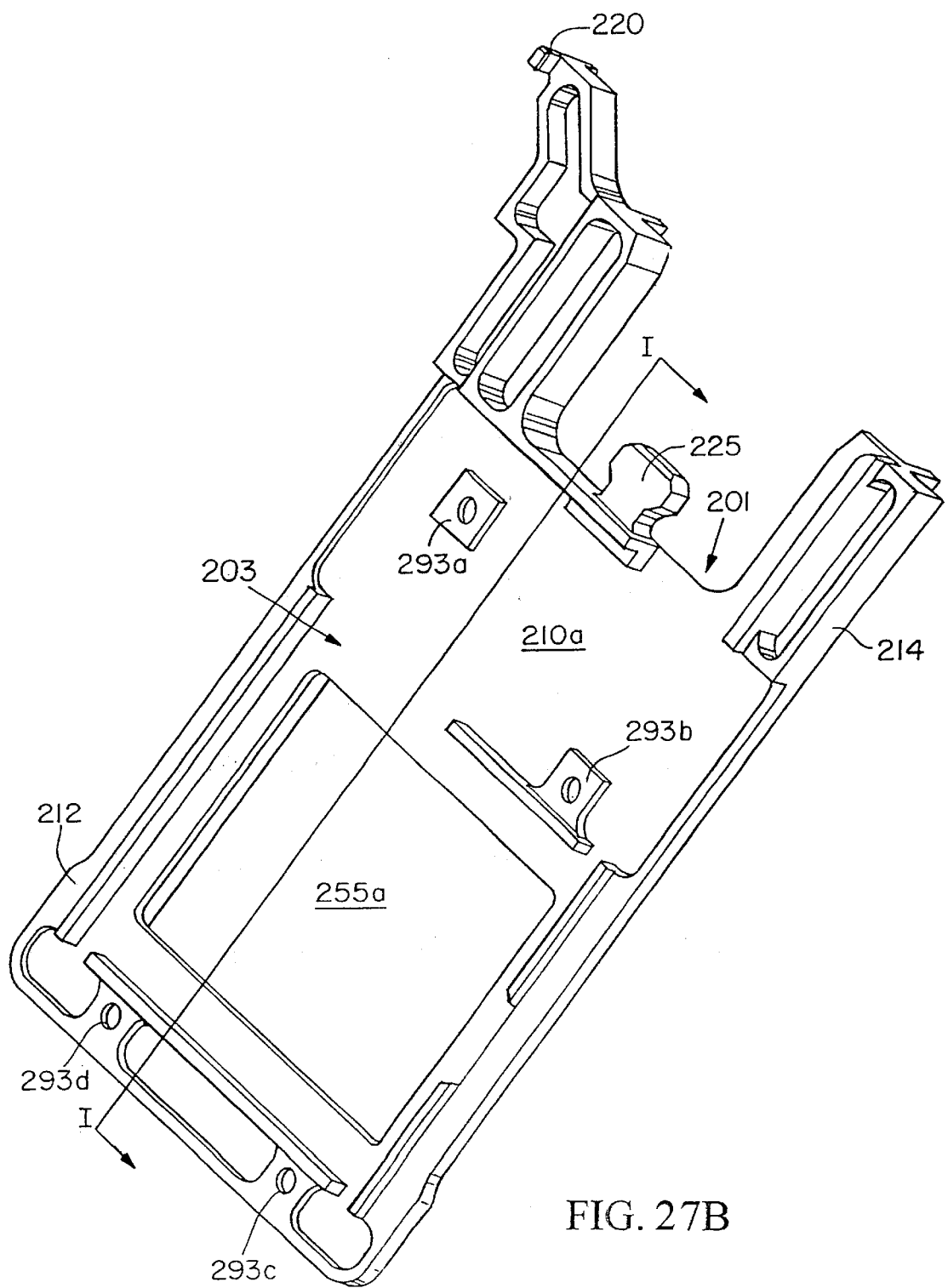
Figure 27C:
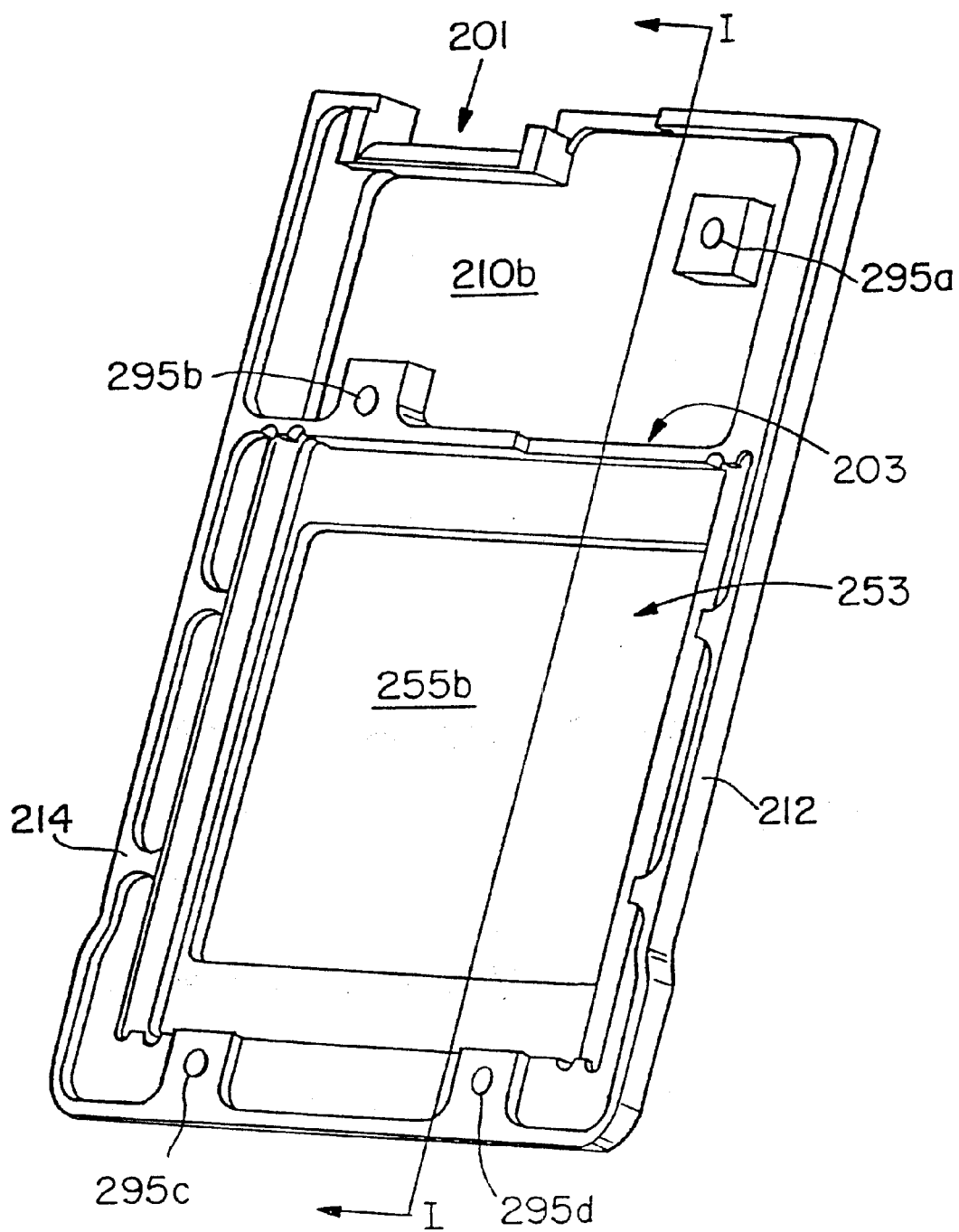

Critical features of the construction of the light valve assembly 200 are illustrated in FIGS. 27A–27C, which are perspective views of the light valve slide frame 210 of FIG. 25. The assembly frame 210 comprises two main structural features. The main structural element is the display holder 210 a shown in FIGS. 27A–27B. The second main structural element is the display cover 210b, which is illustrated in FIG. 17C. As will be described in detail below, the display holder 210a and the display cover 210b are sandwiched together with a light valve display panel 250 disposed between the two elements.

FIG. 27A is a perspective view of the light-source side of the display holder 210a. Illustrated are a front rail 212 and a rear rail 214. The rails 212, 214 register to corresponding rail slots in the slide channel 143. The rails 212, 214 and the rail slots cooperate to allow and facilitate movement of the light valve assembly 200 into and out of the housing 100 while inhibiting twisting or lateral motion of the light valve assembly 200. The handle 220 is fastened to the front rail 212. Also illustrated are a front stop 216 and a rear stop 218. These stops 216, 218 work in conjunction with the rails 212, 214. A polarizer area 251 is defined between the stops 216, 218. The polarizer area 251 is registered to the display aperture 255a. The polarizer area 251 is spatially displaced from the viewing aperture 255a such that a ventilation channel is formed between the polarizer area 251 and the viewing aperture 255a. A polarizer 252 is supported by ledges 217, 218 of the stops 216, 218. Further support for the polarizer 252 can be provided by spacer support 215. There may be fewer or more spacer supports 215 than illustrated in FIG. 27A. Finally, a plurality of recessed fastening apertures 291 are shown for receiving a fastener, such as a bolt.

FIG. 27B is a perspective view of the backside of the display holder 210a of FIG. 27A. In particular, note the signal cable feed through ports 201, 203. The signal cable from the analog circuit board 134 is fed through the upper feed through port 201 and through the lower feed through port 203 to connect to a light valve display. Note that each fastening hole has a fastening support 293.

FIG. 27C is a perspective view of a display cover 210b. Again, note the upper feed through port 201 and the lower feed through port 203. The display cover 210b has formed therein a display panel area 253. The liquid crystal display panel 250 registers to the display panel area 253 such that when the display cover is fastened to the display holder 210a, the light valve display panel is fixedly aligned with the view aperture 255. Fastening nuts 295 are intrically formed in the display cover 210b.

In a preferred embodiment of the invention, both the display holder 210a and the display cover 210b are fabricated from zinc. Zinc is chosen because of suitability to casting. Other materials may be substituted instead of zinc. However, the materials of the light valve assembly frame 210 should be compatible with the materials used to form the slide channel 143 of the display housing 100. In particular, the coefficient of friction between the two materials should be low enough so that the light valve 200 can freely descend and ascend through the slide channel 143. In a preferred embodiment of the invention, the slide channel 143, as well as the housing 100, is fabricated from injection molded plastic.

Figure 27D:
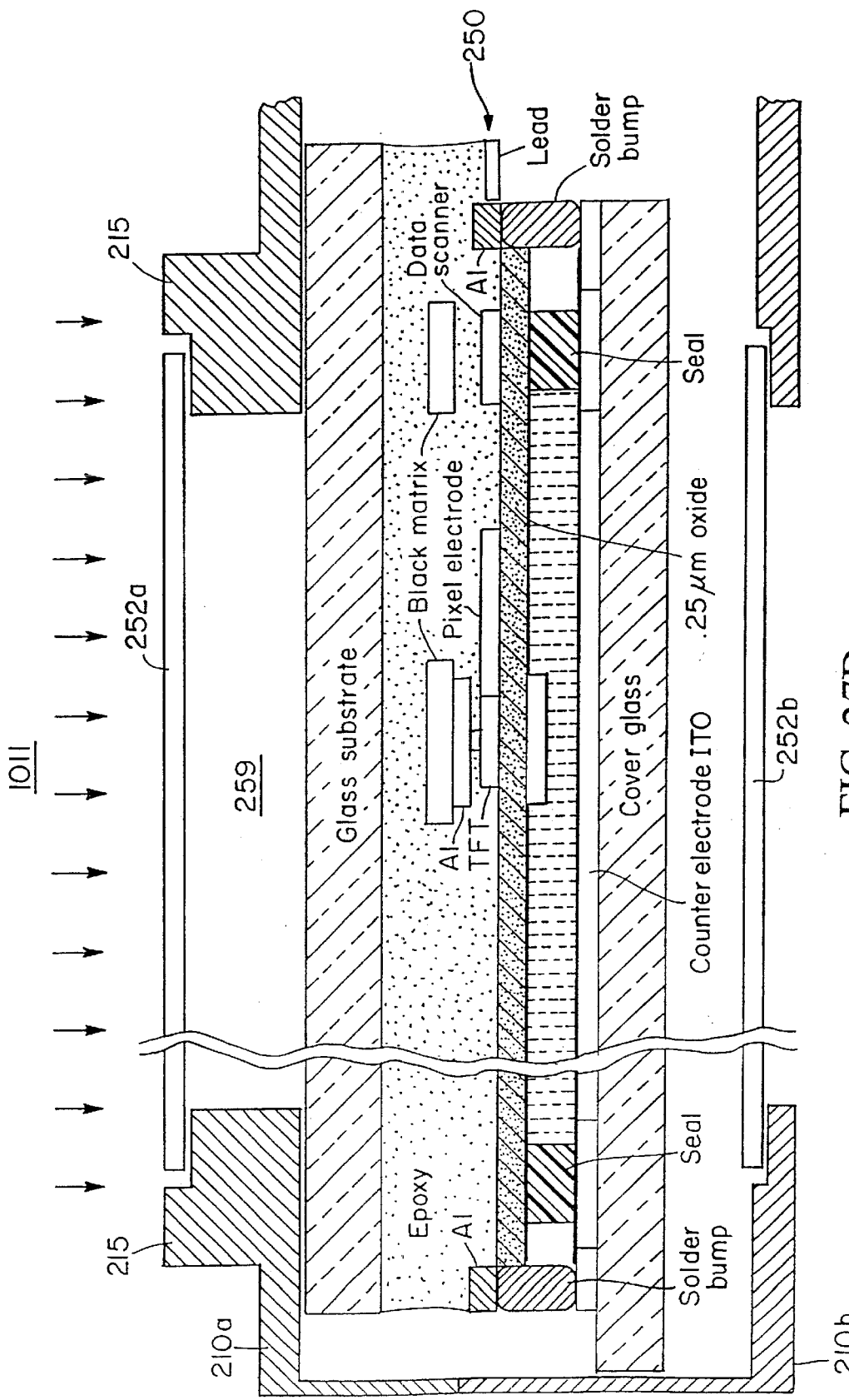
FIG. 27D is a partial schematic cross sectional view of a mounted display panel 250 taken along lines I—I of FIGS. 27A–27C.

FIG. 27D is a cross-sectional view of a mounted display panel 250 taken along section lines I—I of FIGS. 27A–27C. The display panel 250 is sandwiched between the display holder 210a and the display cover 210b. In a preferred embodiment, the display panel 250 is an active matrix liquid crystal display. It is understood that the display panel 250 could be a passive matrix liquid crystal display, or another suitable light transmissive light valve display. Note the ventilation channel 259 formed between the polarizer 252 and the active matrix 250.

Figure 28A:
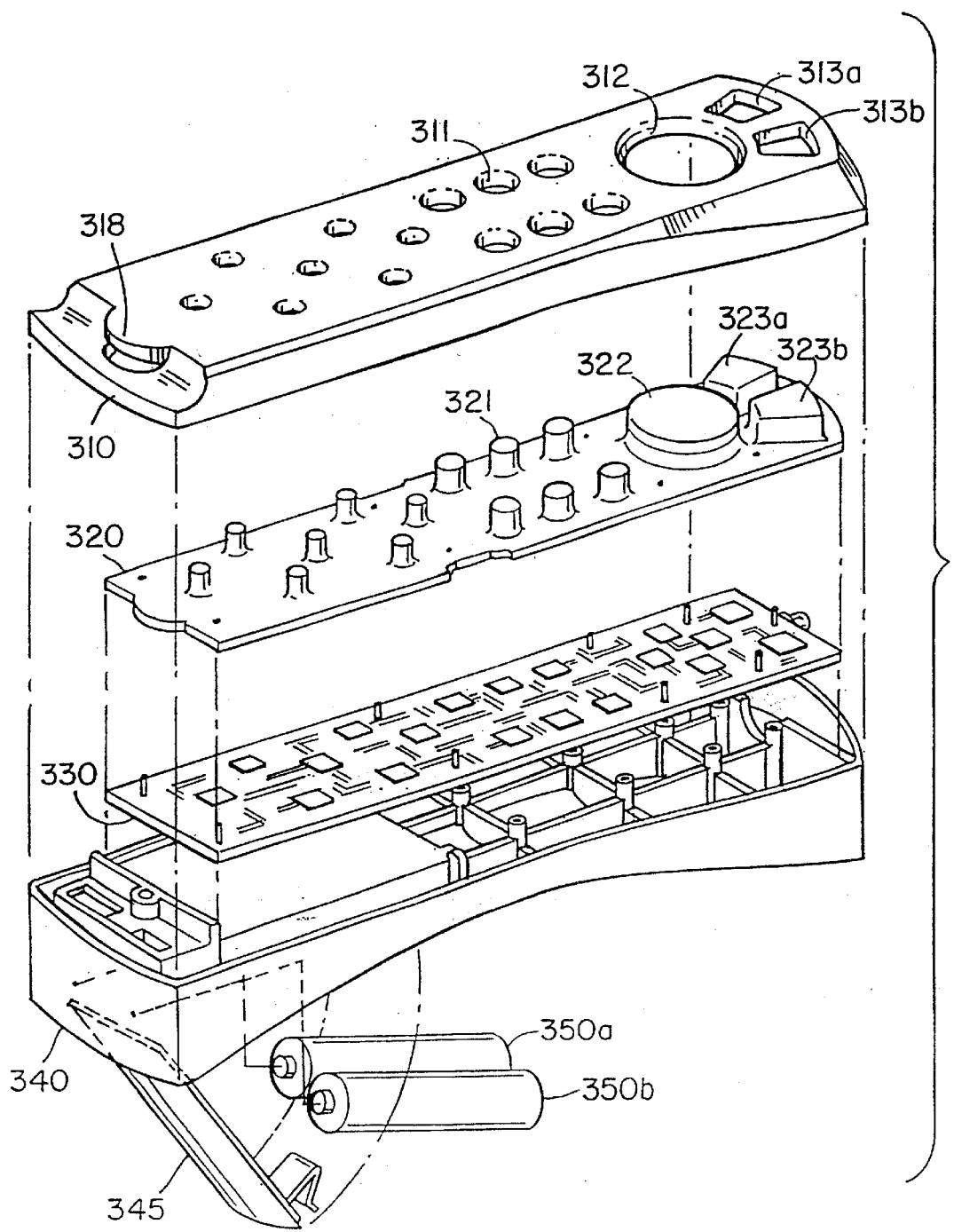
FIG. 28A is an exploded view of a remote control unit.

FIG. 28A is an exploded perspective view of a remote control device 300 for use in controlling the displayed image.

Typically, the remote control unit 300 is defined by an upper shell 310 and a lower shell 340. The upper shell 310 contains a plurality of voids 312, 314, 316 through which control buttons 322, cursor control button 324, and mouse select buttons 326 are accessed, respectively. The buttons 322, 324, 326 are preferably rubberized buttons molded onto a rubberized button insert 320. The buttons 322, 324, 326 are registered to contact pads 332, 334, 336 on a circuit board 330. In response to user inputs through the control buttons 322, 324, 326, an infrared signal is generated by LED 339. The infrared signal transmits the user's selections to housing 100.

The remote 300 is preferably powered by batteries 350 installed within a battery chamber in the lower segment 340 and secured therein by a battery door 345. The batteries preferably provide three-volts to the circuit board 330. It being understood that alternate battery configuration can be utilized instead, such as a nine-volt battery.

Figure 28B:
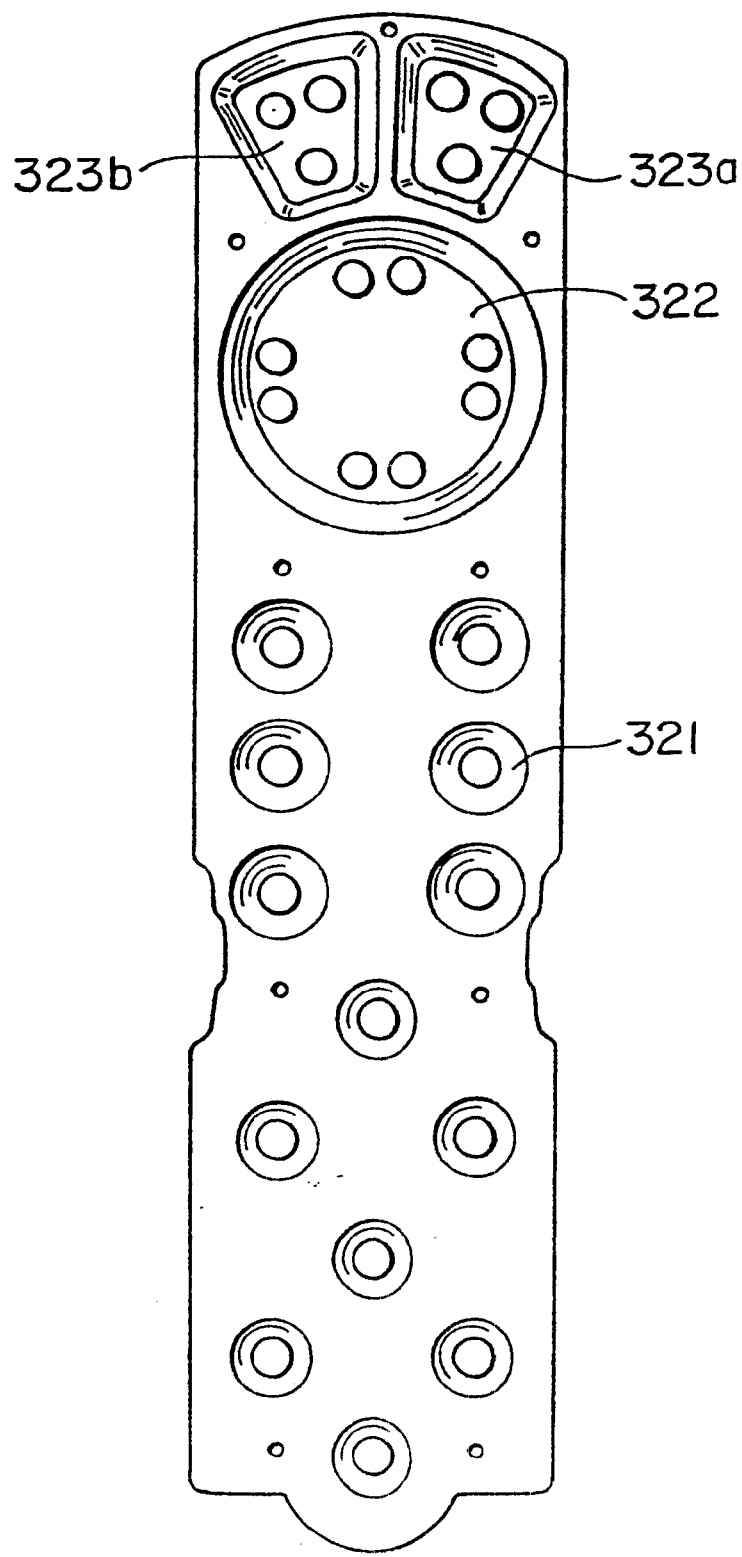
FIG. 28B is a view of the underside of the button insert 320 of FIG. 27A.

FIG. 28B is a view of the underside of the rubberized button insert 320. Each button 322, 324, 326 has at least one button contact protrusion for depressing an associated contact pad 332, 334, 336. Each control button 322 has a single button contact protrusion 333. Each mouse select button 326 has three redundant button contact protrusions 327. The mouse select buttons 326 preferably emulates standard Microsoft or Apple mouse select buttons. The functions of the select buttons 326 can be programmed to differ from standard mouse select buttons. For example, the right select button 326b can function as a drag-lock. The cursor control button 324 provides for eight-way cursor movement. There are, however, only four cursor control contact pads 334 to provide the eight-way cursor movement.

In a preferred embodiment, the cursor control button 324 has eight button contact protrusions 325. The cursor control contact protrusions 325 are paired with respective contact pads 334 such that a user selection of left, right, up or down results in a redundant depression of the respective contact pad 334. Each pair of cursor control contact protrusions are further positioned such that a diagonal user selection results in the depression of the two contact pads 334 adjacent to the diagonal direction. A processing unit interprets the depression of adjacent contact pads 334 as a diagonal cursor movement.

In another preferred embodiment, the cursor control button 324 is a plastic cap (such as a rigid disk or ring), which is registered to four directional buttons. Each directional button is registered to a respective cursor control contact pad 334. As pressure is placed on an area of the plastic cap, at least one directional button is depressed to contact a cursor control contact pad 334. If the depressed area of the plastic cap is about midway between two adjacent directional buttons, then both adjacent directional buttons are depressed. Processing similar to that discussed above, interprets this as a diagonal cursor movement.

In other preferred embodiments, cursor control is provided through a trackball or joystick dimensioned for use with the remote control 300 of course discrete cursor control keys can also be used with the remote control 300.

The remote control buttons 322 perform the same functions as the control panel buttons 181.

Figure 29:
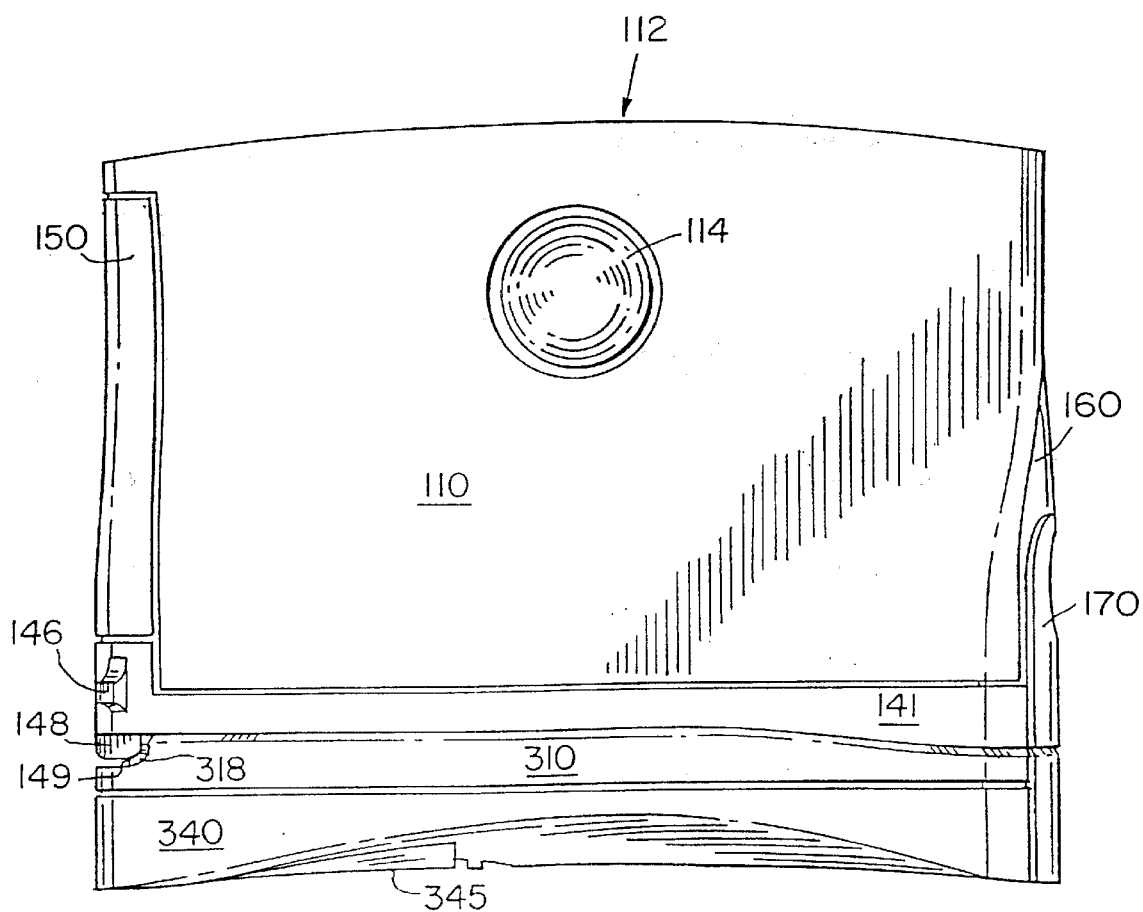
FIG. 29 illustrates a preferred embodiment of the housing with an attached remote control unit.

FIG. 29 is a right side view of the housing 100 with an attached remote control unit 300. The remote control device 300 registers to the base 141 of the housing 100, such that the remote control device 300 attaches to and stores underneath the housing 100 when the light valve slide 200 is in the upward position. In particular, a mounting tab 318 registers to the mounting slot 149 of the housing 100. The remote control device 300 is disengaged from the housing 100 by depressing the remote control release 170 on the housing 100.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

The invention claimed is:

1. A method of fabricating a display system comprising:
   bonding a silicon substrate to a second substrate with an insulating layer;
   thinning the silicon substrate to form a thin film silicon-on-insulator (SOI) structure;
   forming a matrix display circuit with the SOI structure having an image diagonal of less than 1.654 inches and a pixel density of at least 800 lines per inch;
   forming a light shield pattern over regions of the matrix display circuit;
   positioning a light source, the matrix display circuit and a magnifying lens within a display housing such that light from the light source is directed onto the matrix display circuit and an image on the matrix display circuit is magnified by the lens for viewing by a user; and
   providing a receiver within the display housing that receives wireless image data.

2. The method of claim 1 further comprising providing a translation mechanism that actuates movement of the display circuit between a first position outside of a projector body and a second position within the projector body.

3. The method of claim 1 further comprising providing a projector body, a light valve housing and a locking mechanism within the display housing such that the locking mechanism attaches the light valve housing to the projector body.

4. The method of claim 1 further comprising providing a remote controller that actuates the display circuit.

5. The method of claim 1 further comprising providing a control panel on the display housing.

6. The method of claim 1 further comprising providing battery within the display housing.

7. The method of claim 1 wherein the step of forming a display circuit further comprises forming an active matrix liquid display having a diagonal length of no more than 42 mm.

8. A method of fabricating a display system comprising:
   bonding a silicon substrate to a second substrate with an insulating layer;
   thinning the silicon substrate to form a thin film silicon-on-insulator (SOI) structure;
   forming a matrix display circuit with the SOI structure having an image diagonal of less than 1.654 inches and a pixel density of at least 800 lines per inch;
   forming a light shield pattern over regions of the matrix display circuit;
   transferring the matrix display circuit from the second substrate onto a transparent substrate;
   positioning a light source, the matrix display circuit and a magnifying lens within a display housing such that light from the light source is directed onto the matrix display circuit and an image on the matrix display circuit is magnified by the lens for viewing by a user; and providing a receiver within the display housing that receives wireless image data.

9. The method of claim 8 further comprising providing a translation mechanism that actuates movement of the display circuit between a first position outside of a projector body and a second position within the projector body.

10. The method of claim 8 further comprising providing a projector body, a light valve housing and a locking mechanism within the display housing such that the locking mechanism attaches the light valve housing to the projector body.

11. The method of claim 8 further comprising providing a remote controller that actuates the display circuit.

12. The method of claim 8 further comprising providing a control panel on the display housing.

13. The method of claim 8 further comprising providing battery within the display housing.

14. The method of claim 8 wherein the step of forming a display circuit further comprises forming an active matrix liquid display having a diagonal length of no more than 42 mm.

15. A method of fabricating a display system comprising:

bonding a silicon substrate to a second substrate with an insulating layer;

thinning the silicon substrate to form a thin film silicon-on-insulator (SOI) structure;

forming an active matrix display circuit with the SOI structure having a diagonal length of no more than 1.654 inches and a pixel density of at least 800 lines per inch; forming a light shield pattern over regions of the matrix display circuit;

positioning a light source, the matrix display circuit, a wireless receiver, a battery and a magnifying lens within a display housing having a control panel such that light from the light source is directed onto the matrix display circuit and an image on the matrix display circuit is magnified by the lens for viewing by a user; and providing a receiver within the display housing that receives wireless image data.

16. The method of claim 15 further comprising providing a translation mechanism that actuates movement of the display circuit between a first position outside of a projector body and a second position within the projector body.

17. The method of claim 15 further comprising providing a projector body, a light valve housing and a locking mechanism within the display housing such that the locking mechanism attaches the light valve housing to the projector body.

18. The method of claim 15 further comprising providing a remote controller that actuates the display circuit.

* * * * *